(12) United States Patent
Krames et al.

(10) Patent No.: US 12,542,413 B2
(45) Date of Patent: Feb. 3, 2026

(54) RELAXED WURTZITE INGAN LAYERS

(71) Applicant: OPNOVIX CORP., Palo Alto, CA (US)

(72) Inventors: Michael R. Krames, Palo Alto, CA (US); Yao Chen, Lausanne (CH); Jean-Francois Carlin, Lausanne (CH); Etienne Giraud, Lausanne (CH); Nicolas Grandjean, Lausanne (CH)

(73) Assignee: Opnovix Corp., Palo Alto, CA (US)

( * ) Notice: Subject to any disclaimer, the term of this patent is extended or adjusted under 35 U.S.C. 154(b) by 0 days.

(21) Appl. No.: 19/253,263

(22) Filed: Jun. 27, 2025

(65) Prior Publication Data

US 2026/0005485 A1    Jan. 1, 2026

Related U.S. Application Data

(60) Provisional application No. 63/755,100, filed on Feb. 6, 2025, provisional application No. 63/665,945, filed on Jun. 28, 2024.

(51) Int. Cl.
*H01S 5/02*  (2006.01)
*C30B 29/40*  (2006.01)
(Continued)

(52) U.S. Cl.
CPC .......... *H01S 5/0211* (2013.01); *C30B 29/406* (2013.01); *H01S 5/34333* (2013.01); *H10H 20/825* (2025.01); *H10H 20/8508* (2025.01)

(58) Field of Classification Search
CPC . H01S 5/0211; H01S 5/34333; H10H 20/825; H10H 20/8508; C30B 29/406
See application file for complete search history.

(56) References Cited

U.S. PATENT DOCUMENTS 6,252,261 B1   6/2001   Usui et al.
6,255,198 B1   7/2001   Linthicum et al.
(Continued)

FOREIGN PATENT DOCUMENTS

CN    114930499 A  *  8/2022  ......... H10D 62/8503
JP    2000/012976 A     1/2000
(Continued)

OTHER PUBLICATIONS

US 12,107,133 B2, 10/2024, Krames (withdrawn)
(Continued)

*Primary Examiner* — Ida M Soward
(74) *Attorney, Agent, or Firm* — Sheppard Mullin Richter & Hampton LLP

(57) ABSTRACT

Bulk relaxed Wurtzite In-containing III-nitride layers having a smooth and substantially pit-free surface morphology and an interface region having a substantially relaxed in-plane a-lattice parameter and characterized by a single-phase gallium-polar (0001) orientation are disclosed. Methods of making the bulk relaxed Wurtzite In-containing III-nitride layers using MOCVD growth conditions are also disclosed. Semiconductor structures include epitaxial layers grown on a bulk relaxed Wurtzite In-containing III-nitride layer. The semiconductor structures can be used in optoelectronic devices such as in light sources for illumination and display applications.

29 Claims, 38 Drawing Sheets

(51) Int. Cl.
    *H01S 5/343*     (2006.01)
    *H10H 20/825*     (2025.01)
    *H10H 20/85*     (2025.01)

(56) References Cited

U.S. PATENT DOCUMENTS

| | | | |
|---|---|---|---|
| 6,489,221 | B2 | 12/2002 | Gehrke |
| 7,351,347 | B2 | 4/2008 | Akita et al. |
| 7,663,148 | B2 | 2/2010 | Yi et al. |
| 7,670,933 | B1 | 3/2010 | Wang et al. |
| 7,955,983 | B2 | 6/2011 | Imer et al. |
| 8,729,559 | B2 | 5/2014 | Krames et al. |
| 9,076,927 | B2 | 7/2015 | Keller et al. |
| 9,318,326 | B2 | 4/2016 | Von Kanel et al. |
| 10,847,625 | B1* | 11/2020 | Krames ............... H01L 21/0254 |
| 2004/0113166 | A1 | 6/2004 | Tadatomo et al. |
| 2007/0069225 | A1 | 3/2007 | Krames et al. |
| 2009/0045394 | A1 | 2/2009 | Smeeton |
| 2009/0278998 | A1 | 11/2009 | El-Ghoroury et al. |
| 2011/0175126 | A1 | 7/2011 | Yang et al. |
| 2012/0091465 | A1* | 4/2012 | Krames ................ H10H 20/817 |
| | | | 257/E33.028 |
| 2012/0104360 | A1 | 5/2012 | Hardy et al. |
| 2014/0131730 | A1 | 5/2014 | Keller et al. |
| 2015/0099348 | A1 | 4/2015 | Lee et al. |
| 2017/0110630 | A1* | 4/2017 | Kawakami ........... H10H 20/812 |
| 2018/0277713 | A1* | 9/2018 | Ciechonski ...... H10H 20/01335 |
| 2020/0058489 | A1 | 2/2020 | Ohlsson |
| 2020/0388723 | A1* | 12/2020 | Ahmed ................ H10H 20/833 |
| 2021/0151567 | A1 | 5/2021 | Krames |
| 2021/0193870 | A1* | 6/2021 | Pernel .................. H10H 20/815 |
| 2021/0193873 | A1* | 6/2021 | Pernel ................. H10H 20/8252 |
| 2022/0285505 | A1 | 9/2022 | Krames |
| 2022/0393065 | A1* | 12/2022 | Dussaigne ............ H01L 21/306 |
| 2022/0399475 | A1* | 12/2022 | Khan ................... H01L 21/0242 |
| 2024/0063340 | A1* | 2/2024 | Keller .................. H10H 29/142 |
| 2024/0162338 | A1* | 5/2024 | Teo ....................... H10D 64/251 |
| 2024/0222416 | A1* | 7/2024 | Krames ............. H01L 21/02516 |
| 2024/0413191 | A1 | 12/2024 | Krames |

FOREIGN PATENT DOCUMENTS

| | | |
|---|---|---|
| JP | 2014/090169 A1 | 5/2014 |
| WO | 2012/075461 A1 | 6/2012 |
| WO | 2013/121289 A1 | 8/2013 |
| WO | 2017/137635 A1 | 8/2017 |
| WO | 2017/168012 A1 | 10/2017 |
| WO | 2019/068919 A1 | 4/2019 |
| WO | 2021/102198 A1 | 5/2021 |
| WO | 2021/195595 A1 | 9/2021 |
| WO | 2022/060611 A1 | 3/2022 |

OTHER PUBLICATIONS

Bougrioua et al., Growth of freestanding GaN using pillar-epitaxial lateral overgrowth from GaN nanocolumns, Journal of Crystal Growth, 2007, 209, pp. 113-120.

Le et al., Controlled coalescence of AlGaN nanowire arrays: An architecture for nearly dislocation-free planar ultraviolet photonic device applications, Advanced Materials, 2016, DOI: 10.1002/adma. 201602645, pp. 1-9.

Ema et al., "Influence of Intermediate Layers on Thick InGaN Growth Using Tri-Halide Vapor phase Epitaxy," Japanese Journal of Applied Physics, 2019, vol. 58, p. SC1027-1.

Even, In incorporation improvement in InGaN based active region using InGaN pseudo substrate for monolithic white LED application, Optics, Universite Grenoble Alpes, 2018, HAL Archives, 238 pages.

Even et al., Enhanced In incorporation in full InGaN heterostructure grown on relaxed InGaN pseudo-substrate, Applied Physics Letters, 2017, vol. 110, p. 262103, 6 pages.

Falub et al., Perfect crystals grown from imperfect interfaces, Scientific Reports, Jul. 2013, vol. 3, No. 2276, 6 pages.

Hestroffer et al., Relaxed c-plane InGaN layers for the growth of strain-reduced InGaN quantum wells, Semiconductor Scientific Technology, 2015, vol. 30, 105015, 10 pages.

Hiraski et al., Growth of thick and high crystalline quality InGaN layers on GaN (0001) substrate using tri-halide vapor phase epitaxy, *Journal of Crystal Growth*, 2016, 6 pages.

Hu et al., Growth of InGaN/GaN quantum wells with graded InGaN buffer for green-to-yellow light emitters, Japanese Journal of Applied Physics, 2016, vol. 55, 081001, 6 pages.

Hurni et al., Bulk GaN flip-chip violet light-emitting diodes with optimized efficiency for high-power operation, Applied Physics Letters, 2015, vol. 106, 031101, 4 pages.

Kishino et al., Monolithic Integration of InGaN-based nanocolumn light-emitting diodes with different emission colors, Applied Physics Express, 2013, vol. 6, 012101, 3 pages.

Ponce et al., Microstructure and electronic properties of InGaN alloys Physica Status Solidi, 2003, vol. 240, No. 2, p. 273-284, 12 pages.

Sanchez-Paramo et al., Structural and optical characteristics of intrinsic GaN nanocolumns, Physica E, 13, 2002, pp. 1070-1073, 4 pages.

Scaccabarozzi et al., Photoluminescence study of the strain relaxation of GaAs crystals grown on deeply patterned Si substrates, Journal of Crystal Growth, 2014, 4 pages.

Yin et al., Investigation on epitaxial lateral overgrowth of InGaN/GaN multi-quantum-well nanowires, Journal of Nanoscience and Nanotechnology, Feb. 2013, vol. 13, No. 2, pp. 1389-1391, 3 pages.

International Preliminary Report on Patentability for International Application No. PCT/US/2020/061377, issued on May 17, 2022, 10 pages.

International Search Report and Written Opinion for International Application No. PCT/US2020/061377, mailed on Feb. 22, 2021, 18 pages.

International Search Report and Written Opinion for International Application No. PCT/US2023/086561, mailed on Jun. 10, 2024, 23 pages.

Annex to Form PCT/ISA/206 Communication Relating to the Results of the Partial International Search for PCT/US2023/086561 mailed on Apr. 17, 2024, 17 pages.

Non-Final Office Action mailed on Mar. 9, 2020, for U.S. Appl. No. 16/689,064, 24 pages.

Final Office Action mailed on Jun. 19, 2020, for U.S. Appl. No. 16/689,064 mailed on Jun. 19, 2020, 15 pages.

Notice of Allowance mailed on Jul. 16, 2020, for U.S. Appl. No. 16/689,064, 9 pages.

Notice of Allowance mailed on Jul. 17, 2024, for U.S. Appl. No. 18/401,290, 7 pages.

Non-Final Office Action mailed on Mar. 28, 2025, for U.S. Appl. No. 17/746,431, 18 pages.

Final Office Action mailed on Nov. 18, 2024, for U.S. Appl. No. 17/746,431, 15 pages.

Non-Final Office Action mailed on Aug. 4, 2021, for U.S. Appl. No. 17/072,333, 8 pages.

Non-Final Office Action mailed on Nov. 4, 2024, for U.S. Appl. No. 18/812,553, 7 pages.

Hestroffer et al., Compositionally graded InGaN layers grown on vicinal N-face GaN substrates by plasma-assisted molecular beam epitaxy, Journal of Crystal Growth, vol. 465, Feb. 24, 2017, 8 pages.

Okada et al., Structural and optical evaluation of InGaN/GaN multi-quantum wells on template consisting of in-plane alternatively arranged relaxed InGaN and GaN, Journal of Applied Physics, vol. 111, No. 4, Feb. 15, 2012, 6 pages.

Soh et al., Cool white III-nitride light emitting diodes based on phosphor-free indium-rich InGaN nanostructures, Applied Physics Letters, vol. 92, No. 26, Jul. 1, 2008, 4 pages.

Wurm et al., Demonstration of device-quality InGaN grown on porous GaN tiles by MBE with an in-plane lattice constant equivalent to fully relaxed In0.12Ga0.88N, 2022 Compound Semiconductor Week (Csw), IEEE, Jun. 1, 2022, 2 pages.

International Search Report and Written Opinion for International Application No. PCT/US2025/035780 mailed on Oct. 16, 2025, 33 pages.

(56) References Cited

OTHER PUBLICATIONS

International Search Report and Written Opinion for International Application No. PCT/US2025/035752, mailed on Oct. 29, 2025, 22 pages.

\* cited by examiner

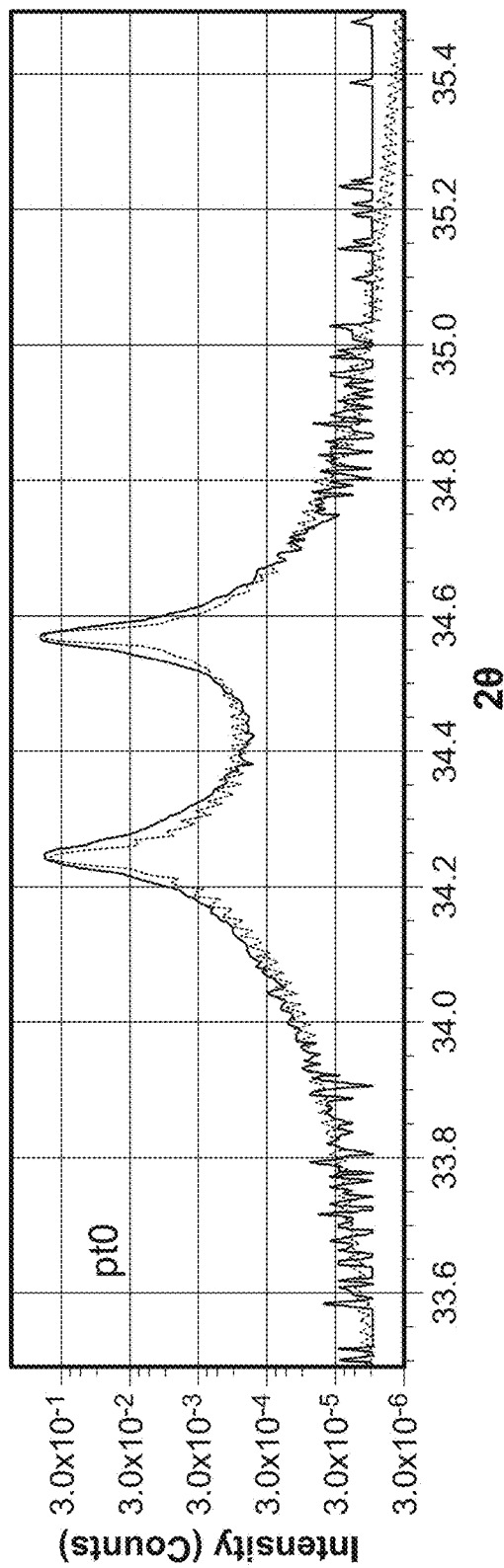
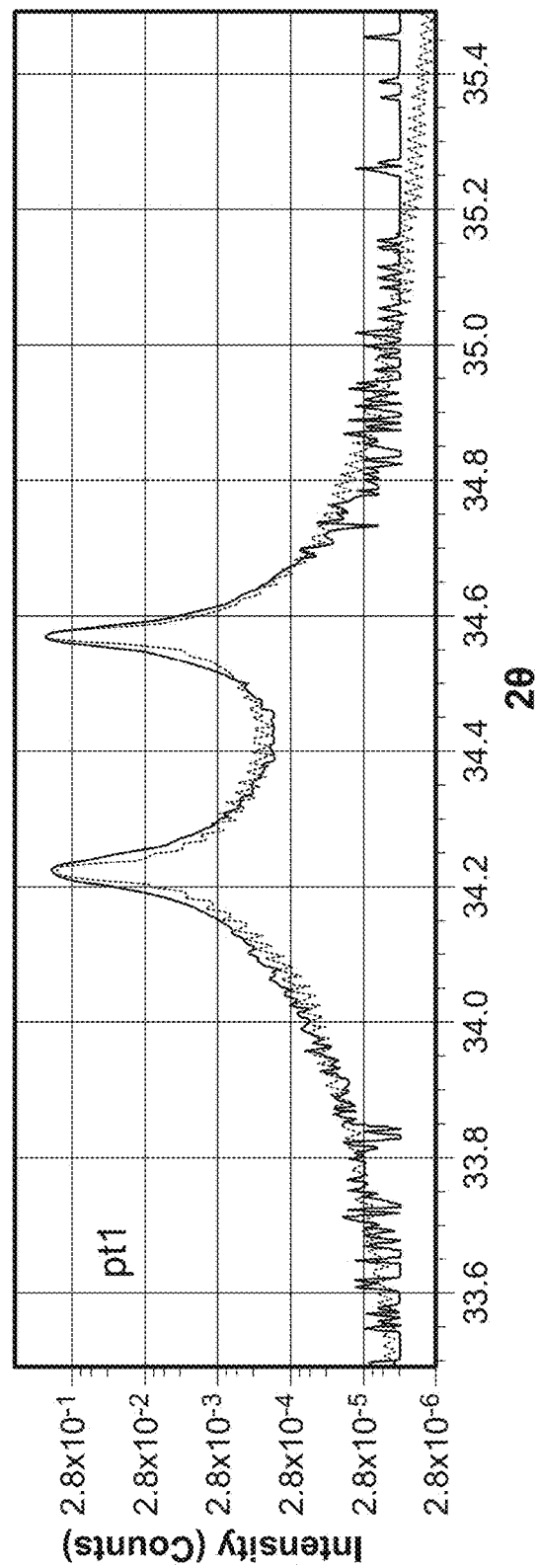
FIG. 15A
FIG. 15B

RELAXED WURTZITE INGAN LAYERS

This application claims the benefit under 35 U.S.C. § 119(e) of U.S. Provisional Application No. 63/755,100 filed on Feb. 6, 2025, and U.S. Provisional Application No. 63/665,945 filed on Jun. 28, 2024, each of which is incorporated by reference in its entirety.

RELATED APPLICATIONS

This application is related to U.S. Pat. No. 10,847,625, U.S. Application Publication No. 2022/0285505 A1, PCT International Publication No. WO 2021/102198 A1, U.S. Pat. No. 12,107,113, U.S. Application Publication No. 2024/0413191 A1, and PCT Application Publication No. WO 2024/145658.

FIELD

The present disclosure relates to bulk relaxed Wurtzite In-containing III-nitride layers having a first interface region having a substantially relaxed in-plane a-lattice parameter and characterized by a single-phase gallium-polar (0001) orientation and a smooth, substantially pit-free surface, and to methods of making the bulk relaxed Wurtzite In-containing III-nitride layers using metal-rich metal-organic chemical vapor deposition (MOCVD) growth conditions. Semiconductor structures include a bulk relaxed Wurtzite In-containing III-nitride layer overlying a substrate and/or a template. A semiconductor device includes epitaxial layers grown on a bulk relaxed Wurtzite In-containing III-nitride layer. The device can include optoelectronic devices such as in light sources (e.g., light-emitting diodes and/or laser diodes) for illumination and in display applications.

BACKGROUND

Indium gallium nitride (InGaN) and specifically polar-Ga on (0001) GaN and grown by MOCVD has emerged as a cornerstone material, especially for its critical role in the production of high-efficiency light-emitting diodes (LEDs) and laser diodes (LDs) with emission in the visible spectrum from violet to green. In this role, the InGaN material is grown pseudomorphic to GaN and to only modest thicknesses of less than about 30 nm and with InN mole fractions typically less than 30%.

The growth of thicker InGaN layers or InGaN layers with a higher InN mole fraction by MOCVD is hampered by a significant technical challenge: the formation of pits and defects at the growth conditions deemed optimal for InGaN. These imperfections not only limit the achievable thickness of epi-ready (i.e., device platform quality) InGaN layers but also degrade the optical and electrical properties of devices grown on the InGaN layers, posing a substantial barrier to the advancement of semiconductor technology, such as achieving emitter wavelengths beyond the green to yellow, amber and red (and even infrared). The limitations stem from the complex interplay of growth parameters including temperature, pressure, and the flux of precursors that are difficult to control, and the role of dislocations, which together influence the incorporation of indium into the growing crystal lattice.

SUMMARY

According to the present invention, a bulk relaxed Wurtzite In-containing III-nitride layers comprise a first interface and a first interface region, wherein the first interface region is characterized by: a single-phase gallium-polar (0001) orientation: a Wurtzite In-containing III-nitride comprising a first InN mole fraction, wherein the first InN mole fraction is greater than 0; and a substantially relaxed in-plane a-lattice parameter.

According to the present invention, semiconductor structures comprise the bulk relaxed Wurtzite In-containing III-nitride layer provided by the present disclosure overlying a substrate.

According to the present invention, semiconductor devices comprise the bulk relaxed layer provided by the present disclosure, or the semiconductor structure according to the present invention.

According to the present invention, methods of making a bulk relaxed Wurtzite In-containing III-nitride layer comprise growing $In_xAl_yGa_{1-x-y}N$ using MOCVD, wherein $x>0$ and $0<y<1$.

According to the present invention, methods of making a semiconductor device comprise growing one or more epitaxial layers overlying the bulk relaxed Wurtzite In-containing III-nitride layer according to the present invention or overlying the semiconductor structure according to the present invention.

According to the present invention, semiconductor structures comprise: an In-containing III-nitride Wurtzite In-containing III-nitride region or a first bulk relaxed Wurtzite In-containing III-nitride region; and a second bulk relaxed Wurtzite In-containing III-nitride region, wherein each of the first and second bulk relaxed layers is independently characterized by: a first interface region characterized by: a single-phase gallium-polar (0001) orientation: an InN mole fraction greater than 0; and a substantially relaxed in-plane a-lattice parameter.

According to the present invention, multiwavelength semiconductor devices comprise the semiconductor structure according to the present invention.

According to the present invention, methods of making semiconductor structures comprise: (a) growing a Wurtzite In-containing III-nitride layer or a first bulk relaxed Wurtzite In-containing III-nitride layer comprising a first InN mole fraction overlying a first region of a substrate; and (b) growing a second bulk relaxed Wurtzite In-containing III-nitride layer comprising a second InN mole fraction overlying a second region of the substrate, wherein, growing comprises growing $In_xAl_yGa_{1-x-y}N$ using MOCVD, wherein $x>0$ and $0 \leq y \leq 1$; and the first InN mole fraction is less than the second InN mole fraction.

According to the present invention, multi-wavelength semiconductor structures are fabricated using a method according to the present invention.

According to the present invention, a semiconductor structure comprises: a III-nitride layer comprising a III-nitride surface; and a relaxed In-containing III-nitride layer overlying the III-nitride surface, wherein the relaxed In-containing III-nitride layer comprises a relaxed In-containing III-nitride surface.

According to the present invention, a method of fabricating a semiconductor structure comprises: forming a slip region on a portion of the III-nitride surface; and growing a relaxed In-containing III-nitride layer on the slip region and on portions of the III-nitride layer not covered by the slip region.

According to the present invention, a slip region is fabricated by a method according to the present invention.

According to the present invention, a semiconductor structure comprises a slip region fabricated according to the present invention.

According to the present invention, a device comprises a semiconductor structure according to the present invention.

According to the present invention, a wafer comprises a semiconductor structure according to the present invention.

According to the present invention, a method of fabricating a semiconductor layer comprises using metal-rich MOCVD.

According to the present invention, a semiconductor layer is fabricated using a method according to the present invention.

According to the present invention, a semiconductor device comprises a semiconductor structure according to the present invention or a semiconductor layer according to the present invention.

According to the present invention, a wafer comprises a semiconductor structure according to the present invention, a semiconductor layer according to the present invention, or a semiconductor device according to the present invention.

According to the present invention, a relaxed In-containing III-nitride layer is fabricated using a method according to the present invention.

According to the present invention, a semiconductor structure comprises a relaxed In-containing III-nitride layer according to the present invention.

According to the present invention, a semiconductor device comprises a relaxed In-containing III-nitride layer according to the present invention or the semiconductor structure according to the present invention.

According to the present invention, a semiconductor device comprises a semiconductor structure according to the present invention, or the semiconductor layer according to the present invention.

According to the present invention, a wafer comprises a semiconductor device according to the present invention.

According to the present invention, a system comprises a semiconductor device according to the present invention, wherein the system comprises a display, an augmented reality system, virtual reality system, head-up display, projection system, a television system, a monitor, or a lighting systems.

According to the present invention, an optical system comprises a semiconductor device according to the present invention.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1:
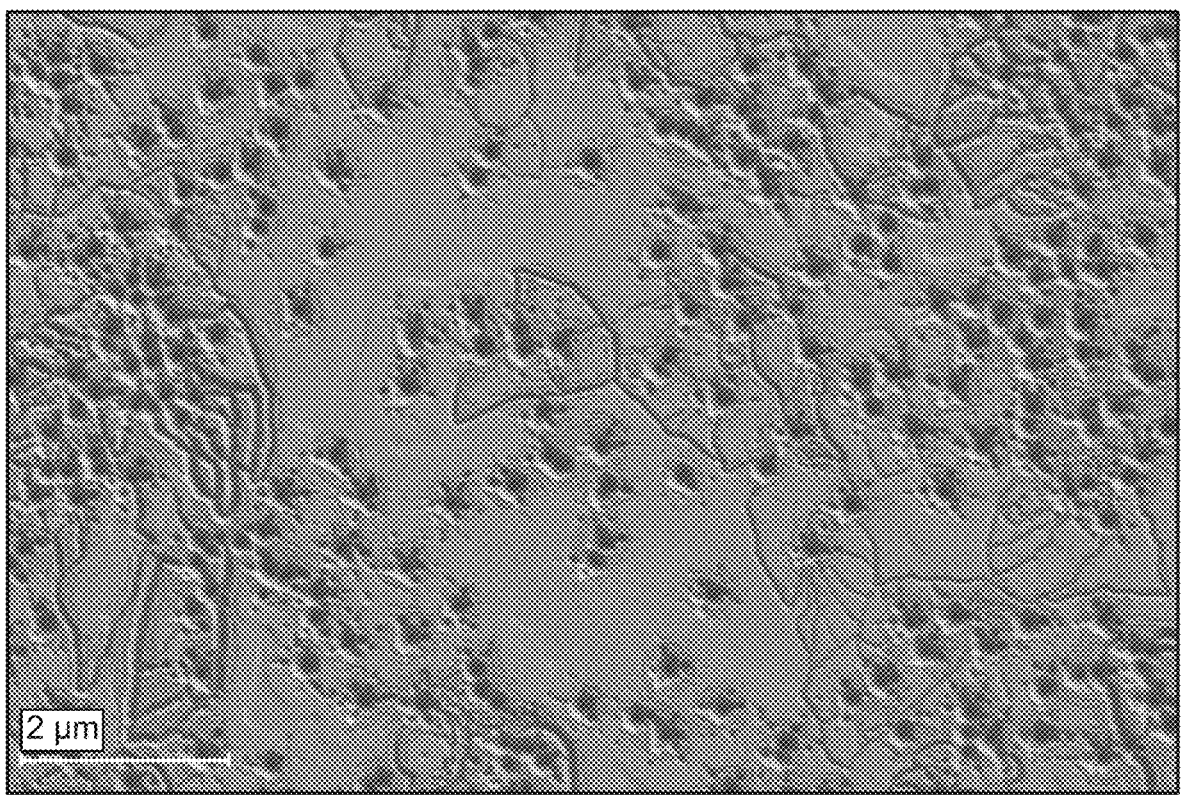
FIG. 1 shows a SEM plan-view of a 400 nm-thick, InGaN layer having an InN mole fraction of 10% grown on GaN/sapphire by MOCVD using ammonia rich ("N-rich") conditions, showing trench defects and large pits (up to about 300 nm in diameter) formed at threading dislocations.

A bounded numerical range includes the endpoints of the range as well as any subranges within the disclosed range. For example, a range of from 1 μm to 5 μm, includes, for example, from 1 μm to 3 μm, from 4 μm to 5 μm.

An unbounded numerical range without an upper bound, for example, greater than 1 μm includes the endpoint of 1 μm and extending to a reasonable upper bound consistent with the context of the invention and as would be understood by one skilled in the art. An unbounded numerical range without a lower bound such as, for example, less than 1 μm, includes the endpoint of 1 μm and extends to a lower bound consistent with the context of the disclosure and as would be understood by one skilled in the art.

"Substantially uniform lattice parameter" refers to a semiconductor layer characterized by a local lattice parameter of the semiconductor layer that varies by less than 1% with respect to an average lattice parameter such as, for example, less than 0.5% with respect to an average lattice parameter, or less than 0.1% with respect to an average lattice parameter over an distance of at least 100 mm, at least 1 mm, at least 10 μm, at least 1 μm, at least 100 nm, or at least 10 nm.

Coherent refers to the condition in which the material maintains crystallographic alignment with the underlying substrate, whether lattice-matched or elastically strained.

Relaxed refers to the property that the in-plane a-lattice parameter of the material is approximately that of a free-standing 100% relaxed version of the material having the same crystal structure and elemental composition. Substantially relaxed refers to a material in which the in-plane a-lattice parameter of the material is within ±0.5% of that of a free-standing 100% relaxed version of the material having the same elemental composition. Uniformly refers to the property of having a weakly varying or substantially non-varying in-plane a-lattice parameter within the wide area, upon which optical and/or electronic device structures can be fabricated.

"Defect density" refers to the density, in plan-view, of extended defects, such as dislocations, at the termination of a semiconductor layer. The defect density can be determined using, for example, etching and counting the etch pit density (EPD), cathodoluminescence and observing and counting dark spots, atomic force microscopy (AFM) to observe and count small pits, or transmission electron microscopy (TEM) and counting dislocations.

A lattice parameter can be determined using X-ray diffraction (XRD) and reciprocal space map (RSM) analysis. High-angle or near grazing incidence XRD techniques can be used to determine the lattice parameter of upper layers in a structure in which the lattice parameter may vary as a function of depth.

"III-V material" refers to a compound semiconductor material comprising at least one column-III element and at least one column-V element from the Periodic Table. A III-V nitride material includes $In_xAl_yGa_{1-x-y}N$ such as GaN, AlN, InN or InGaN, or (In)(Al)GaN such as GaN, AlGaN, InAlN, or InAlGaN.

"III-nitride material" includes GaN, AlN, InGaN, AlGaN, InAlN, and InAlGaN.

"In-containing III-nitride material" includes InGaN, InAlN, and InAlGaN.

"Growth plane" refers to a plane parallel to the deposition plane of material onto a planar surface, such as that of a conventional substrate growth surface.

"Substantially perpendicular to the growth plane" refers to a surface that forms an angle with respect to the growth plane that is approximately 90 degrees such as from 88 degrees to 92 degrees with respect to the growth plane.

Wurtzite GaN, or GaN, is characterized by a Wurtzite crystal structure having bulk room-temperature a- and c-lattice parameters of approximately 3.189 Å, and 5.185 Å, respectively. The crystal plane normal to the c-lattice parameter direction ("c-direction") is the c-plane, which has a Ga-face (0001) and a N-face (000-1). The planes that contain the c-direction and are perpendicular to the a-lattice parameter direction ("a-direction") are the {11-20} planes or "a-planes". The planes that contain the c-direction and are parallel to the a-lattice parameter direction are the {1-100} planes or "m-planes".

A Wurtzite In-containing III-nitride refers to materials such as $In_xAl_yGa_{1-x-y}N$ and $In_xGa_{1-x}N$, where x>0 and 0≤y≤1.

Wurtzite $In_xAl_yGa_{1-x-y}N$ and $In_xGa_{1-x}N$ have the same crystal structure as Wurtzite GaN, but includes a non-zero mole fraction of InN, x, to form a ternary compound where a specified fraction of column-III atoms are In and the remainder are substantially Ga. InN has bulk room-temperature a- and c-lattice parameters of 3.545 Å, and 5.703 Å, respectively, and $In_xGa_{1-x}N$ has room-temperature a- and c-lattice parameters between that of GaN and InN, and according to the mole fraction, x.

Wurtzite $In_{x1}Al_{y1}Ga_{1-x1-y1}N$ or InAlGaN, has the same crystal structure as Wurtzite GaN, but may include a non-zero mole fraction of InN, x, and/or AlN, y, to form a ternary or quaternary compound where a specified fraction of column-III atoms are In and/or Al and the remainder are substantially Ga. AlN has room-temperature a- and c-lattice parameters of approximately 3.112 Å and 4.982 Å, respectively, and $Al_yGa_{1-y}N$ has bulk room-temperature a- and c-lattice parameters between that of GaN and AlN, and according to the mole fraction, y.

Although the present description focuses on growing (0001) InGaN on a GaN surface, the method is applicable to other Wurtzite materials, such as $In_xAl_yGa_{1-x-y}N$ on AlN or GaN, AlGaN on AlN or GaN, and AlGaN on AlN or GaN. Also, the surface itself may be $In_xAl_yGa_{1-x-y}N$. When the seed comprises InGaN, the mole fraction of InN in the overlying InGaN layer can be different than the mole fraction of InN in the InGaN seed surface. For example, the mole fraction of InN in the overlying InGaN layer can be greater than the mole fraction of InN in the InGaN seed surface. Furthermore, the invention is applicable to non-basal-plane Wurtzite structures, such as so-called non- and semi-polar GaN and related materials.

"Relaxed InGaN" refers to InGaN material that exhibits an in-plane a-lattice parameter that is equal to, or nearly equal to, that of a bulk, fully relaxed InGaN material. For example, Wurtzite relaxed $In_xAl_yGa_{1-x-y}N$ with y=0 and x>0 has a room-temperature in-plane a-lattice parameter greater than 3.189 Å (0% InN) and up to 3.545 Å (100% InN). This contrasts with a strained InGaN material, such as InGaN which is grown pseudomorphic to GaN and thus exhibits an in-plane a-lattice parameter equal to, or nearly equal to, that of GaN, of, about 3.189 Å (for bulk GaN) or about 3.186 Å (for GaN on sapphire), regardless of InN mole fraction.

As used herein, a "relaxed" III-nitride layer such as a relaxed In-containing III-nitride layer refers to a layer with an in-plane lattice constant substantially close to that of the corresponding free-standing, bulk material of the same composition, i.e., the native lattice constant in the absence of external constraint. In practice, even a relaxed buffer layer may experience some residual strain, particularly in cases when thermal expansion mismatch during cooldown induces wafer bowing or tensile/compressive stress. However, the term "relaxed" as used herein is intended to cover these cases as well, i.e., when the in-plane lattice constant may slightly differ from that of the corresponding free-standing, bulk material of the same composition accordingly. Epitaxial layers grown overlying such a relaxed layer are typically lattice-matched to that relaxed buffer and thus adopt and share its in-plane lattice constant. These overlying layers are not necessarily relaxed in their own right, but are grown pseudomorphically on the relaxed template and thus often strained. Accordingly, when referring to a "relaxed epitaxial stack." it should be understood that not all layers in the stack are relaxed; rather, the stack is lattice-matched to a relaxed buffer layer that defines the in-plane lattice constant for subsequent growth.

"Pseudomorphic" refers to a layer grown on a base layer or substrate such that the layer is epitaxially aligned to the base layer, even if the native (relaxed) lattice constant of the grown layer is different than that of the base layer or substrate. Pseudomorphic layers are thus substantially fully strained. For Wurtzite crystalline material characterized by c- and a-lattice parameters, a pseudomorphic layer will adjust to match the base layer or substrate, in which case the ratio of c/a for the pseudomorphic layer will be different than that of c/a for the base layer or substrate, depending on the growth direction. For growth in the (0001) direction under compressive strain the ratio of c/a for the pseudomorphic layer will be greater than that of the base layer or substrate, while for tensile strain the ratio of c/a for the pseudomorphic layer will be less than that of the base layer or substrate. For growth in the non-polar directions, e.g., <10-10> or <11-20> directions, under compressive strain the ratio of c/a for the pseudomorphic layer will be less than that of the base layer or substrate, while for tensile strain the ratio of c/a for the pseudomorphic layer will be greater than that of the base layer or substrate. For semipolar growth directions, the strain will depend on whether the growth direction is within 45 degrees of the direction, i.e., more vertical, or more than 45 degrees away from the [0001], i.e., more lateral. For example, for growth in the semi-polar <10-11> directions, under compressive strain the ratio of c/a for the pseudomorphic layer will be less than that of the base layer or substrate, while for tensile strain the ratio of c/a for the pseudomorphic layer will be greater than that of the base layer or substrate.

"In-plane a-lattice parameter" refers to the crystal lattice spacing within the growth plane. For a Wurtzite (0001) material such as InGaN, the in-plane lattice parameter is the a-lattice parameter.

"Lateral growth" refers to growth in a direction other than normal to the growth plane, including parallel to the growth plane.

"Crystallographically equivalent" refers to semiconductor crystal planes that have identical arrangements of atoms due to the symmetry of the crystal lattice. These planes are equivalent because they can be transformed into each other by the symmetry operations inherent to the semiconductor crystal structure, such as rotation or reflection. For Wurtzite materials like III-nitride semiconductors, one example of crystallographically equivalent planes is the m-plane set. {10-10}: (10-10), (01-10), (0-110), (0-1-10), (-1010), and (-1100). Another example of crystallographically equivalent planes is the a-plane set. {11-20}: (11-20), (1-120), (-2110), (-12-10), (2-110) and (21-10). Another example of crystallographically equivalent planes is a semi-polar set {10-11}: (10-11), (01-11), (0-111), (0-1-11), (-1011), and (-1101). Of course, there are many more crystallographically equivalent plane sets, as will be understood by those skilled in the art.

"Critical thickness" refers to the maximum thickness of an epitaxial film that can be grown on a base layer or substrate without the formation of dislocations, due to lattice mismatch between the film and the base layer or substrate. Beyond the critical thickness, strain energy exceeds the energy required to form dislocations, leading to their formation to relieve strain and thus result in relaxation in the epitaxial film. This transition from a pseudomorphic film (below the critical thickness) to a (even partially) relaxed film via formation of dislocations is referred to as plastic deformation.

"Overlying" such as an "overlying layer" refers to a layer such as an epitaxial layer that is situated above an underlying layer. An overlying layer can be directly contacting or adjoining the underlying layer. An overlying layer such as an overlying InGaN layer can have a homogeneous composition or can have an inhomogeneous composition parallel and/or perpendicular to the growth plane. There can be one or more distinct epitaxial layers between an overlying layer and an underlying layer.

"Layer" such as a p-type $In_xAl_yGa_{1-x-y}N$ layer or active layer refers to a layer comprising a single layer or comprising one or more sublayers such as, for example, from 1 sublayer to 100 sublayers. Each of the sublayers comprising a layer can have the same elemental composition. At least one of the sublayers can have a different elemental composition than another sublayer. For example, a p-type $In_xAl_yGa_{1-x-y}N$ layer can comprise $In_xAl_yGa_{1-x-y}N$ sublayers having different concentrations of a p-type dopant. Each of the sublayers forming a layer can independently be deposited under the same or different deposition conditions and can independently comprise the same or different elemental composition, especially when the deposited layer local composition depends on the local lattice constant, which may vary across the growth surface. A layer need not be continuous, and may be deposited simultaneously in separate regions, such as in selective-area growth.

"$In_xAl_yGa_{1-x-y}N$" refers to an alloy of gallium and nitrogen, aluminum and nitrogen, and optionally indium and/or aluminum. For example, $In_xAl_yGa_{1-x-y}N$ includes GaN, AlN, $In_xGa_{1-x}N$, $Al_yGa_{1-y}N$, $In_xAl_yN$, and $In_xAl_yGa_{1-x-y}N$ where x and y may not be 0.

"$In_{x1s}Al_{y1s}Ga_{1-x1s-y1s}N$" refers to an $In_xAl_yGa_{1-x-y}N$ alloy associated with a first seed region.

"$In_{x2s}Al_{y2s}Ga_{1-x2s-y2s}N$" refers to an $In_xAl_yGa_{1-x-y}N$ alloy associated with a second seed region.

"$In_{x1}Al_{y1}Ga_{1-x1-y1}N$" refers to a $In_xAl_yGa_{1-x-y}N$ alloy associated with a first growth layer and to a first (0001) growth region.

"$In_{x2}Al_{y2}Ga_{1-x2s-y2s}N$" refers to an $In_xAl_yGa_{1-x-y}N$ alloy associated with a second growth layer and to a second (0001) growth region.

"Simultaneously depositing" refers to depositing or growing an epitaxial layer over different regions of a growth substrate at the same time, in the same reactor, and under the same growth conditions such as substrate temperature, gas temperature, reactants, flow rates, and pressures.

"Sequentially depositing" refers to depositing or growing an epitaxial layer over different regions of a growth substrate at different times and under the same or different reactor growth conditions such substrate temperature, gas temperature, reactants, flow rates, and pressures.

Although the disclosure is focused on the growth of InGaN, it is to be understood that the structures, devices and methods encompass InAlGaN alloys such as $In_xAl_yGa_{1-x-y}N$, where x+y is not 0. In an alloy $In_xAl_yGa_{1-x-y}N$, x can be 0 or y can be 0. In an alloy $In_xAl_yGa_{1-x-y}N$, $0 \le x \le 1$, $0 \le y < 1$, and $x+y \le 1$. In an alloy $In_xAl_yGa_{1-x-y}N$, $0 \le x \le 0.4$, $0 \le y \le 0.4$, and $x+y \le 0.4$. For example, in an alloy $In_xAl_yGa_{1-x-y}N$, x+y can from 0.01 to 0.4, such as from 0.05 to 0.4, 0.1 to 0.4, or from 0.2 to 0.4.

Although the disclosure is focused the growth of InGaN overlying substrate layers, buffer layers, a patterned or non-patterned (In) GaN seed regions or a slip region and the formation of a relaxed InGaN region, the invention encompasses growth of $In_{x2}Al_{y2}Ga_{1-x2-y2}N$ overlying patterned or non-patterned $In_{x1}Al_{y1}Ga_{1-x1-y1}N$ seed regions or growth of $In_{x2}Al_{y2}Ga_{1-x2-y2}N$ on a slip region, and the formation of a relaxed $In_{x2}Al_{ay2}Ga_{1-x2-y2}N$ region, where $0 \le x1 < 1$, $0 \le y1 < 1$, $x1+y1 \le 1$ and is characterized by a Wurtzite III-nitride crystal structure, and where $0 \le x2 < 1$, $0 \le y2 < 1$, $x2+y2 \le 1$ and $x2>x1$ and is characterized by a Wurtzite III-nitride crystal structure. For example, a seed region can comprise GaN, AlN, InGaN, AlGaN, InAlN, or InAlGaN, and an overlying growth region can comprise InGaN, AlGaN, or InAlGaN and the relaxed (0001) region can comprise InGaN, AlGaN, InAlN, or InAlGaN, respectively A "mole fraction" in semiconductor alloys such as In(x)Al(y)Ga(1-x-y) N is defined as the ratio of the number of moles of a specific binary nitride component to the total number of moles of all binary nitride components in the mixture. For the quaternary alloy In(x)Al(y)Ga(1-x-y) N: x is the mole fraction of indium nitride (InN); y is the mole fraction of aluminum nitride (AlN); and 1-x-y is the mole fraction of gallium nitride (GaN). These mole fractions indicate the relative proportions of InN, AlN, and GaN in the alloy, and they must sum to 1, e.g., x+y+(1-x-y)=1. This ensures that the total composition of the alloy is fully accounted for by the three binary nitrides. As an example, for the alloy In(x)Al(y)Ga(1-x-y) N where x=0.3 (indium nitride, InN), y=0.2 (aluminum nitride, AlN), and 1-x-y=0.5 (gallium nitride, GaN); the alloy is composed of 30% InN, 20% AlN, and 50% GaN by mole. Or stated differently, the alloy has an InN mole fraction of 30%, an AlN mole fraction of 20%, and a GaN mole fraction of 50%.

An "interface" refers to both a surface of a semiconductor layer and a termination of a semiconductor layer. A surface of a semiconductor layer refers to an interface that is exposed to the ambient environment and does not adjoin another layer such as another semiconductor layer. A termination of a semiconductor layer refers to an interface that adjoins another layer such as another semiconductor layer.

An "interface region" refers to a region of a semiconductor layer that includes an interface between two adjoining semiconductor layers and a portion of the semiconductor layers extending for example, less than 1 nm, less than 2 nm, less than 5 nm, or less than 10 nm from the termination of the adjoining semiconductor layers.

"Bulk relaxed layer" layer refers to an In-containing III-nitride layer that is substantially relaxed and has a thickness greater than 100 nm.

"Engineered substrate incorporating a III-nitride layer" refers to a composite substrate comprising a base wafer (e.g., silicon, SOI, or sapphire), an optional compliance or buffer layer (e.g., oxide, oxynitride, or ceramic), and a III-nitride template layer such as GaN or AlN.

Substrates include QST® substrates, GaN-on-Si, AlN-on-Si, GaN-on-SOI, and other bonded or layered stacks designed to enable epitaxial growth of III-nitride materials on large-diameter wafers.

"Substantially pit-free" refers to a surface morphology having a pit density less than $1 \times 10^7$ cm$^{-2}$ and/or average pit diameter less than 10 nm, as determined by atomic force microscopy (AFM), scanning electron microscopy (SEM), or cathodoluminescence imaging. For comparison, bulk InGaN layers grown under conventional nitrogen-rich MOCVD conditions on GaN/sapphire templates exhibit pit densities greater than $1 \times 10^8$ cm$^{-2}$ and average pit diameters exceeding 50 nm, while bulk InGaN layers grown under conventional nitrogen-rich MOCVD conditions on free-standing (FS) GaN substrates might have pit densities less than $1 \times 10^8$ cm$^{-2}$ but still exhibit average pit diameters exceeding 50 nm.

"Template" refers to one or more layers such as GaN formed on a separate substrate such as a SI, QST or sapphire substrate and the term "engineered substrate" can encompass both. A "template" also encompasses partial layers or regions such as slip regions formed on a layer. A template can includes patterned and non-patterned structures.

As used herein, a "slip layer" or "slip region" refers to a material layer or layer portion, which can be crystalline, amorphous, or nanostructured, inserted or disposed between a substrate or base layer and an epitaxial layer, to promote strain relaxation, dislocation generation, bending and/or glide, during or after growth. Suitable slip layer/region materials include, but are not limited to, low-temperature GaN, AlN, InGaN, AlGaN, SiN$_x$, ZnO. TiN, porous GaN, oxide interlayers (e.g., SiO$_2$, Al$_2$O$_3$), and 2D materials such as graphene or hBN.

Reference is now made in detail to certain embodiments of materials, semiconductor structures, optoelectronic devices, and methods. The disclosed embodiments are not intended to be limiting of the claims. To the contrary, the claims are intended to cover all alternatives, modifications, and equivalents.

Bulk relaxed Wurtzite In-containing III-nitride layers having an interface region characterized by a smooth, substantially pit-free single-phase gallium-polar (0001) orientation are provided using a metal-rich ("MR") MOCVD deposition method. The MR growth regime overcomes the pitted surface morphology observed when Wurtzite In-containing III-nitride layers are grown using conventional MOCVD growth conditions. By addressing the root causes of pit formation during the MOCVD deposition process, MR MOCVD facilitates the growth of thick, high-quality Wurtzite In-containing III-nitride layers without the accompanying surface morphology problems. Furthermore, the approach allows a thick Wurtzite In-containing III-nitride layer to relax to its native lattice constant (Native InGaN®). By unlocking the full potential of Wurtzite In-containing III-nitride materials as a growth template, the MR MOCVD growth method provides new opportunities for optoelectronic semiconductor devices.

The surface of typical "thick" (e.g., >100 nm) InGaN layers grown on GaN by MOCVD, regardless of underlying substrate, is associated with a morphology as shown, for example, in FIG. 1. InGaN layers grown under conventional MOCVD growth conditions utilize very high V/III ratios (typically >1000), which are referred to herein as ammonia- or nitrogen-rich ("N-rich") MOCVD growth conditions.

Under conventional N-rich MOCVD growth conditions and the low growth temperature required for InGaN growth under these conditions, large pits, nucleated at threading dislocation cores in the underlying III-nitride (e.g., GaN) template, open up in the InGaN layer. Thus, the N-rich MOCVD growth conditions are only useful for growing very thin In-containing III-nitride layers on a III-nitride template such as quantum wells, inter-layers, and super-lattices, which have characteristic thickness on the order of tens of nm or less. However, thick, relaxed InGaN layers that can serve as templates upon which to build semiconductor devices are desired.

Figure 2:
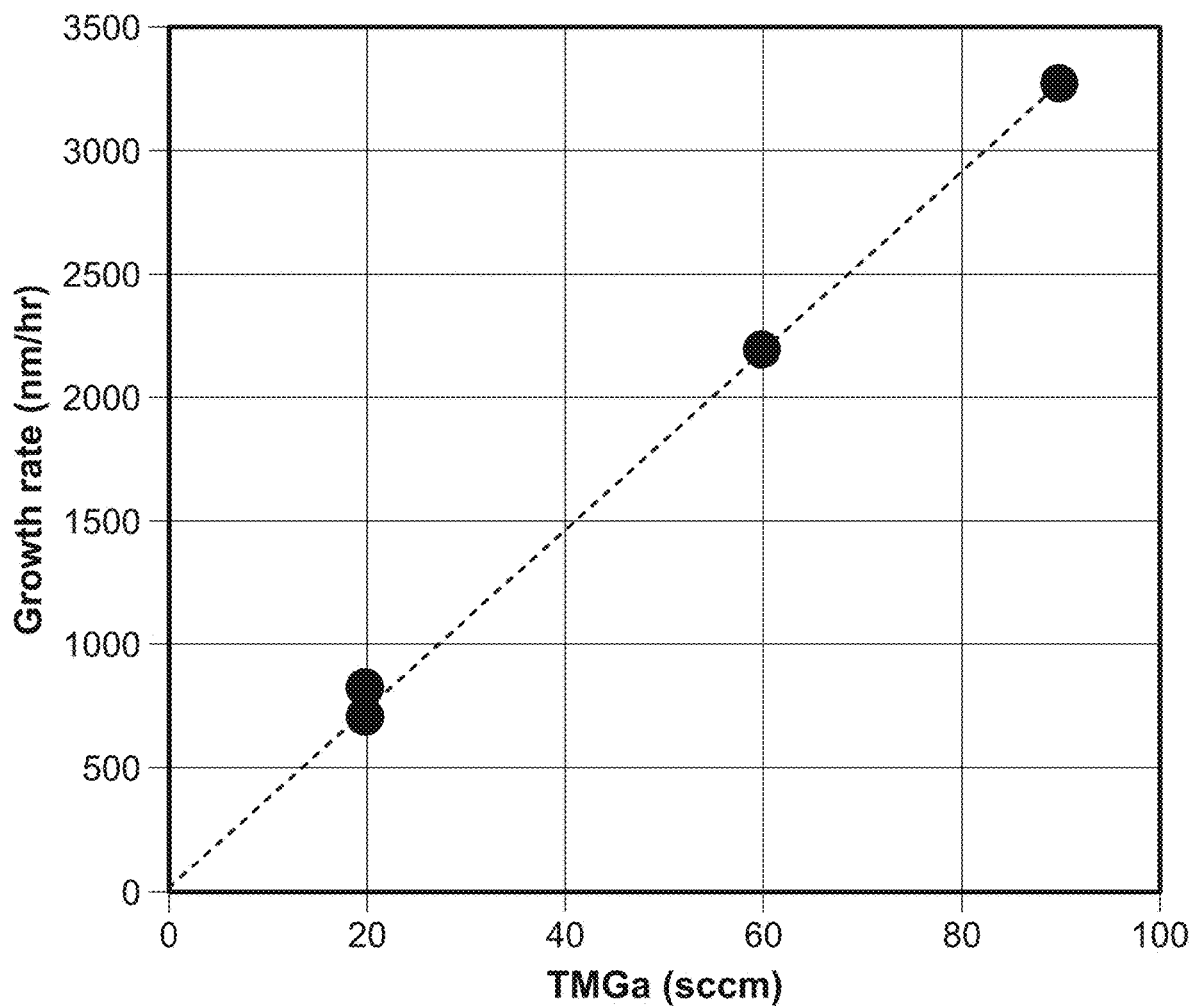
FIG. 2 shows the GaN partial growth rate as a function of TMGa flow rate. The growth rate of InGaN can then be estimated by dividing this by the fractional, real TMGa flow rate with respect to the total metalorganic (MO) flow rate.
Figure 3A:
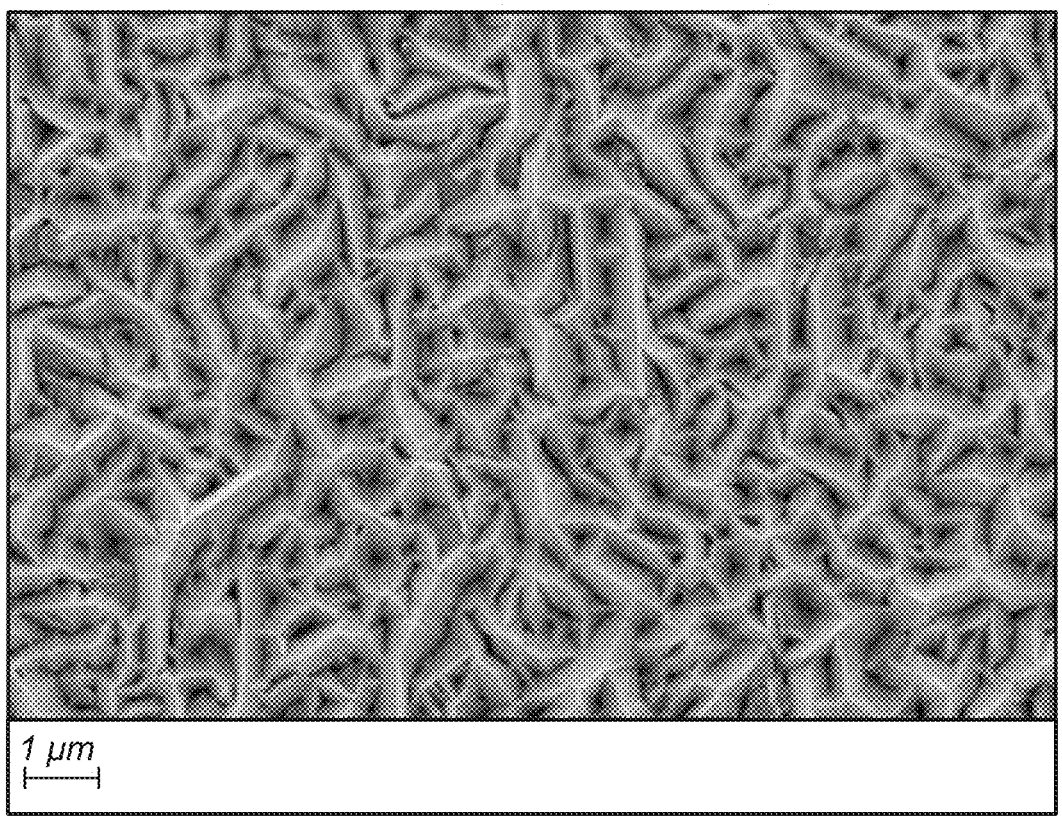
FIGS. 3A-3B show a plan-view (FIG. 3A) and a cross-sectional view (FIG. 3B) of a thick, relaxed InGaN layer having an InN mole fraction of about 8%, grown by MOCVD under ammonia-rich ("N-rich") conditions, with a rough surface morphology.
Figure 3B:
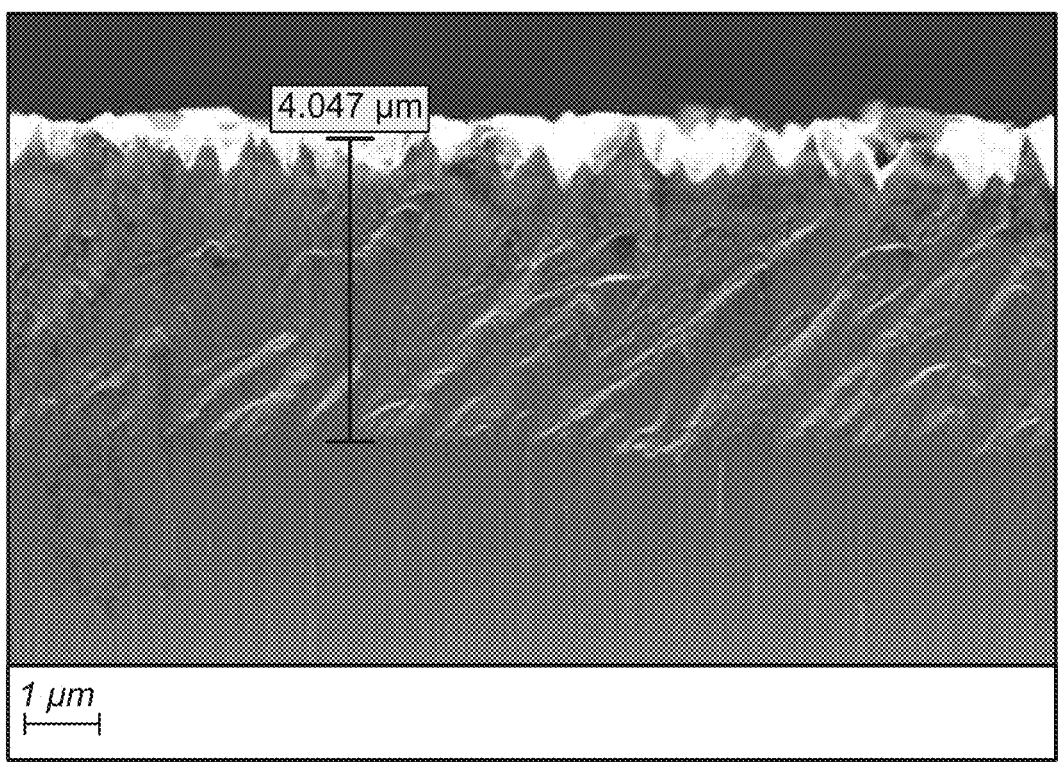

To achieve thick InGaN films, a fast-growth MOCVD method for growing InGaN on GaN or other material using TMG and aiming for high growth rates, for example, of up to 10 μm/hour, such as from 0.5 μm/hour to 5 μm/hour, is provided. The growth can be carried out at a temperature, for example, of about 760° C. under a reactor pressure at 400 mbar. During growth of an InGaN layer, the ammonia flow rate and TMI flow rate can be fixed at 6,000 sccm and 350 sccm, respectively, with N$_2$ used as carrier gas. The total flow rate of TMG flow predominantly determines the growth rate. For example, a TMG flow rate of 50 sccm gives a growth rate of about 2 μm/hour (see FIG. 2). The total gas flow rate (metalorganic, NH$_3$, and carrier gas) entering the reactor can be fixed at 12,000 sccm. The V/III ratio can be about 2,100 (real TMG flow rate is 2.36 sccm, TMI is 0.49 sccm). Thick InGaN films are achieved for these fast-growth MOCVD conditions, and XRD characterization by RSM (not shown) indicates the films are substantially relaxed. However, because the thick InGaN films are formed under N-rich MOCVD conditions, the surface morphology is very rough. FIGS. 3A-3B show a plan-view (FIG. 3A) and a cross-sectional view (FIG. 3B) of a 4 μm-thick, relaxed InGaN layer having an InN mole fraction of about 8%, grown by MOCVD under ammonia-rich ("N-rich") conditions. The rough surface morphology is clearly observed and is not suitable as an InGaN template for growth of optoelectronic devices.

A bulk relaxed Wurtzite In-containing III-nitride layer provided by the present disclosure can comprise a thickness, for example, greater than 100 nm; and a first interface region characterized by a single-phase gallium-polar (0001) orientation, a Wurtzite In-containing III-nitride comprising an InN mole fraction greater than 0; and a substantially relaxed in-plane a-lattice parameter.

A bulk relaxed Wurtzite In-containing III-nitride layer provided by the present disclosure can comprise a Wurtzite In-containing III-nitride semiconductor having an InN mole fraction, for example, greater than 0%, greater than 2%, greater than 4%, greater than 6%, greater than 8%, greater than 10%, greater than 15%, greater than 20%, or greater than 25%.

In a bulk relaxed Wurtzite In-containing III-nitride layer the InN mole fraction can be substantially homogeneous throughout the thickness of the layer.

A bulk relaxed Wurtzite In-containing III-nitride layer, also referred to as a bulk relaxed layer, can comprise an InN mole fraction, for example, from 0.1% to 40%, from 1% to 40%, from 5% to 40%, or from 10% to 40%.

A bulk relaxed layer can comprise an InN mole fraction, for example, from 0.1% to 20%, from 0.1% to 15%, from 0.1% to 10%, or from 0.1% to 5%.

A bulk relaxed layer can comprise InN mole fraction, for example, greater than 0.1%, greater than 1%, greater than 5%, greater than 10%, greater than 20%, greater than 30%, or greater than 40%.

A bulk relaxed layer can comprise InN mole fraction, for example, less than 40%, less than 30%, less than 20%, less than 10%, less than 5%, or less than 1%.

A bulk relaxed layer can comprise $In_xAl_yGa_{1-x-y}N$, where $0<x<1$ and $0\leq y\leq 1$.

A bulk relaxed layer can comprise $In_xAl_yGa_{1-x-y}N$, where $0<x\leq 0.4$ and $0\leq y\leq 1$.

A bulk relaxed layer can comprise $In_xGa_{1-x}N$, where $0<x<1$, $0.01<x<1$, or $0.02<x<1$.

A bulk relaxed layer can comprise $In_xGa_{1-x}N$, where $0<x\leq 0.4$, $0.01<x\leq 0.4$, or $0.02<x<0.4$.

A bulk relaxed layer can comprise $In_xGa_{1-x}N$, where $0<x<1$, $0<x\leq 0.04$, $0.04\leq x\leq 0.08$, $0.08\leq x\leq 0.12$, $0.12\leq x\leq 0.16$, $0.16\leq x\leq 0.20$, $0.20\leq x\leq 0.24$, $0.24\leq x\leq 0.28$, or $0.28\leq x\leq 0.33$.

A bulk relaxed layer can be characterized, for example, by a 002 (symmetric) XRD full-width-at-half-maximum (FWHM) of less than 300 arcsec, less than 200 arcsec, or less than 100 arcsec.

A bulk relaxed layer can be characterized, for example, by a 211 asymmetric XRD full-width-at-half-maximum (FWHM) of less than 1,800 arcsec, less than 1,500 arcsec, or less than 1,300 arcsec.

A bulk relaxed layer can be characterized, for example, by an edge dislocation density of less than $1E10\ cm^{-2}$, less than $1E9\ cm^{-2}$, or less than $1E8\ cm^{-2}$, where the edge dislocation density is determined by electron microscopy and/or by cathodoluminescence.

A bulk relaxed layer can have a maximum lateral dimension, for example, greater than 1 mm, greater than 10 mm, 50 mm, greater than 100 mm, greater than 200 mm, greater than 300 mm, or greater than 400 mm. Therefore, the bulk relaxed layer is compatible with high-volume manufacturing on substrates such as 200 or 300 mm Si substrates, or engineered substrates of similar dimensions.

A bulk relaxed layer can have a maximum lateral dimension, for example, from 1 mm to 500 mm, from 10 mm to 500 mm, from 100 to 400, or from 200 mm to 300 mm.

A bulk relaxed layer can have an area, for example, greater than 1 $mm^2$, greater than 100 $mm^2$, greater than 1.000 $mm^2$, greater than 2,000 $mm^2$, greater than 5,000 $mm^2$, greater than 10,000 $mm^2$, greater than 20,000 $mm^2$, greater than 40,000 $mm^2$, greater than 60,000 $mm^2$, greater than 100,000 $mm^2$, or greater than 200,000 $mm^2$.

A bulk relaxed layer can have maximum lateral dimension, for example, from 1 μm to 1,000 μm, from 1 μm to 800 μm, from 1 μm to 600 μm, from 1 μm to 400 μm, or from 1 μm to 200 μm.

A bulk relaxed layer can have an area, for example, less than $1E6\ \mu m^2$, less than $1E5\ \mu m^2$, less than $1E4\ \mu m^2$, less than 1,000 $\mu m^2$, or less than 100 $\mu m^2$.

A bulk relaxed layer can overlie a III-nitride template layer and/or substrate.

A bulk relaxed Wurtzite In-containing III-nitride layer can have a thickness, for example, greater than 100 nm, greater than 300 nm, greater than 500 nm, greater than 750 nm, or greater than 1,000 nm.

A bulk relaxed Wurtzite In-containing III-nitride layer can have a thickness, for example, from 100 nm to 2,000 nm, from 500 nm to 1,000 nm, or from 750 nm to 1,000 nm.

A bulk relaxed Wurtzite In-containing III-nitride layer can have a thickness that is sufficiently thick so as to provide a template for high quality overlying epitaxial layers such as high quality $In_xAl_yGa_{1-x-y}N$, layers.

A bulk relaxed Wurtzite In-containing III-nitride layer provided by the present disclosure can comprise a first interface region characterized by a single-phase gallium-polar (0001) orientation.

A bulk relaxed Wurtzite In-containing III-nitride layer provided by the present disclosure can comprise a first interface region characterized by a Wurtzite In-containing III-nitride material having an InN mole fraction greater than 0. A semiconductor layer such as a relaxed Wurtzite In-containing III-nitride layer can have a first interface and a second interface opposite the first interface, where the relaxed Wurtzite In-containing III-nitride layer is bounded by the two interfaces. Growth of the relaxed Wurtzite In-containing III-nitride layer proceeds from the second interface to the first interface. The second interface can adjoin an underlying substrate, planar template, a patterned template, or a slip region. The patterned template can be planar or non-planar.

A first interface region of a bulk relaxed layer can comprise an InN mole fraction, for example, from 0.1% to 40%, from 1% to 40%, from 5% to 40%, or from 10% to 40%.

A first interface region of a relaxed layer can comprise an InN mole fraction, for example, from 5% to 40%, from 5% to 35%, from 5% to 30%, from 5% to 25%, from 5% to 20%, or from 5% to 15%.

A first interface region of a bulk relaxed layer can comprise an InN mole fraction, for example, from 0.1% to 20%, from 0.1% to 15%, from 0.1% to 10%, or from 0.1% to 5%.

A first interface region of a bulk relaxed layer can comprise an InN mole fraction, for example, greater than 0.1%, greater than 1%, greater than 5%, greater than 10%, greater than 20%, greater than 30%, or greater than 40%.

A first interface region of a bulk relaxed layer can comprise InN mole fraction, for example, less than 40%, less than 30%, less than 20%, less than 10%, less than 5%, or less than 1%.

A first interface region of a bulk relaxed layer can comprise $In_xAl_yGa_{1-x-y}N$, where $0<x<1$, $0\leq y\leq 1$, and $x+y<1$.

A first interface region of a bulk relaxed layer can comprise $In_xAl_yGa_{1-x-y}N$, where $0<x\leq 0.4$, $0\leq y\leq 1$, and $x+y<1$.

A first interface region of a bulk relaxed layer can comprise $In_xGa_{1-x}N$, where $0<x<1$, $0.01<x<1$, or $0.02<x<1$.

A first interface region of a bulk relaxed layer can comprise $In_xGa_{1-x}N$, where $0<x\leq 0.4$, $0.01<x\leq 0.4$, or $0.02<x\leq 0.4$.

A first interface region of a bulk relaxed layer can comprise $In_xGa_{1-x}N$, where $0<x<1$, $0<x\leq 0.04$, $0.04\leq x\leq 0.08$, $0.08\leq x\leq 0.12$, $0.12\leq x\leq 0.16$, $0.16\leq x\leq 0.20$, $0.20\leq x\leq 0.24$, $0.24\leq x\leq 0.28$, or $0.28\leq x\leq 0.33$.

A first surface of a bulk relaxed layer can be characterized, for example, by a root-mean-square (RMS) roughness of less than 5 nm, less than 2 nm, or less than 1 nm over a 5×5 $\mu m^2$ area, where the roughness is determined by atomic force microscopy.

A first surface of a bulk relaxed layer can be characterized, for example, by a root-mean-square roughness less of than 1 nm, less than 0.5 nm, or less than 0.25 nm over a 1×1 $\mu m^2$ area, where the roughness is determined by atomic force microscopy.

A first surface of a bulk relaxed layer can be characterized, for example, by a pit density of less than 1E9 cm$^{-2}$, less than 1E8 cm$^{-2}$, less than 1E7 cm$^{-2}$, or less than 1E6 cm$^{-2}$, where the pit density is determined by electron microscopy, atomic force microscopy, and/or cathodoluminescence.

A first surface of a bulk relaxed layer can be characterized, for example, by an average pit size of less than 10 nm in diameter, less than 5 nm in diameter, or less than 1 nm in diameter where the average pit size is determined by electron microscopy, atomic force microscopy, and/or cathodoluminescence.

A first surface of a bulk relaxed layer can be characterized, for example, by a maximum pit size of less than 10 nm in diameter, less than 5 nm in diameter, or less than 1 nm in diameter, where the maximum pit size is determined by electron microscopy, atomic force microscopy, and/or cathodoluminescence.

A first surface of a bulk relaxed layer can be characterized, for example, by a threading dislocation density of less than 1E9 cm$^{-2}$, less than 1E8 cm$^{-2}$, or less than 1E7 cm$^{-2}$, wherein the threading dislocation density is determined by electron microscopy and/or cathodoluminescence A bulk relaxed Wurtzite In-containing III-nitride layer provided by the present disclosure can comprise a first interface region characterized by a substantially relaxed in-plane a-lattice parameter.

A relaxed in-plane a-lattice parameter refers to the property that the in-plane lattice parameter of the material is approximately that of a free-standing, coherent, 100% relaxed version of the material having the same elemental composition.

For example, substantially relaxed refers to a material in which the in-plane a-lattice parameter of the material is within ±0.5% of that of a free-standing, coherent, 100% relaxed version of the material having the same elemental composition. Uniformly refers to the property of having a weakly varying or substantially non-varying in-plane a-lattice parameter within the wide area, upon which optical and/or electronic device structures can be fabricated. In addition, the invention is applicable to a wide range of semiconductor crystal systems, including Wurtzite crystal structures, and to high-order alloys including ternary and quaternary alloys. Finally, the invention is suitable for overlying structures grown by a number of growth methods including, for example, molecular beam epitaxy (MBE) and metal-organic chemical vapor deposition (MOCVD).

A first interface region of a bulk relaxed layer can be characterized by an in-plane a-lattice parameter that is, for example, within ±0.2% or ±0.1% that of a fully relaxed in-plane a-lattice parameter of the Wurtzite In-containing III-nitride alloy.

A first interface region of a bulk relaxed layer can be characterized by an in-plane a-lattice parameter that is, for example, within 0.01 Å or within 0.005 Å of a fully relaxed in-plane a-lattice parameter of the Wurtzite In-containing III-nitride alloy.

A bulk relaxed Wurtzite In-containing III-nitride layer provided by the present disclosure can be grown by metal-rich MOCVD as disclosed herein.

A bulk relaxed Wurtzite In-containing III-nitride layer provided by the present disclosure can comprise a second interface opposite the first interface.

A second interface can be planar or non-planar.

A second interface can be planar and characterized by a single-phase gallium-polar (0001) orientation.

A second interface can be characterized by an InN mole fraction greater than 0.

A second interface can be characterized by an InN mole fraction that is substantially the same as the InN mole fraction of the first interface.

A second interface can be characterized by a substantially relaxed in-plane a-lattice parameter.

A second interface can be non-planar, wherein the second interface is not characterized by a single-phase gallium-polar (0001) orientation and is characterized by an In-containing III-nitride, in-plane a-lattice parameter.

A non-planar second interface can comprise a plurality of impressions. The impressions in the bulk relaxed Wurtzite In-containing III-nitride layer can result from the topography of an underlying non-planar template layer such as the topography of seed regions, seed structures, or slip regions.

The impressions can be disposed in a regular array.

The impressions do not comprise a face that is parallel to the first interface.

The impressions can comprise facets that meet a single apex.

The impressions can comprise six triangular facets.

The impressions can comprise six triangular facets meet a single apex.

The impressions can comprise a hexagonal base.

The impressions can comprise a hexagonal base.

In certain embodiments, the impressions do not comprise a truncated pyramidal structure, wherein facets do not meet at a common apex, and a truncated pyramidal structure comprises a mesa structure having a surface parallel to the first interface.

A relaxed In-containing III-nitride layer can comprise, for example, a thickness greater than 100 nm; an InN mole fraction greater than 5%: a (0001) surface that is substantially free of pits: a (0001) surface having a pit density less than 1E-9 cm$^{-2}$ (across at least a 1 µm×1 µm area); a surface having a substantially in-plane a-lattice parameter: a substantially constant InN mole fraction throughout the thickness of the layer: a surface roughness of less than 1 nm RMS over a 1 µm×1 µm area: a surface roughness of less than 5 nm RMS over a 5 µm×5 µm area; and/or a region of the relaxed In-containing III-nitride layer at a distance of less than 20 nm from the initial growth surface is characterized by a relaxed in-plane a-lattice parameter.

A semiconductor structure provided by the present disclosure can comprise a bulk relaxed Wurtzite In-containing III-nitride layer provided by the present disclosure.

A semiconductor structure can comprise a substrate having a substrate interface and a bulk relaxed Wurtzite In-containing III-nitride layer overlying the substrate interface. A semiconductor structure can comprise a bulk relaxed layer adjoining the substrate interface.

The substrate interface can be planar and the adjoining surface of the bulk relaxed layer can be planar.

The substrate can comprise, for example, sapphire, silicon, silicon carbide, AlN, or GaN.

A semiconductor structure provided by the present disclosure can comprise a template, wherein the bulk relaxed Wurtzite In-containing III-nitride layer overlies the template and the template overlies a substrate.

A template can have a thickness, for example, from 10 nm to 10,000 nm. The template can have a thickness, for example, less than 4,000 nm, less than 3,000 nm, less than 1,000 nm, or less than 100 nm.

A template can have opposing planar interfaces.

A template can comprise, for example, GaN, In$_x$Ga$_{1-x}$N wherein x>0, or AlN.

A template can comprise a patterned template. A patterned template can have a planar growth surface or a non-planar growth surface.

A patterned template can comprise a plurality of seed regions.

The plurality of seed regions can be randomly disposed on a substrate or template interface. For example, the randomly disposed seed regions can comprise islands comprising GaN, $In_xGa_{1-x}N$ where x>0, or AlN.

The plurality of seed regions can be disposed on the template or substrate surface in the form of an array. For example, the array can be a hexagonal array or a triangular array.

The array of seed regions can be characterized by a pitch, for example, from 1 μm to 10 μm such as from 1 μm to 5 μm. The array of seed regions can be characterized by a pitch, for example, of less than 10 μm, less than 8 μm, less than 6 μm, less than 4 μm, less than 2 μm, or less than 1 μm, where the pitch refers to the center-to-center spacing between nearest seed regions.

The seed regions can be defined by openings in a suitable mask. A mask can comprise, for example, $SiN_x$ or $SiO_x$, and can have a thickness, for example, from 3 nm to 300 nm such as from 10 nm to 100 nm. Openings in the mask can be circular and can have a diameter, for example, from 0.2 μm to 2 μm.

The plurality of seed regions can be randomly disposed on the surface of the substrate or template. The plurality of seed regions can have different dimensions such as width and/or height above the surface of the substrate or template. The plurality of seed regions can be disposed on a regular pitch or on an irregular pitch.

The seed regions can comprise a layer of a seed material such as GaN, $In_xAl_yGa_{1-x-y}N$ where x>0 and 0≤y≤1, $In_xGa_{1-x}N$ where x>0, or AlN.

The seed regions can comprise seed structures. A seed structure refers to a seed region having a non-planar structure.

A seed structure can comprise a pyramidal seed structure. For example, a pyramidal seed structure can have a hexagonal base and six triangular facets that meet at a common apex. The six triangular facets can comprise {10-11} crystallographically equivalent triangular facets. Each of the six triangular facets of a pyramidal growth structure can serve as a growth surface for an overlying InGaN layer.

A base of a pyramidal seed structure can have a maximum lateral dimension, for example, from 0.05 μm to 2.0 μm.

A pyramidal seed structure can have a height, for example, from 0.05 μm to 2.0 μm.

A seed structure can comprise, for example, GaN, $In_xAl_yGa_{1-x-y}N$ where x>0 and 0≤y≤1, $In_xGa_{1-x}N$ where x>0, or AlN.

A seed structure such as a pyramidal seed structure can comprise $In_xAl_yGa_{1-x-y}N$ where x>0 and 0≤y≤1.

A seed structure such as a pyramidal seed structure can comprise $In_xAl_yGa_{1-x-y}N$ where 0<x<0.4 and 0≤y≤1.

A seed structure such as a pyramidal seed structure can comprise $In_xGa_{1-x}N$, where x>0.

A seed structure such as a pyramidal seed structure can comprise $In_xGa_{1-x}N$ where 0<x<0.4.

A seed structure such as a pyramidal seed structure can comprise GaN.

A seed structure can comprise a GaN base with an overlying layer of an In-containing III-nitride such as InGaN.

A seed structure can be characterized by a dislocation density, for example, of less than 1E10 cm 2, less than 1E9 $cm^{-2}$, less than 1E8 $cm^{-2}$, less than 1E7 $cm^{-2}$, or less than 1E6 $cm^2$.

FIGS. 4A-4E show examples of semiconductor structures with a relaxed Wurtzite In-containing III-nitride layer overlying a substrate or template provided by the present disclosure.

Figure 4A:
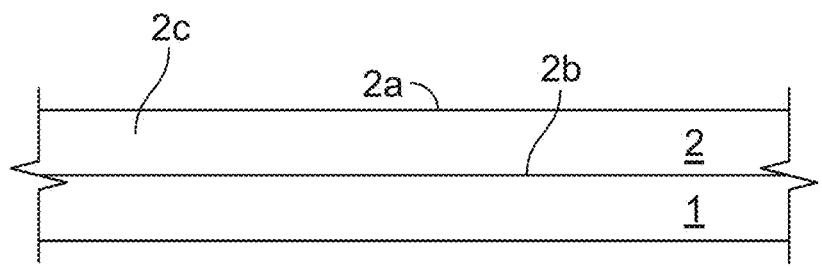
FIGS. 4A-4E show cross-sectional views of semiconductor structures provided by the present disclosure.

FIG. 4A shows an example of a bulk relaxed Wurtzite In-containing III-nitride layer provided by the present disclosure 2 having a planar relaxed first interface 2a and a relaxed region (2c) overlying a substrate 1 and in which a planar second interface 2b of the bulk relaxed layer 2 adjoins the planar substrate surface.

Figure 4B:
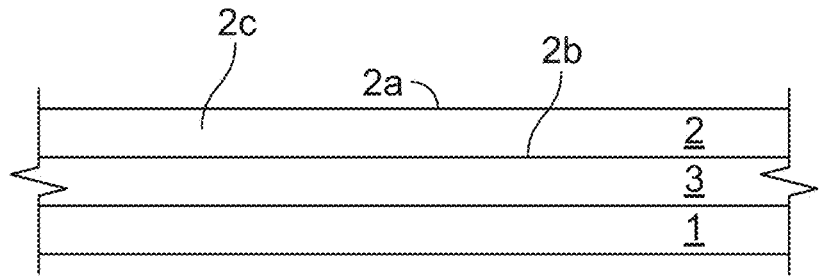

FIG. 4B shows an example of a bulk relaxed layer provided by the present disclosure 2 having a planar relaxed first interface 2a and a first interface region (2c) adjoins a planar template layer 3, which overlies a substrate 1. The template layer 3 is characterized by opposing planar interfaces. Planar second interface 2b of the bulk relaxed layer 2 overlies planar template layer 3. For example, substrate 2 can be silicon and template 3 can be GaN.

Figure 4C:
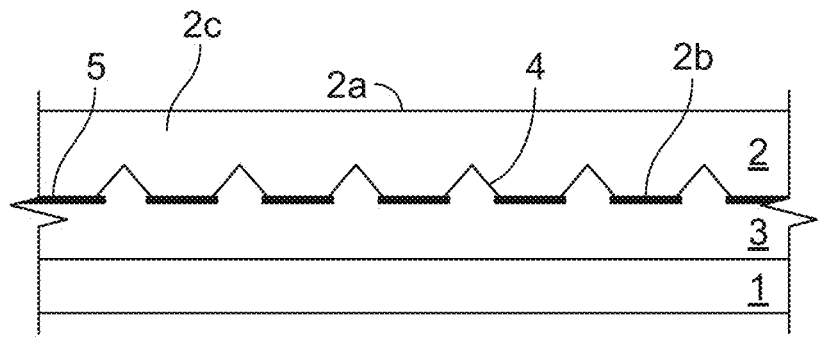

FIG. 4C shows an example of a bulk relaxed layer provided by the present disclosure 2 having a planar relaxed first interface 2a and a first interface region (2c) overlying a patterned template 3, which overlies a substrate 1. The patterned template interface adjoining bulk relaxed layer 2 comprises non-planar seed regions or seed structures 4 in the form of pyramidal seed structures defined by the openings in mask 5. The second interface 2b of the bulk relaxed layer 2 adjoins the seed structures 4 and the mask 5 is non-planar and is characterized by a plurality of impressions complimentary to the pyramidal seed structures 4. The pyramidal seed structures 4 in FIG. 4C are shown as having the same pitch and dimensions. However, the pyramidal seed structures 4 can have other dimensions and dispositions on the template 3. For example, the pyramidal seed structures can have different widths, different heights, and can be disposed in different patterns or randomly across the surface of template 3.

Figure 4D:
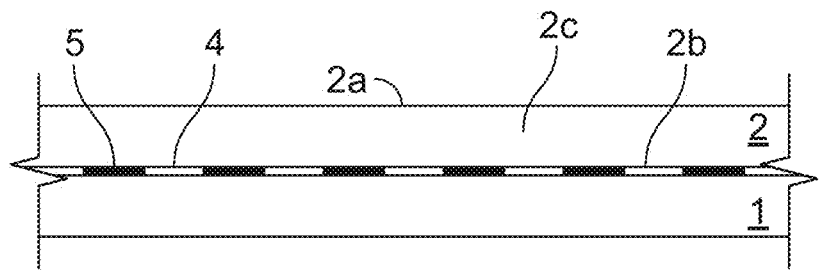

FIG. 4D shows an example of a bulk relaxed layer provided by the present disclosure 2 having a planar relaxed first interface 2a and a first interface region (2c) overlying a patterned template 3, which overlies a substrate 1. The patterned template 3 adjoining the second interface 2b of bulk relaxed layer 2 comprises planar seed regions 4 defined by openings in mask 5. The planar seed regions 4 in FIG. 4D are shown as having the same pitch and dimensions. However, the planar seed regions 4 can have other dimensions and dispositions on the template 3. For example, the planar seed regions can have different widths and can be disposed in different patterns or randomly across the surface of template 3.

Figure 4E:
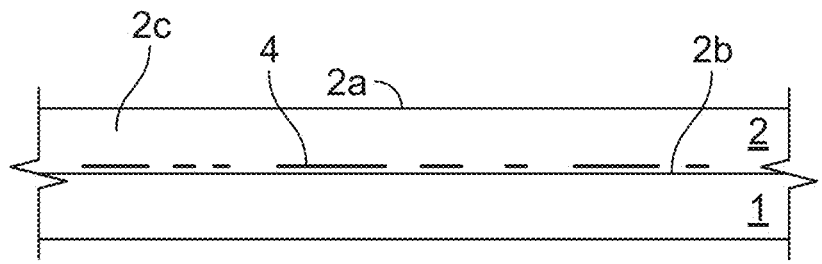

FIG. 4E shows an example of a bulk relaxed layer provided by the present disclosure 2 having a planar relaxed first interface 2a and a first interface region (2c) overlying a patterned template, which overlies a substrate 1. The patterned template adjoining the second interface 2b of bulk relaxed layer 2 comprises seed regions 4 as irregular islands, i.e., irregularly spaced and structure, of a seed material randomly disposed on the substrate interface 2b.

A semiconductor device provided by the present disclosure can comprise a bulk relaxed layer provided by the present disclosure or a semiconductor structure provided by the present disclosure and one or more epitaxial layers overlying the bulk relaxed layer or the semiconductor structure.

The one or more epitaxial layers can be any suitable epitaxial layers useful for providing an operative semiconductor device.

Examples of suitable semiconductor devices include light emitting diodes (LEDs) and laser diodes (LDs). LEDs can be advanced devices such as resonant-cavity (RC) LEDs or photonic-crystal (PX) LEDs. LDs can be advanced structures such as vertical-cavity surface emitting lasers (VCSELs). A semiconductor device provided by the present disclosure can be an optoelectronic device.

The present disclosure includes a wide-area, planar, coherent, at least partially but substantially uniformly relaxed compound semiconductor material layer for use in an optical and/or electronic device. Wide area refers to sizes wider than the emitting diameter of a single optoelectronic device, such as a LED or VCSEL. Consistent with micro-LEDs and micro-VCSELs, wide areas are typically larger than 0.25 µm$^2$, but in some applications may be as wide as 1 mm$^2$ or even larger than 1 cm$^2$ in extent. Planar refers to a semiconductor layer that exhibits at least one surface that is substantially flat and is substantially free of significant thickness variations within the wide area. A planar semiconductor area can serve as a growth surface for one or more overlying epitaxial semiconductor layers. For example, a planar semiconductor layer can have an RMS roughness less than 1 nm, as determined using atomic force microscopy (AFM) over, for example, an area of 1×1 µm$^2$. A planar semiconductor layer can have a thickness, for example, within ±10% of the average thickness of the planar semiconductor layer. In addition, the invention is applicable to a wide range of semiconductor crystal systems, including Wurtzite crystal structures, and to high-order alloys including ternary and quaternary alloys. Finally, the invention is suitable for structures grown by MR MOCVD.

In particular, the present disclosure includes a large-area, planar, coherent, at least partially but substantially uniformly relaxed Wurtzite In-containing III-nitride material layer such as an indium gallium nitride (InGaN) material layer for use as a base layer of an overlying optical and/or electronic device. Various compositions such as In-containing III-nitrides having various InN mole fractions, can be achieved. Uniformly relaxed refers to layers with in-plane lattice parameters that are largely non-varying over the majority of the large area in a plane containing the growth plane. Such relaxed InGaN material is referred to in the present invention, as relaxed InGaN such as Native InGaN® (Opnovix Corporation).

The disclosure further includes optical and/or electrical devices and systems based on relaxed $In_xAl_yGa_{1-x-y}N$ such as relaxed $In_xGa_{1-x}N$, which may include other InGaN layers grown pseudomorphically to relaxed InGaN (i.e., InGaN/InGaN), such as Native InGaN® (Opnovix Corporation).

The disclosure provides for optoelectronic devices having two or more optoelectronic elements configured to emit electromagnetic radiation at different respective wavelengths grown over different respective $In_xAl_yGa_{1-x-y}N$ growth layers overlying a single, common substrate and/or template.

Other features and aspects of the disclosure will be apparent from the following description and the accompanying drawings. In particular, the teachings of the present disclosure are applicable to other compound semiconductor device materials, such as indium gallium nitride ($In_xGa_{1-x}N$), aluminum gallium nitride ($Al_yGa_{1-y}N$), aluminum gallium indium nitride ($In_xAl_yGa_{1-x-y}N$), III-As materials, III-P materials, III-Sb materials, and others.

Figure 5:
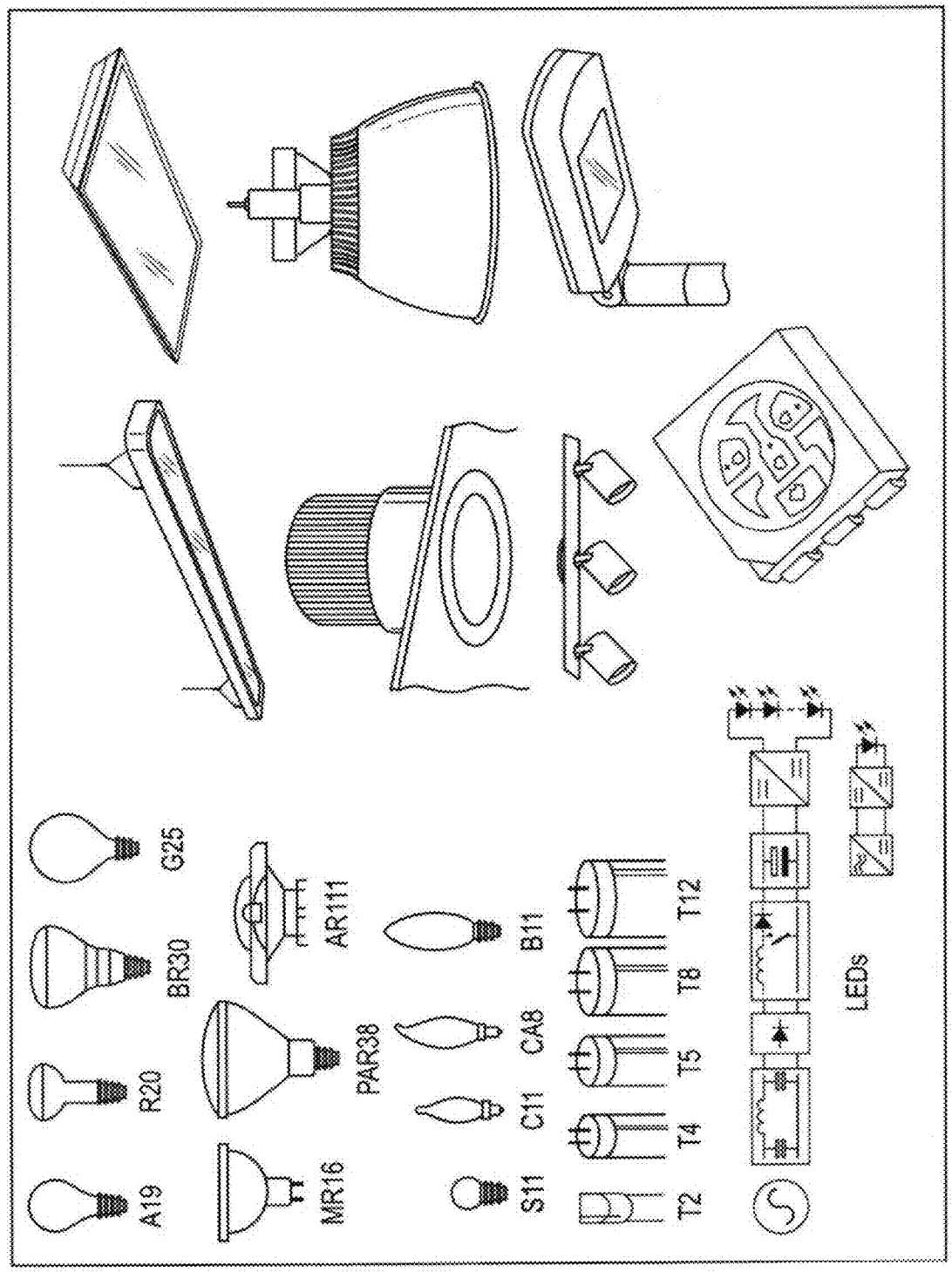
FIG. 5 shows examples of lighting devices and systems in which LEDs provided by the present disclosure can be incorporated.
Figure 6:
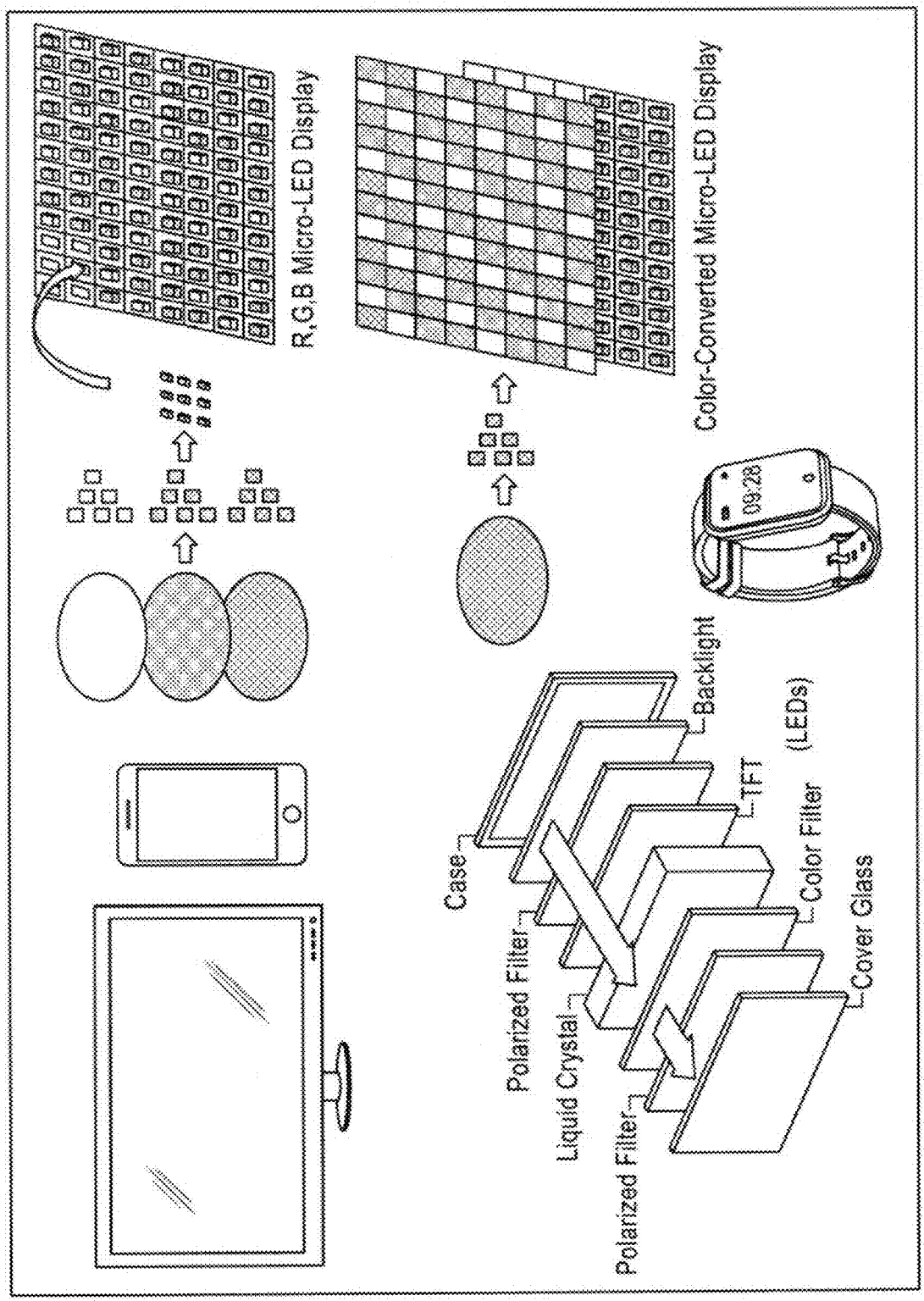
FIG. 6 shows examples of display devices and systems in which LEDs provided by the present disclosure can be incorporated.

Relaxed InGaN layers provided by the present disclosure are applicable to a wide range of compound semiconductor devices which impact the performance of a wide range of system solutions for various applications, including lighting devices and systems (FIG. 5) and display devices and systems (FIG. 6). The bulk relaxed layers provided by the present disclosure can be used in solar photo-voltaic applications.

Target compositions for a relaxed InGaN layer can be selected according to an intended device, application, and performance requirements. For conventional InGaN light-emitting diodes lattice-matched to GaN, the best performing devices are those emitting in the violet wavelength range. At these wavelengths, the strain state of InGaN quantum wells with respect to the GaN base layers is from about 1% to 2% compressive. The corresponding compositional differences are sufficiently high that bandgap engineering can provide very high quantum efficiency devices, while the strain state is sufficiently low to allow for relatively thick InGaN quantum well (QW) layers which serve to reduce carrier density and mitigate non-radiative Auger recombination (aka "droop"). Applying this acceptable range of strain states to other emission wavelengths, preferred compositional ranges for relaxed InGaN base layers provided by the present disclosure can be calculated for a wide range of emitters, from blue (about 450 nm) to the infra-red (about 1.3 µm) wavelengths. The preferred ranges are listed in Tables 1 and 2.

TABLE 1

Preferred ranges of InN mole fraction of relaxed (0001) InGaN base layers for light-emitting diodes and laser diodes according to emission color

| Parameter | Violet | Blue | | Green | | Amber | | Red | |
|---|---|---|---|---|---|---|---|---|---|
| base InN mol % | 0% | 2% | 7% | 13% | 18% | 20% | 26% | 26% | 30% |
| a_base | 3.189 | 3.196 | 3.214 | 3.235 | 3.253 | 3.260 | 3.282 | 3.282 | 3.296 |
| PWL | 405 | 440 | | 520 | | 580 | | 620 | |
| Eg | 3.06 | 2.82 | | 2.38 | | 2.14 | | 2.00 | |
| a_QW | 3.22104 | 3.24596 | | 3.28868 | | 3.31716 | | 3.3314 | |
| QW InN mol % | 9% | 16% | | 28% | | 36% | | 40% | |
| strain % | 1.00% | 1.56% | 1.00% | 1.65% | 1.09% | 1.75% | 1.08% | 1.52% | 1.08% |
| PWL | 420 | 460 | | 540 | | 600 | | 640 | |
| Eg | 2.95 | 2.70 | | 2.30 | | 2.07 | | 1.94 | |
| a_QW | 3.23172 | 3.25664 | | 3.29936 | | 3.32428 | | 3.34208 | |
| QW InN mol % | 12% | 19% | | 31% | | 38% | | 43% | |
| strain % | 1.34% | 1.89% | 1.33% | 1.98% | 1.42% | 1.97% | 1.30% | 1.84% | 1.40% |

(PWL = peak wavelength in nm, Eg = bandgap in eV, a_base = base layer in-plane a-lattice parameter at 300K in Å, a_QW = quantum well layer in-plane a-lattice parameter at 300K in Å).

TABLE 2

Preferred ranges of InN mole fraction of relaxed InGaN (0001) base layers for light-emitting diodes and laser diodes according to emission wavelength

| Parameter | 700 nm | | 850 nm | | 980 nm | | 1300 nm | |
|---|---|---|---|---|---|---|---|---|
| base InN mol % | 32% | 38% | 44% | 50% | 52% | 57% | 69% | 75% |
| a_base | 3.303 | 3.324 | 3.346 | 3.367 | 3.374 | 3.392 | 3.435 | 3.456 |
| PWL | 690 | | 840 | | 940 | | 1300 | |
| Eg | 1.80 | | 1.48 | | 1.32 | | 0.95 | |
| a_QW | 3.35988 | | 3.4026 | | 3.42752 | | 3.49516 | |
| QW InN mol % | 48% | | 60% | | 67% | | 86% | |
| strain % | 1.72% | 1.07% | 1.70% | 1.06% | 1.58% | 1.05% | 1.76% | 1.13% |
| PWL | 710 | | 870 | | 980 | | 1350 | |
| Eg | 1.75 | | 1.43 | | 1.27 | | 0.92 | |
| a_QW | 3.367 | | 3.40972 | | 3.4382 | | 3.50228 | |
| QW InN mol % | 50% | | 62% | | 70% | | 88% | |
| strain % | 1.94% | 1.29% | 1.92% | 1.27% | 1.90% | 1.36% | 1.97% | 1.34% |

(PWL = peak wavelength in nm, Eg = bandgap in eV, a_base = base layer in-plane a-lattice parameter at 300K in Å, a_QW = quantum well layer in-plane a-lattice parameter at 300K in Å).

The teachings of the present disclosure can be applied to relaxed InGaN base layers within, or outside, the preferred ranges listed in Tables 1 and 2.

Bulk relaxed layers and semiconductor structures comprising a bulk relaxed layer provided by the present disclosure can be used to fabricate electronic and optoelectronic devices including InGaN-based optoelectronic devices such as LEDs, LDs, and VCSELs. LEDs and LDs comprising a bulk relaxed layer provided by the present disclosure can be used in lighting systems and display systems. In particular, for LEDs, devices may be formed on a bulk relaxed layer overlying a substrate and/or a template. The substrate can be thinned by techniques such as grinding, lapping, or etching, and can be diced by means known in the art such as sawing, scribe-and-break, laser scribing and breaking, or stealth-dicing, to provide individual LED chips or dies. More common LED chips or die dimensions can be, for example, from 100×100 µm² to 5×5 mm². Micro-LEDs can have device dimensions below 100×100 µm², to smaller than 0.5×0.5 µm². Individual LED chips can then be attached to suitable package elements, which provide leads for electrically contacting and heatsinking the devices. Die-attach can be accomplished using any suitable method such as epoxy or silicone attachment, solder-based attach, or mass-transfer techniques in the case of small devices such as, for example, micro-LEDs with a dimension less than 30 µm. Electrical connection for the chip to the package can be completed by using bond wire such as Au or Ag wires or traces, to connect the anode and cathode leads in the package to respective contact metallizations, i.e., electrodes, on the LED chip. In the case of flip-chip devices, electrical contact can be made through an intermediary submount, positioned between the LED chip and package. The chip electrodes can be attached to the submount carrier by means such as solder-attach or Au-bump attach. The submount carrier can be diced and then mounted into the package by any suitable method.

A relaxed In-containing III-nitride layer can support the formation of electrical contacts, including transparent conducting oxides (e.g., ITO), doped GaN contact layers, metal electrodes, or combinations thereof, enabling efficient carrier injection for optoelectronic device operation.

A relaxed In-containing III-nitride layer, semiconductor structure or device provided by the present disclosure can be integrated into systems such as scanning laser projection systems, and micro-display platforms, particularly where red, green, and blue emission wavelengths are targeted.

A relaxed In-containing III nitride layer as used as a template for epitaxial layer growth enables high-yield fabrication of visible-wavelength devices by mitigating strain accumulation in overgrown structures, thereby reducing defectivity and improving process uniformity.

Desired emission color from the packaged LED device can be obtained by fabricating and providing a bulk relaxed In-containing-based LED, with a desired peak emission wavelength. Multiple such LED chips, optionally with different peak emission wavelengths, can be included in separate packages, or combined together in a multi-chip package. For example, a single package can include red-emitting, green-emitting, and blue-emitting LED chips, which may be arranged in a circuit and electrically coupled to a driver circuit, either within or outside the package, for operating the LEDs. The circuit details and driver can be selected to allow the different color LEDs to operate separately, or together, to provide a wide range of total emission characteristics, including white light emission for use in illumination applications, or for use as a backlight or front-light for a liquid crystal display (LCD) device, such as a television display, computer monitor, mobile phone display, wearable display device, (e.g., f-LCOS), etc.

One or more LED chips can be combined with luminescent down-conversion materials to provide a desired emission spectrum. Such luminescent down-conversion materials may include phosphors, semiconductor nanoparticles such as quantum dots, or perovskite materials. Multiple luminescent down-conversion materials can be combined together in a single package. The LED chip emission wavelength can be selected to excite the luminescent down-conversion materials so that emission from the package is a combination of the LED chip direct emission and that of the luminescent down-conversion material, or the emission may be primarily just that of the luminescent down-conversion material, with the LED chip light mostly fully absorbed by the luminescent down-conversion materials or otherwise blocked or filtered from exiting the package. Packaged LEDs using luminescent down-conversion materials can be used to produce white light, which can be useful in illumination applications. Such devices can be electrically coupled to driver circuits, powered by an external power source such as mains or battery power, thermally coupled to a heatsink, and optically coupled to various optics or lenses to provide lighting devices such as LED lamps or LED light fixtures.

LED chips with smaller dimensions cam be fabricated using a bulk relaxed layer provided by the present disclosure. In particular, devices with dimensions from 0.5×0.5 µm² to 50×50 µm², so called "micro-LEDs", can be fabricated. For micro-LEDs, conventional dicing techniques are less suitable and therefore other means for singulating the devices can be employed. For example, singulation can accomplished by forming micro-LEDs of desired dimensions on a substrate, and then bonding the top surfaces of the micro-LEDs to a carrier, such as blue tape or a submount carrier, then removing the substrate. The individual devices may then be picked up and placed into a package element or onto a backplane for micro-LED-based display. Advanced die-handling techniques, as known in the art, can be used for manipulating micro-LED devices. In particular, red-emitting, green-emitting, and blue-emitting LEDs based on the present invention may be formed into micro-LEDs and arranged to provide a micro-LED display and incorporated into systems such as televisions, computer monitors, tablets, mobile phones, wearable device, etc. In general, other singulation techniques than conventional dicing include laser cutting, stealth dicing, chemical etching, and plasma etching.

LDs incorporating relaxed InGaN layers provided by the present disclosure can also be incorporated into various systems. LD packaging is similar to LED packaging as described herein, except that means are provided for managing the higher power densities in a LD device from a thermal perspective and means for optically accessing the laser facet is provided. LDs of multiple emission colors may be provided in separate packages or combined into a single package. LDs may be coupled to luminescent down-conversion materials to provide a desired emission spectrum. LDs are useful in applications wherein very high light density is required, such as in automotive forward lighting systems, or projection displays, which may include light modulation means such as rastering optics, micro-mirror devices, and LCD modulators.

Examples of lighting systems and display systems are shown in FIGS. 5 and 6, respectively.

Optoelectronic devices provided by the present disclosure comprise epitaxial layers overlying a relaxed Wurtzite In-containing III-nitride layer provided by the present disclosure.

An optoelectronic device can comprise, for example, a light emitting diode (LED), a micro-light emitting diode, a laser diode (LD), a vertical cavity surface emitting laser (VCSEL), and a solar cell . . .

An optoelectronic device provided by the present disclosure can comprise a first doped semiconductor layer of a first conductivity type overlying a bulk relaxed Wurtzite In-containing III-nitride layer provided by the present disclosure: an active region overlying the first doped semiconductor layer, wherein the active region is configured to emit electromagnetic radiation; and a second doped semiconductor layer of a second conductivity type overlying the active region.

In an optoelectronic device, the bulk relaxed Wurtzite In-containing III-nitride layer, the first doped semiconductor layer, the active region, and the second doped semiconductor layer comprise substantially the same nominal composition as the bulk relaxed Wurtzite In-containing III-nitride except for the content of the dopants if any. For example, each of the layers can comprise $In_xAl_yGa_{1-x-y}N$ where $x>0$ and $0 \le y \le 1$, such as $In_xAl_yGa_{1-x-y}N$ where $0<x<0.4$ and $0 \le y \le 1$, $In_xGa_{1-x}N$, where $0<x<1$, or $In_xGa_{1-x}N$, wherein $0<x<0.4$.

An optoelectronic device can comprise a first electrode electrically contacting the first doped semiconductor layer, and a second electrode electrically contacting the second doped semiconductor layer.

An electrode can comprise a p-metal stack such as, for example, indium tin oxide, Ag, NiAg, NiAu, Pt, NiPtAu, AgNiAg, and combinations of any of the foregoing. An electrode can comprise an n-metal stack such as, for example, TiAl, TiAlNiAu, CrAu, TiAlMoAu, TiAu, and combinations of any of the foregoing.

In an optoelectronic device the first conductivity type can be p-type and the second conductivity type can be n-type.

In an optoelectronic device the first conductivity type can be n-type and the second conductivity type can be p-type.

In an optoelectronic device the first doped semiconductor layer can be p-doped and the second doped semiconductor layer can be n-doped.

In an optoelectronic device the first doped semiconductor layer can be n-doped and the second doped semiconductor layer can be p-doped.

A semiconductor layer including a III-nitride layer or an In-containing III-nitride layer provided by the present disclosure can be intentionally doped or unintentionally doped.

In an optoelectronic device the active region is strained with respect to the bulk relaxed Wurtzite In-containing III-nitride layer.

A semiconductor structure or optoelectronic device provided by the present disclosure can be configured to emit electromagnetic radiation across the visible spectrum, from approximately 430 nm to 650 nm, and at wavelengths greater than 650 nm.

In an optoelectronic device the bulk relaxed layer comprising $In_xGa_{1-x}N$ can be characterized by an InN mole fraction of from 1% to 4% ($0.01 \le x \le 0.04$), and the active region can be configured to emit light with a peak emission wavelength between 380 nm and 500 nm.

In an optoelectronic device the bulk relaxed layer comprising $In_xGa_{1-x}N$ can be characterized by an InN mole fraction of from 4% to 8% ($0.04 \le x \le 0.08$), and the active region can be configured to light with a peak emission wavelength between 430 nm and 530 nm.

In an optoelectronic device the bulk relaxed layer comprising $In_xGa_{1-x}N$ can be characterized by an InN mole fraction of from 8% to 12% ($0.08 \le x \le 0.12$), and the active region can be configured to light with a peak emission wavelength between 450 nm and 575 nm.

In an optoelectronic device the bulk relaxed layer comprising $In_xGa_{1-x}N$ can be characterized by an InN mole fraction of from 12% to 16% ($0.12 \le x < 0.16$), and the active region can be configured to light with a peak emission wavelength between 475 nm and 600 nm.

In an optoelectronic device the bulk relaxed layer comprising $In_xGa_{1-x}N$ can be characterized by an InN mole fraction of from 16% to 20% ($0.16 \le x \le 0.20$), and the active region can be configured to light with a peak emission wavelength between 500 nm and 650 nm.

In an optoelectronic device the bulk relaxed layer comprising $In_xGa_{1-x}N$ can be characterized by an InN mole fraction of from 20% to 24% ($0.20 \le x \le 0.24$), and the active region can be configured to light with a peak emission wavelength between 530 nm and 680 nm.

In an optoelectronic device the bulk relaxed layer comprising $In_xGa_{1-x}N$ can be characterized by an InN mole fraction of from 24% to 28% ($0.24 \le x < 0.28$), and the active region can be configured to light with a peak emission wavelength between 560 nm and 720 nm.

In an optoelectronic device the bulk relaxed layer comprising InxGa xN can be characterized by an InN mole fraction of from 28% to 32% (0.28≤x<0.32), and the active region can be configured to light with a peak emission wavelength between 600 nm and 700 nm.

In an optoelectronic device the bulk relaxed layer comprising $In_xGa_{1-x}N$ can be characterized by an InN mole fraction of from 32% to 44% (0.32≤x≤0.44), and the active region can be configured to light with a peak emission wavelength between 700 nm and 850 nm.

A multi-wavelength semiconductor structure provided by the present disclosure can comprise an In-containing III-nitride Wurtzite In-containing III-nitride region or a first bulk relaxed Wurtzite In-containing III-nitride region and a second bulk relaxed Wurtzite In-containing III-nitride region, wherein each of the first bulk relaxed layer and the second bulk relaxed layer is independently characterized by: a first interface region characterized by: a single-phase gallium-polar (0001) orientation: an InN mole fraction greater than 0; and a substantially relaxed in-plane a-lattice parameter, wherein the InN mole fraction of the In-containing III-nitride layer or the first bulk relaxed layer is different than the InN mole fraction of the second bulk relaxed layer.

In a multi-wavelength semiconductor structure each of the first bulk relaxed layer and the second bulk relaxed layer can have a thickness, for example, greater than 100 nm, greater than 300 nm, or greater than 500 nm.

In a multi-wavelength semiconductor structure the In-containing III-nitride layer or the first bulk relaxed layer and the second bulk relaxed layer can overlie a common substrate.

In a multi-wavelength semiconductor structure the first bulk relaxed layer can overlie a common substrate and the second bulk relaxed layer can overlie a common template.

In a multi-wavelength semiconductor structure the first bulk relaxed layer can overlie a first template and the second bulk relaxed layer can overlie a second template.

In a multi-wavelength semiconductor structure the first template and the second template can comprise a different $In_xAl_yGa_{1-x-y}N$ composition.

In a multi-wavelength semiconductor structure the first template and the second template can comprise a different $In_xGa_{1-x}N$ composition.

In a multi-wavelength semiconductor structure the first template and/or the second template can independently comprise seed regions, where the seed regions can comprise planar seed regions or seed structures.

In a multi-wavelength semiconductor structure the first template and/or the second template can independently comprise a patterned template, where the first patterned template and the second patterned template can be the same or different.

In a multi-wavelength semiconductor structure the first template and/or the second template can independently comprise a patterned template, where the first patterned template and the second patterned template comprise a different $In_xAl_yGa_{1-x-y}N$ composition, wherein 0<x≤1 and 0≤y≤1.

In a multi-wavelength semiconductor structure the first template and/or the second template can independently comprise a patterned template, where the first patterned template and the second patterned template comprise a different pattern.

A multi-wavelength optoelectronic device provided by the present disclosure can configured to emit electromagnetic electronic radiation at multiple wavelengths.

A multi-wavelength optoelectronic device can comprise a multi-wavelength semiconductor structure provided by the present disclosure.

A multi-wavelength optoelectronic device can comprise: at least one epitaxial layer overlying the In-containing III-nitride layer or the first bulk relaxed layer; and at least one epitaxial layer overlying the second bulk relaxed layer.

In a multi-wavelength optoelectronic device each of the at least one epitaxial layer can independently comprise: a first doped semiconductor layer of a first conductivity type overlying the In-containing III-nitride layer or the bulk relaxed layer: an active region overlying the first doped semiconductor layer, wherein the active region is configured to emit electromagnetic radiation: a second doped semiconductor layer of a second conductivity type overlying the active region: a first electrode electrically contacting the first doped semiconductor layer, and a second electrode electrically contacting the second doped semiconductor layer.

A multi-wavelength optoelectronic device can comprise a plurality of first optoelectronic devices and a plurality of second optoelectronic devices, wherein the first and second optoelectronic devices are configured to emit electromagnetic radiation within a different wavelength range.

Each optoelectronic device can independently comprise an In-containing III-nitride layer or a bulk relaxed layer and overlying epitaxial layers configured to emit electromagnetic radiation within a desired wavelength range.

MR MOCVD growth, such as described herein can be exploited to realize the deposition of variable composition III-V compound semiconductor alloys with high quality on the same growth substrate. Controlled crystal lattice engineering refers to the ability to fabricate high quality relaxed layers of III-V materials using a patterned growth layer that allows for the incorporation of different InN content determined by the configuration of the patterned growth layer to provide optoelectronic devices configured to emit radiation within a desired wavelength range.

In one method of fabricating a multi-color optoelectronic device, groups of optoelectronic elements, where each optoelectronic element within the group is characterized by a similar in-plane a-lattice parameter and a similar InN content, can be serially fabricated on the same growth substrate such as a GaN layer. For example, a first group of optoelectronic elements can be fabricated on a first portion of a growth substrate, a second group of optoelectronic elements can be fabricated on a second portion of the growth substrate, and a third group of optoelectronic elements can be fabricated on a third portion of the growth substrate. Each of the first group, the second group, and third group of optoelectronic elements can be characterized by a different in-plane a-lattice parameter and a different InN content and can be configured to emit radiation within a different wavelength range.

Control over the in-plane a-lattice parameter allows active regions with different compositions to have similar strain states that are optimal for device performance. For example, optimum strain states for InGaN-based emitters can be, for example, between about 1% and about 3%, such as between 1% and 2%, of compressive strain, regardless of emission wavelength. One way to have the emitters exhibit similar, beneficial strain states, while allowing the InGaN composition of the respective active regions to differ and thereby emit at different wavelengths such as from blue to green to red wavelength ranges, is to adjust the in-plane a-lattice parameter of the underlying material on which the InGaN-based emitters are grown.

A III-nitride epitaxial layer on a growth substrate can be selectively patterned with a dielectric material using known deposition, lithography (including nanolithography), and etching techniques to define GaN seed regions. The patterning can be intentionally selected to produce a desired strain state of a relaxed InGaN growth layer grown on the plurality of GaN seed regions.

Because the in-plane a-lattice parameters of the relaxed InGaN growth layers overlying the various patterned GaN seed regions are different, the incorporated InN mole fraction in each relaxed InGaN growth layer will be different, even though the epitaxial TMI/III ratio and growth temperature used to deposit the InGaN layers overlying each of the respective relaxed InGaN growth layers are the same. Using this method, it is possible to selectively grow multi-colored active regions simultaneously on a single growth substrate in a single growth run, with micron or even sub-micron scale resolution.

Methods provided by the present disclosure include growing a bulk Wurtzite In-containing III-nitride material using MR MOCVD.

A method of fabricating a bulk relaxed Wurtzite In-containing III-nitride layer can comprise growing $In_xAl_yGa_{1-x-y}N$ wherein x>0 and 0≤y≤1, such as $In_xGa_{1-x}N$ where 0<x<1 or 0<x<0.4, using MOCVD.

Growing $In_xAl_yGa_{1-x-y}N$ can comprise growing $In_xAl_yGa_{1-x-y}N$ on a substrate or on a template.

Growing $In_xGa_{1-x}N$ where 0<x≤0.15 can comprise growing on a planar substrate surface or growing on a planar template surface.

Growing $In_xGa_{1-x}N$ where 0.15≤x<1 can comprise growing on a surface of a patterned template.

A relaxed In-containing layer can be grown using MR MOCVD growth conditions.

In view of the challenges with N-rich growth, MOCVD growth was initially performed using lower ammonia flows to move to more "metal-rich" (MR) MOCVD conditions, which improved the surface morphology of the relaxed In-containing layer. A "growth window" was identified that provided both a relaxed In-containing III-nitride layer and acceptable surface morphology. For example, MR MOCVD growth can be carried out at 760° C. with a reactor pressure at 400 mbar. The total gas flow (MO, $NH_3$ and carrier gas) in the reactor can be fixed at 8,000 sccm. For a growth rate around 2 μm/hour, the TMG and TMI flows can be fixed at 50 sccm and 350 sccm, respectively, with $N_2$ as the carrier gas. For the growth of a thick MR InGaN layer under these conditions, the ammonia flow used can be fixed at 200 sccm (200 sccm to 400 sccm of ammonia flow). The V/III ratio can be 65 (such as a V/III ratio from 50 to 150 can be a preferred range). After one hour of MR MOCVD growth, an InGaN layer having a thickness of about 1.75 μm with a smooth and substantially pit-free (0001) oriented InGaN surface can be obtained. The template can be a GaN/sapphire structure, i.e., a GaN layer overlying a sapphire substrate.

The growth regime within the window is referred to as MR MOCVD growth and can be used to provide a "metal rich" (MR) InGaN layer. The smoothness can be characterized by atomic force microscopy (AFM) and can provide an RMS roughness of 4.3 nm (4×4 μm² scan area) for a relaxed MR InGaN layer having an InN mole fraction of about 8% and a thickness of about 1.75 μm on a GaN/sapphire structure. See FIGS. 7A (plan-view) and 7B (cross-sectional view). The RMS roughness of this layer across a 1.5×1.5 μm² scan area is less than 1 nm (about 0.7 nm RMS).

Figure 8:
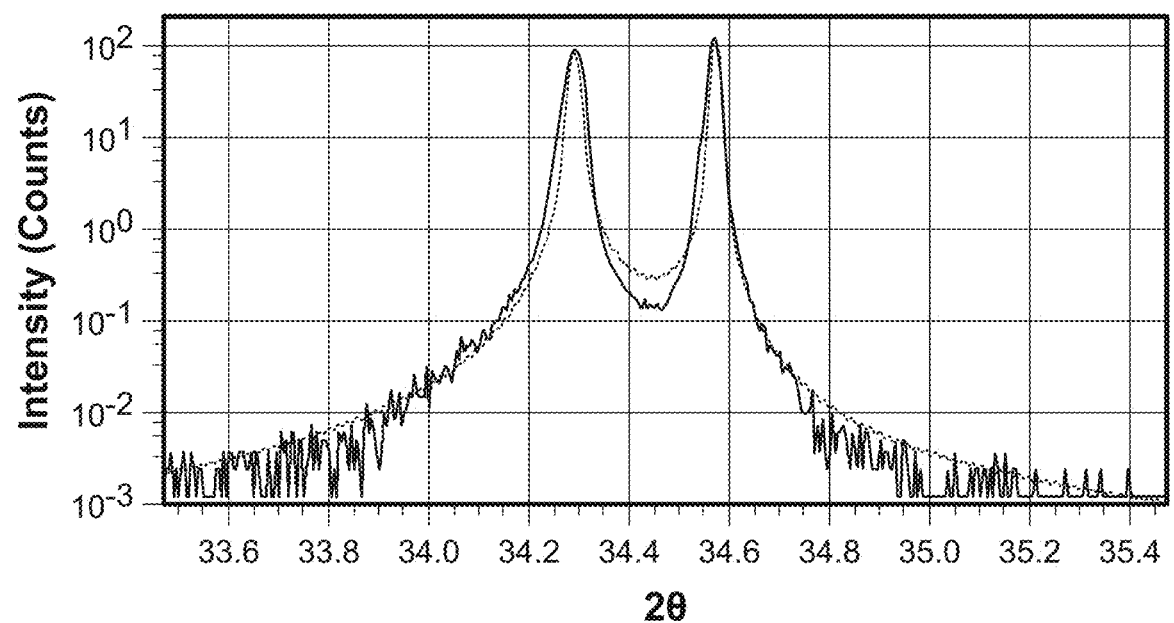
FIG. 8 shows a $\omega$-$2\theta$ XRD scan of an MR InGaN layer having an InN mole fraction of about 8% grown on GaN (solid curve), compared to a simulated $2\theta$-$\omega$ XRD scan (dotted curve).

X-Ray Diffraction (XRD) data for this MR InGaN layer is characteristic of a high-quality, single-phase layer for the MR InGaN, having an InN mole fraction of about 8% and fully relaxed. The w-20 XRD curve is shown in FIG. 8. The 002 (symmetric) diffraction full-width-at-half-maximum (FWHM) is 250 arcsec. The 211 asymmetric (not shown) is 1800 arcsec, suggesting an edge dislocation density greater than 1E10 $cm^{-2}$.

Metal-rich (MR) MOCVD growth conditions refer to semiconductor growth conditions where the ratio of the flow rate of $NH_3$ to the total flow rate of the metalorganics (i.e., the V/III ratio) is less than 200, such as less than 150, or less than 100. For example, the V/III ratio can between 50 and 150. An example of MR MOCVD growth conditions is summarized in Table 3.

TABLE 3

MR MOCVD Growth Conditions.

| TMI Flow Rate (sccm) | TMG Flow Rate (sccm) | $NH_3$ Flow Rate (sccm) | T (° C.) | Result |
|---|---|---|---|---|
| 250-500 | 25-75 | 200-400 | 740-800 | Smooth, substantially pit-free |
| 250-500 | 25-75 | <200 | 740-800 | In droplets |
| 250-500 | 25-75 | >400 | 740-800 | Rough morphology |

The conditions presented in Table 3 refer to growth of InGaN on a planar GaN template overlying a sapphire substrate (GaN/sapphire). For $NH_3$ flow rates of less than 200 sccm droplets of indium formed on the InGaN growth surface. For $NH_3$ flow rates of greater than 400 sccm the InGaN growth surface was characterized by a rough surface morphology, and began to exhibit characteristics of N-rich InGaN growth.

The properties of the bulk relaxed InGaN layer having a smooth, substantially pit-free, (0001) oriented surface obtained using the MR MOCVD conditions of example Table 3 are summarized in Table 4.

TABLE 4

Bulk Relaxed InGaN Layer Properties

| InN % | Relaxation | Short-range roughness (RMS) | XRD 002 XRD 211 (arcsec) | Thickness |
|---|---|---|---|---|
| Up to 16% | 85% to 100% | 4.3 nm (4 × 4 μm²) <1 nm (1 × 1 μm²) | <300 <1000-3000 | Up to 2 μm |

Under MR MOCVD growth conditions the TMI flow rate can be, for example, from 250 sccm to 500 sccm and the $NH_3$ flow rate can be from 200 sccm to 400 sccm.

Under MR MOCVD growth conditions the TMG flow rate can be, for example, from 25 sccm to 75 sccm and the $NH_3$ flow rate can be from 200 sccm to 400 sccm.

Under MR MOCVD growth conditions the total TMI and TMG flow rate can be, for example, from 225 sccm to 575 sccm and the $NH_3$ flow rate can be from 200 sccm to 400 sccm.

Under MR MOCVD growth conditions the V/III flow rate ratio, can be, for example, from 50 to 150, such as from 75 to 125.

Under MR MOCVD growth conditions the growth temperature can be, for example, from 740° C. to 800° C.

Under MR MOCVD growth conditions the growth temperature can be, for example, from 700° C. to 800° C., from 700° C. to 760° C., from 700° C. to 740° C., or from 700° C. to 720° C.

For example, under MR MOCVD growth conditions the TMI flow rate can be from 250 sccm to 500 sccm, the TMG flow rate can be from 25 sccm to 75 sccm, the NH$_3$ flow rate can be from 200 sccm to 400 sccm, and the growth temperature can be from 700° C. to 800° C. such as from 740° C. to 800° C.

Under MR MOCVD growth conditions the growth rate can be, for example, from 0.5 μm/hour to 10 μm/hour. Under MR MOCVD growth conditions the growth rate can be, for example, less than 5 μm/hour, less than 5 μm/hour, less than 3 μm/hour, or less than 2 μm/hour.

Under MR MOCVD growth conditions the growth temperature can be, for example, from 650° C. to 900° C., such as from 700° C. to 850° C., or from 750° C. to 800° C.

Under MR MOCVD growth conditions the reactor pressure can be, for example, from 200 mbar to 600 mbar, such as from 250 mbar to 550 mbar, or from 300 mbar to 500 mbar.

Under MR MOCVD growth conditions the total gas flow rate can be, for example, 6,000 sccm to 10,000 sccm, from 6,500 sccm to 9,500 sccm, or from 6,000 sccm to 10,000 sccm. The total gas flow rate comprises the sum of the flow rate of the metalorganic, NH$_3$ and a carrier gas. The carrier gas can comprise N$_2$.

Under MR MOCVD growth conditions the TMG flow rate can be, for example, from 25 sccm to 75 sccm.

Under MR MOCVD growth conditions the TMI flow rate can be, for example, from 300 sccm to 400 sccm.

Under MR MOCVD growth conditions the NH$_3$ flow rate can be, for example, from 200 sccm to 250 sccm.

A bulk relaxed Wurtzite In-containing III-nitride layer provided by the present disclosure can be fabricated using MR MOCVD growth conditions and is referred to as an MR InGaN layer. The bulk relaxed layer can have a thickness, for example, greater than 100 nm, greater than 500 nm, greater than 1.000 nm, or greater than 2,000 nm. The bulk relaxed layer can have a thickness, for example from 100 nm to 2,000 nm, from 500 nm to 2,000 nm, or from 1,000 nm to 2,000 nm.

Figure 9A:
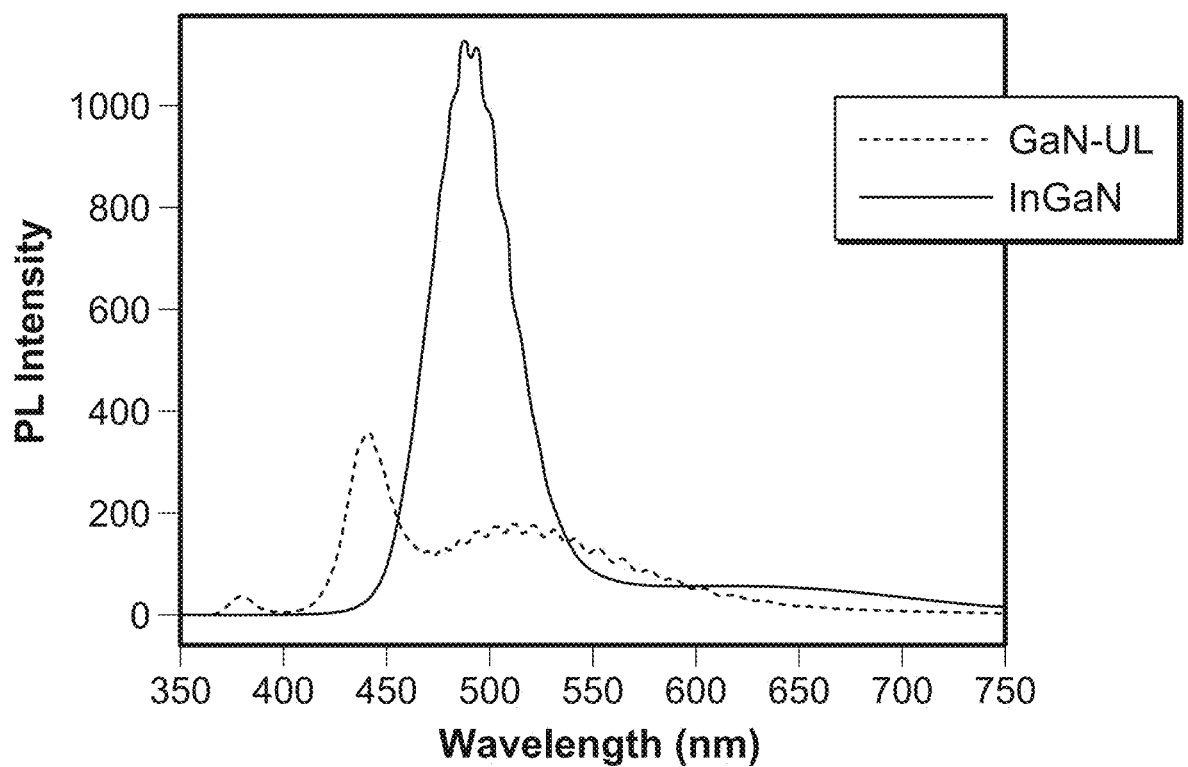
FIGS. 9A-9B show photoluminescence (PL) spectra (FIG. 9A) of MQW structures grown simultaneously on a GaN layer (dashed curve) and on a relaxed MR InGaN layer (InN mole fraction of about 8%) (solid curve) and the corresponding photoluminescence (PL) peak emission wavelength (FIG. 9B) of a series of MQW structures grow as a function of growth temperature (PL excitation wavelength of 325 nm) on the GaN layer or on the relaxed MR InGaN layer (8% InN mole fraction).
Figure 9B:
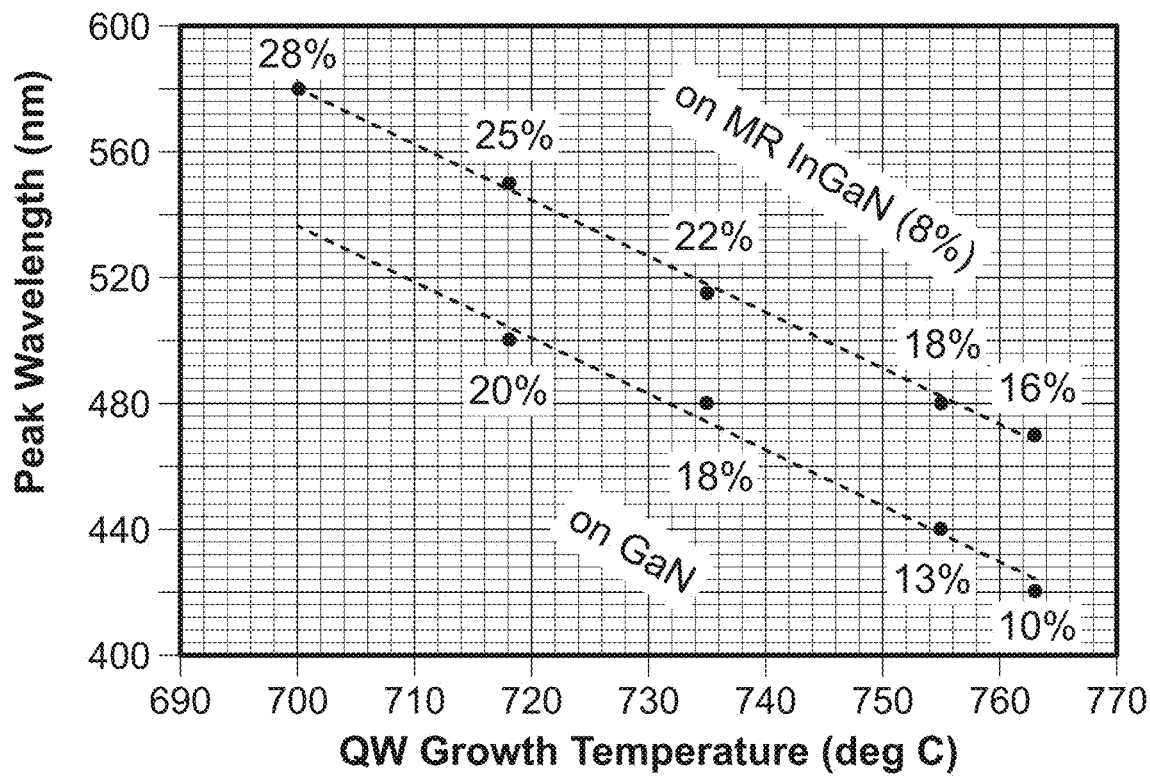

InGaN multiple-quantum-well (MQW) structures were simultaneously grown on MR InGaN templates (8% InN ratio) as well as conventional GaN/sapphire templates. The MQW structures on the MR InGaN template showed a sharp room-temperature photoluminescence (PL) peak with a consistent red-shift of about 50 nm in peak emission wavelength (FIG. 9A solid line) compared to the MQW structures on GaN/sapphire, (FIG. 9A, dashed line) consistent with an increase in MQW InN mole fraction of greater than 5%, demonstrating the benefit of the relaxed InGaN template for facilitating increased InN incorporation in overlying epitaxial device layers. A series of MQW structures grown at different temperatures gave a consistent +50 nm shift in the PL peak emission wavelengths, when grown on relaxed 8% InGaN, compared to GaN, as shown in FIG. 9B.

XRD reciprocal space maps (RSM's) show that for the MQW grown on GaN, each of the MQW layers is pseudomorphic to (e.g., lattice-locked) to GaN. However, in the case of the MR InGaN layer grown on GaN, each of the MQW layers is pseudomorphic to the relaxed MR InGaN base layer. See FIGS. 10A and 10B. Relaxation (e.g., in-plane lattice dilation) in the MR InGaN base layer reduces the strain for the MQW layers compared to the case of growth on GaN, allowing for higher InN mole fraction and/or thicker QWs which can help improve efficiency for both LEDs and LDs, as well as enable achieving longer wavelength emission.

The threading dislocation density of an MR InGaN layer can be reduced using several known methods, such as epitaxial lateral overgrowth (ELOG), growth over in situ SiN$_x$ layers, growth on patterned substrates such as patterned sapphire substrates (PSS), and growth on patterned GaN or InGaN templates. By combining these techniques, high quality bulk relaxed MR InGaN layers can be achieved that can support high performance optoelectronic devices such as LEDs and LDs.

Furthermore, higher InN mole fractions in combination with lower threading dislocation densities can be achieved when MR InGaN layers are grown on relaxed InGaN semipolar (e.g., (10-11)) pyramidal seed regions. For these structures, a GaN/sapphire structure can be patterned with SiN$_x$, leaving openings in a hexagonal array with diameters, for example, from 50 nm to 2,000 nm on a pitch from 50 nm to 2,000 nm. Then, the patterned template can be returned to the MOCVD reactor and growth conditions can be selected to form GaN pyramids that are near or fully apexed and consisting each of six (10-11) pyramidal facets and characterized by a low dislocation density due to the filtering action of the mask and the growth on the pyramidal facets which bends dislocations. Next, InGaN is grown under MR MOCVD growth conditions. Unlike for N-rich InGaN growth on (0001) surfaces, pits do not form, and new dislocations are not created. Nevertheless, the InGaN layers relax, presumably due to "slip" along the SiN$_x$ mask. The method provides a bulk relaxed InGaN layer having a high InN mole fraction with a (0001) semipolar interface region.

A seed region such as a seed region comprising pyramidal seed structures can comprise a planarization layer overlying the seed structures and covering the seed structures. The planarization layer can comprise InGaN having a low In content such as an InN mole fraction such as less than 1% or less than 0.1%. A relaxed In-containing III-nitride layer can be grown over the planarization layer using MR MOCVD growth conditions.

A relaxed In-containing III-nitride layer can be grown over a slip region deposited on a template. The slip region can comprise, for example, one or more non-continuous slip regions.

A slip region refers to a non-continuous area of a dielectric material that overlies the surface of a template prior to growth of the overlying relaxed In-containing III-nitride layer. The relaxed In-containing III-nitride layer is grown on the slip region and regions of the template not covered by the slip region.

In a cross-sectional view of an epitaxial structure in which the relaxed In-containing III-nitride layer is grown over the slip region and the template, a slip region can appear to be embedded in a relaxed In-containing III-nitride layer, embedded in the template, or a combination thereof. The slip region can be randomly disposed across the surface of the template.

A slip region can comprise a dielectric material. Examples of a suitable dielectric material include metal oxides, non-metal oxides, metal nitrides, and non-metal nitrides. For example, a slip region can comprise AlN, TiN, $SiO_x$, $SiN_x$, or a combination of any of the foregoing. For example, a slip region can comprise $SiN_x$.

The slip region can be amorphous and non-crystalline.

A slip region can have an average thickness, for example, of less than 6 nm, less than 4 nm, less than 2 nm, or less than 1 nm. A slip region can have an average thickness, for example, from 0.5 nm to 5 nm, from 0.5 nm to 3 nm, from 0.5 nm to 2 nm, or from 0.5 nm to 1 nm.

A slip region can have a maximum thickness, for example, of less than 6 nm, less than 4 nm, less than 2 nm, or less than 1 nm. A slip region can have a maximum thickness, for example, from 0.1 nm to 10 nm, from 10.1 nm to 3 nm, from 0.1 nm to 2 nm, or from 0.1 nm to 1 nm.

A slip region can form, for example, a non-continuous layer on the surface of a template. A slip region can be in the form of islands. A slip region can include irregularly shaped areas.

A slip region can comprise, for example, non-continuous nanoscale platelets. Multiple portions of a slip region can be randomly distributed across the template surface. The slip region can decorate the template surface.

A slip region can cover, for example, greater than 10%, greater than 20%, greater than 30%, greater than 40%, greater than 50%, greater than 60%, greater than 70%, or greater than 80% of a template surface.

A slip region can cover, for example, less than 90%, less than 80%, less than 70%, less than 60%, less than 40%, less than 30%, or less than 20% of a template surface.

A slip region can cover, for example, from 10% to 90% of a template surface, from 10% to 80%, from 10% to 70%, from 10% to 60%, from 10% to 50%, from 10% to 40%, or from 10% to 20% of a template surface.

A slip region can cover, for example, from 80% to 90% of a template surface, from 70% to 90%, from 60% to 90%, from 50% to 90%, from 40% to 90%, from 30% to 90%, or from 20% to 90% of a template surface.

A slip region can cover, for example, from 10% to 90% of a template surface, from 20% to 80%, from 30% to 70%, or from 40% to 60%, of a template surface.

A slip region can be deposited on a template surface in situ in an MOCVD reactor. The slip region can be formed by flowing inorganic precursors into the MOCVD reactor. A slip region can be formed by exposing the template surface with the inorganic precursors for a short period of time such as, for example, for less than 10 minutes, less than 8 minutes, less than 6 minutes, less than 4 minutes, less than 2 minutes, or less than 1 minute. During this time the chamber concentration can be from 50 mbar to 100 mbar.

The slip region is optionally not patterned or defined using lithography.

A slip region can be deposited at a MOCVD reactor temperature, for example, from 650 C to 850 C.

A slip region can be deposited at a MOCVD reactor pressure, for example, from 50 mbar to 100 mbar.

A slip region can be deposited using a inorganic precursor flow rate, for example, of from 60 sccm to 120 sccm.

A slip region can be deposited using a total gas flow rate, for example, of from 6,000 sccm to 10,000 sccm A slip region can be deposited using an ammonia flow rate, for example, of from 100 sccm to 300 sccm.

A slip region can be deposited using, for example, $H_2$ as the carrier gas.

A slip region can be deposited by exposing the template surface to the dielectric precursors, for example, for from 1 minute to 10 minutes, For example, the slip region can be $SiN_x$ and the dielectric precursors can be silane and ammonia.

A semiconductor structure provided by the present disclosure can comprise a slip region overlying and adjoining a template surface.

A template can comprise a Wurtzite III-nitride material having a (0001) oriented surface.

A template can comprise, for example, GaN, $In_xGa_{1-x}N$, or $In_xAl_yGa_{1-x-y}N$.

A template surface can be planar and have a (0001) orientation.

A template surface can have an RMS roughness, for example, of less than 10 nm, less than 5 nm, or less than 1 nm RMS over a 1 μm×1 μm area; and/or less than 20 nm, less than 10 nm, or less than 5 nm over a 5 μm×5 μm area.

A semiconductor structure can comprise a relaxed In-containing III-nitride layer overlying and adjoining a slip region and a template surface.

A semiconductor structure can comprise a relaxed In-containing III-nitride layer overlying and adjoining a slip region and a template surface and overlying a substrate.

A substrate can comprise any suitable material such as, for example, silicon, sapphire, silicon carbide, or QST® (Qromis Substrate Technology).

Methods provided by the present disclosure include methods of depositing a slip region on a template surface such as the surface of a III-nitride layer such as a GaN layer.

Depositing a slip region on a III-nitride template surface can comprise depositing a dielectric material in situ in a MOCVD reactor.

Depositing a slip region can comprise exposing a surface of a III-nitride layer with dielectric precursors.

Following depositing a slip region, further methods can comprise annealing the slip region and/or treating the slip region such as treating the slip region with a surfactant.

FIGS. 21A-21D show plan-views of relaxed InGaN layers grown under different growth conditions.

Figure 21B:
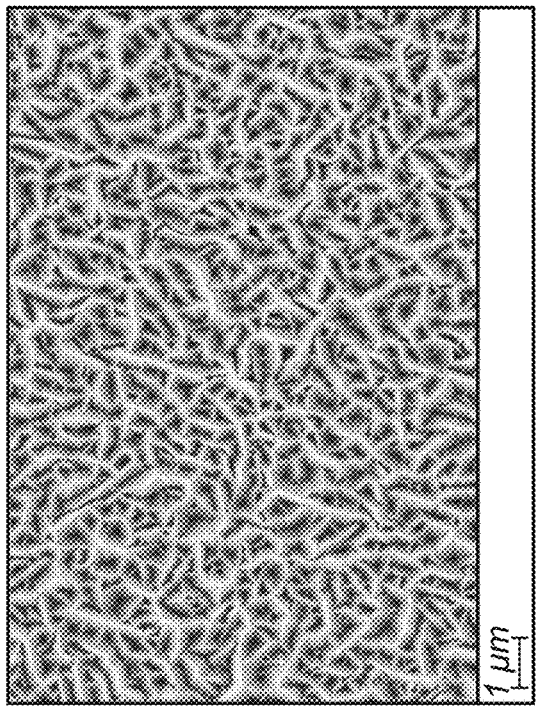
FIGS. 21A-21D show plan-view SEM images of a thick relaxed InGaN layer grown under nitrogen-rich MOCVD conditions (FIGS. 21A and 21B) or under metal-rich MOCVD conditions (FIGS. 21C and 21D), without a slip region between the InGaN layer and the underlying GaN growth surface (FIGS. 21A and 21C), or with a slip region between the InGaN layer and the underlying GaN growth surface (FIGS. 21B and 21D).
Figure 21D:
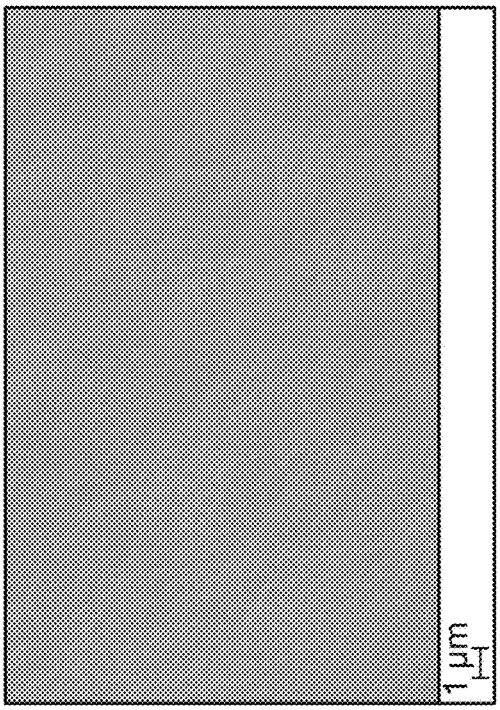
Figure 21A:
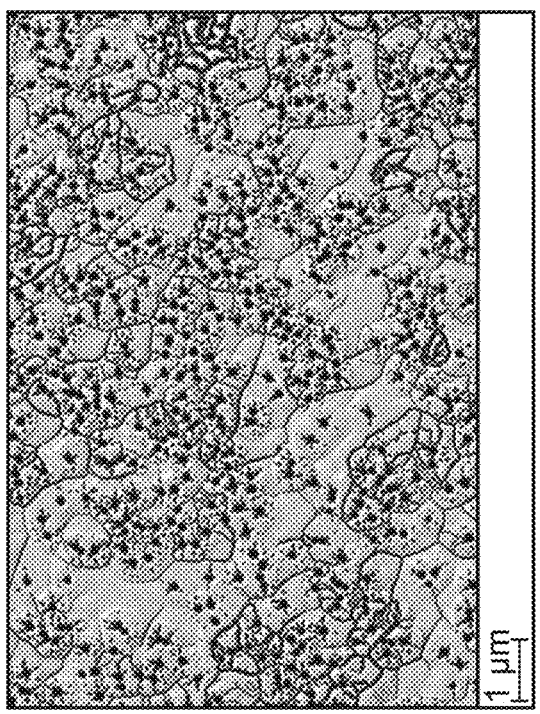

FIG. 21A shows a plan-view of a InGaN layer having an about 8% InN mole fraction grown directly on a GaN template under conventional ammonia-rich MOCVD growth conditions. The thickness was about 430 nm.

FIG. 21B shows a plan-view of a InGaN layer having an about 8% InN mole fraction grown on a GaN template with a slip region under ammonia-rich MOCVD growth conditions. The relaxed InGaN surface is characterized by a surface having a highly non-uniform and rough morphology and with a non-uniform InN mole percent across the InGaN surface. The thickness was about 2.3 μm.

Figure 21C:
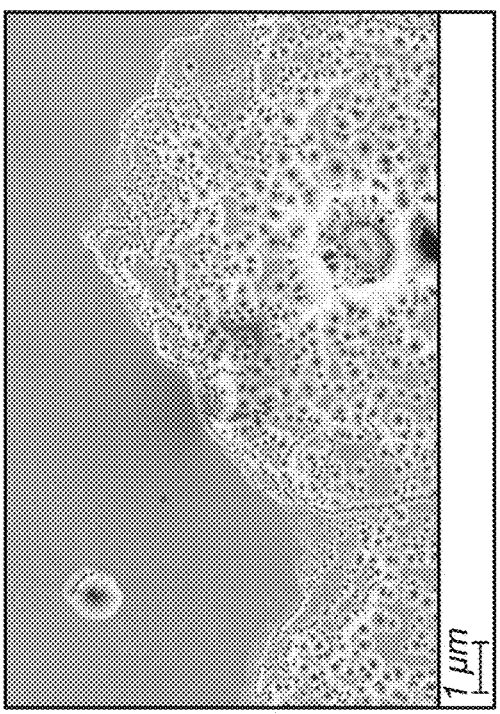

FIG. 21C shows a plan-view of a InGaN layer having an about 8% InN mole fraction grown directly on a planar GaN template under MR MOCVD growth conditions but with no slip region included at the GaN/InGaN interface. The relaxed InGaN surface is characterized by a mix of regions, including some that are relaxed with rough morphology and others that are smooth pseudomorphic regions. The thickness was about 1.1 μm.

FIG. 21D shows a plan-view of a relaxed InGaN layer having an about 8% InN mole fraction grown on a planar GaN template with a slip region under MR MOCVD growth conditions. The relaxed InGaN surface is smooth, substantially free of pits and has a uniform InN mole fraction across the InGaN surface. The thickness was about 2.25 μm.

In summary FIGS. 21A-21D show scanning electron microscope (SEM) images of InGaN layers grown under four different conditions to systematically evaluate the effect of gas-phase chemistry and interfacial engineering on the morphology of thick InGaN films. The images are arranged in a 2×2 table, where the rows distinguish between ammonia-rich (upper row) and metal-rich (lower row) growth conditions and the columns denote the presence (right column) or absence (left column) of a slip layer.

Figure 22A:
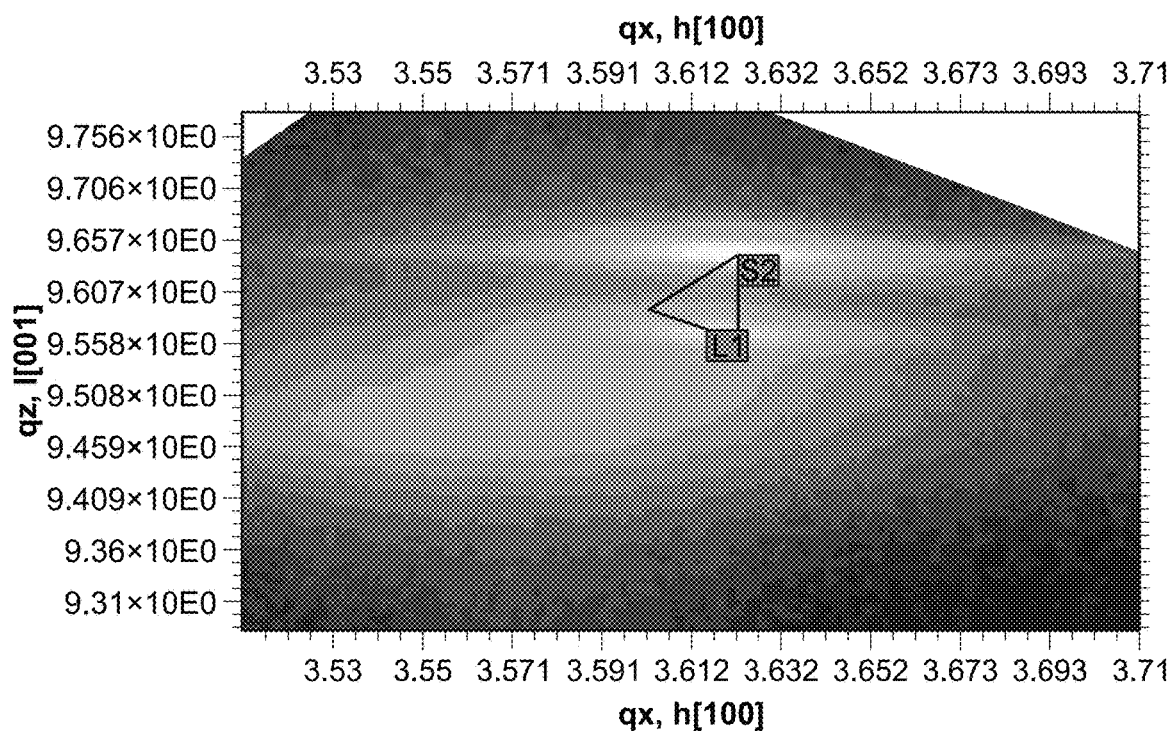
FIGS. 22A-22B show XRD RSM images of a mixed-strain (relaxed and pseudomorphic) uniform InGaN layer grown directly on a GaN surface without an intervening slip region (FIG. 22A) and a relaxed InGaN layer grown on a GaN surface having an intervening slip region (FIG. 22B) under MR-MOCVD growth conditions.
Figure 22B:
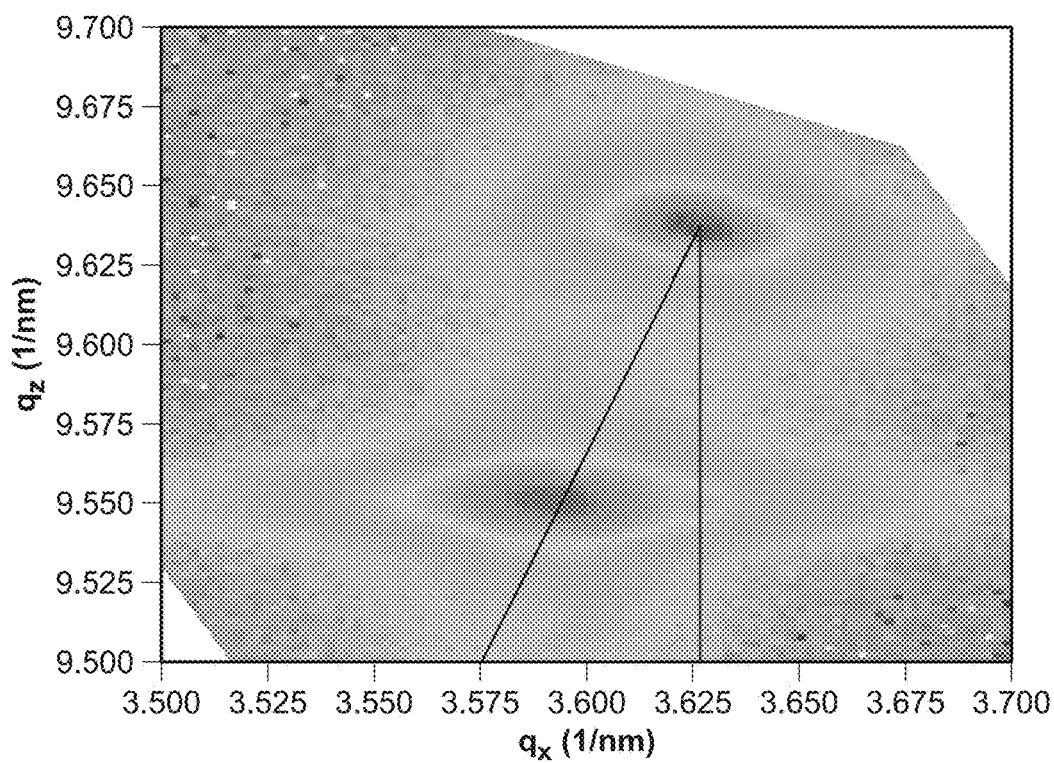

FIGS. 22A-22B show reciprocal space maps (RSMs) obtained via X-ray diffraction (XRD) for InGaN layers grown under metal-rich conditions, with and without the use of a slip layer, corresponding to the layers of FIGS. 21D and 21C, respectively. In FIG. 22A the InGaN layer was grown directly on a GaN template without a slip layer. The XRD peak associated with the InGaN is partially shifted, indicating incomplete relaxation, and a large pseudomorphic component. In FIG. 22B the introduction of a slip layer results in a fully relaxed InGaN layer, as evidenced by the alignment of the InGaN peak along the relaxation line in reciprocal space, consistent with the requisite shift in the a-lattice parameter. The data confirm that the slip layer enables full strain relaxation in a high quality epitaxial layer. Strain relaxation may occur through one or more mechanisms, including misfit dislocation formation, glide-assisted dislocation motion, and elastic relaxation.

Figure 23B:
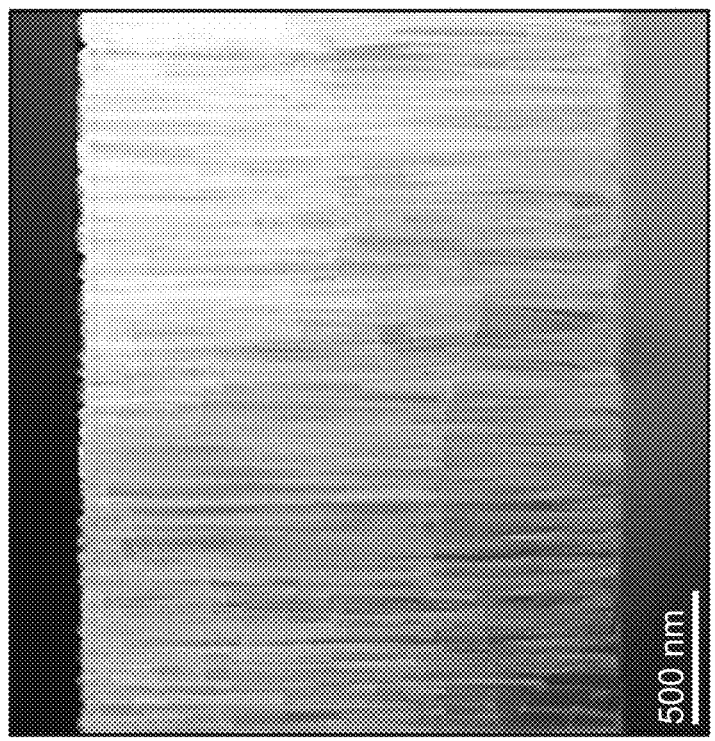
FIGS. 23A-23B show TEM images of a relaxed and pseudomorphic InGaN layer grown under MR-MOCVD growth conditions directly on a GaN surface without an intervening slip region (FIG. 23A) and a relaxed InGaN layer grown on a GaN surface having an intervening slip region (FIG. 23B).
Figure 23A:
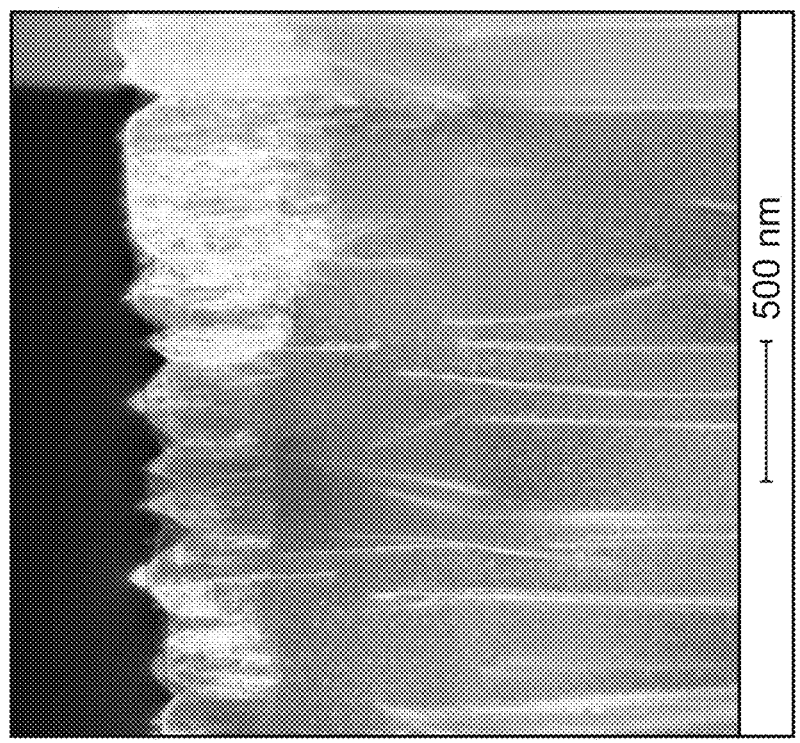

FIGS. 23A-23B show cross-sectional TEM images of the same samples characterized in FIGS. 22A-22B. The image in FIG. 23A shows a non-planar, faceted InGaN film grown under metal-rich conditions without a slip layer, revealing inconsistent layer thickness and poor surface quality in this uncontrolled strain-relief situation. In contrast, the image in FIG. 23B illustrates a flat, uniform InGaN film grown with a slip layer under identical metal-rich conditions. The layer is thick (more than two microns) and flat. The vertical striations are due to the presence of edge dislocations created at the interface to allow relaxation to occur. (The small pits at the surface are due to the presence of a MQW test structure grown under conventional ammonia-rich conditions.) These results confirm that the slip layer promotes both relaxation and morphology stabilization in thick InGaN films.

A relaxed In-containing III-nitride material can comprise $In_xAl_yGa_{1-x-y}N$ wherein x>1, and 0≤y≤1.

A relaxed In-containing III-nitride material can have an in-plane a-lattice parameter that differs from the in-plane a-lattice parameter of an underlying III-nitride template, for example, by greater than ±0.1%, greater than ±0.5%, greater than ±1%, greater than ±1%, greater than ±2%, or greater than ±5%.

A III-nitride template can comprise, for example, GaN, AlN, or $In_xAl_yGa_{1-x-y}N$ wherein x>1, and 0≤y≤1 such as $In_xGa_{1-x}N$.

Figure 24B:
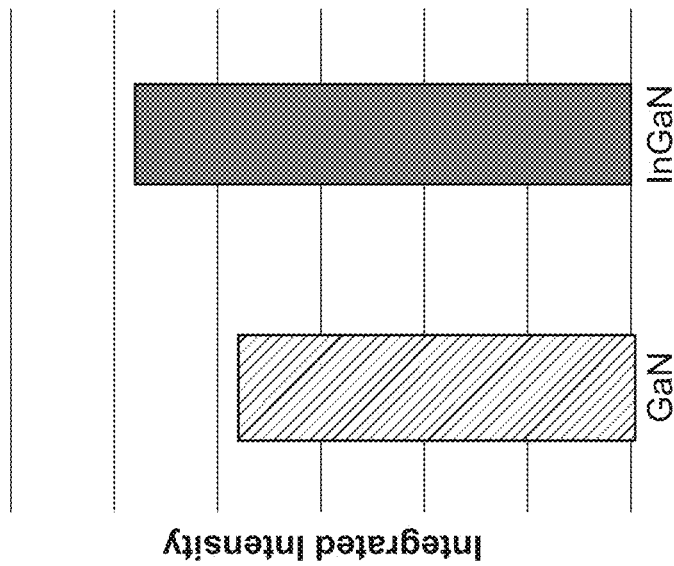
FIG. 24B shows the integrated photoluminescence (PL) intensity (325 nm excitation) of the emission from the MQW structures grown simultaneously on a GaN layer (left) or on the relaxed InGaN (InN mole fraction of about 8%) layer described for FIG. 24A.
Figure 24A:
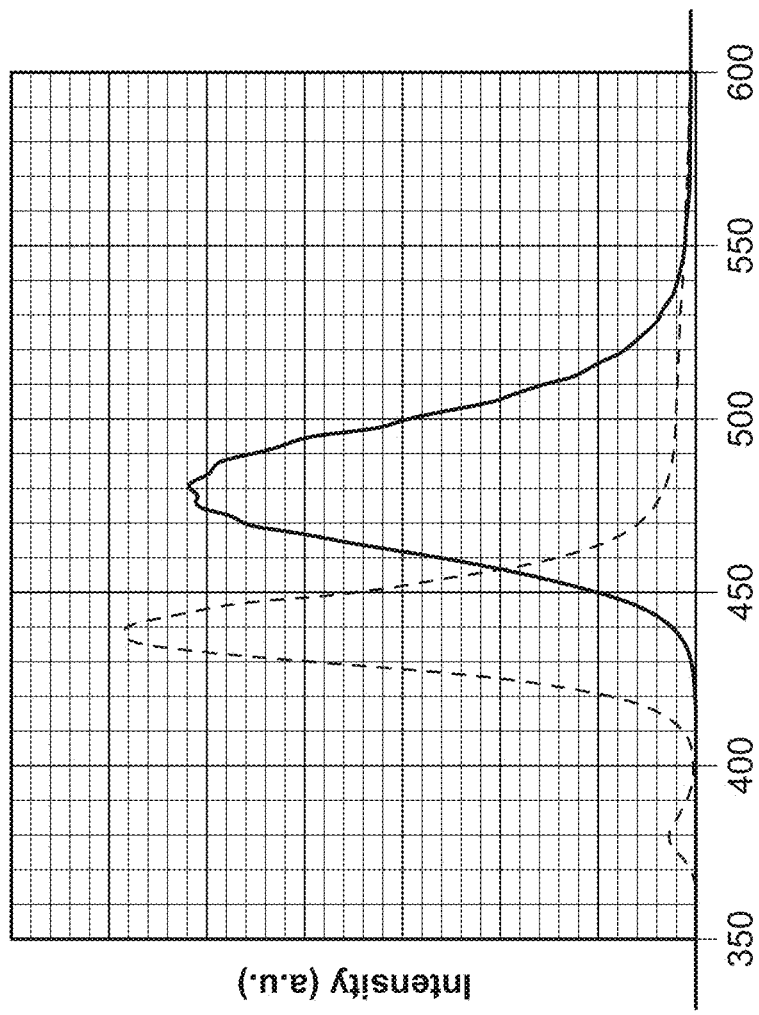
FIG. 24A shows photoluminescence (PL) spectra of MQW structures grown simultaneously on relaxed InGaN layer (InN mole fraction of about 8%-solid curve), or on GaN layer (dashed curve)

Photoluminescence spectra of relaxed InGaN layer grown directly on a planar GaN template (dashed line) under MR MOCVD growth conditions and on an InGaN layer grown on a planar GaN template decorated with a $Si_3N_4$ slip region (solid line), are shown in FIG. 24A. FIG. 24B shows the integrated photoluminescence for the spectra shown in FIG. 24A.

FIGS. 24A-24B show 325-nm-excitation photoluminescence (PL) spectra from identical MQW structures grown simultaneously in the same reactor on two different templates: (1) conventional GaN and (2) 8% smooth, relaxed (Native) InGaN. Both were excited at 325 nm. The MQW on GaN (dashed line) shows expected PL emission in the blue. The MQW on 8% Native InGaN® exhibits a peak emission wavelength red-shifted by approximately 50 nm relative to that on GaN, and also shows higher integrated PL intensity (table at right). This result demonstrates that the relaxed base layer of Native InGaN® modifies the strain state increases In incorporation in the MQW, resulting in longer wavelength emission and enhanced radiative efficiency compared to the typical case under highly strained conditions, which degrade radiative recombination efficiency due to the QCSE. Interesting, this bright PL emission is observed for the MQW on the 8% Native InGaN® despite its having a much higher threading dislocation density than the case of growth on GaN.

Figure 25:
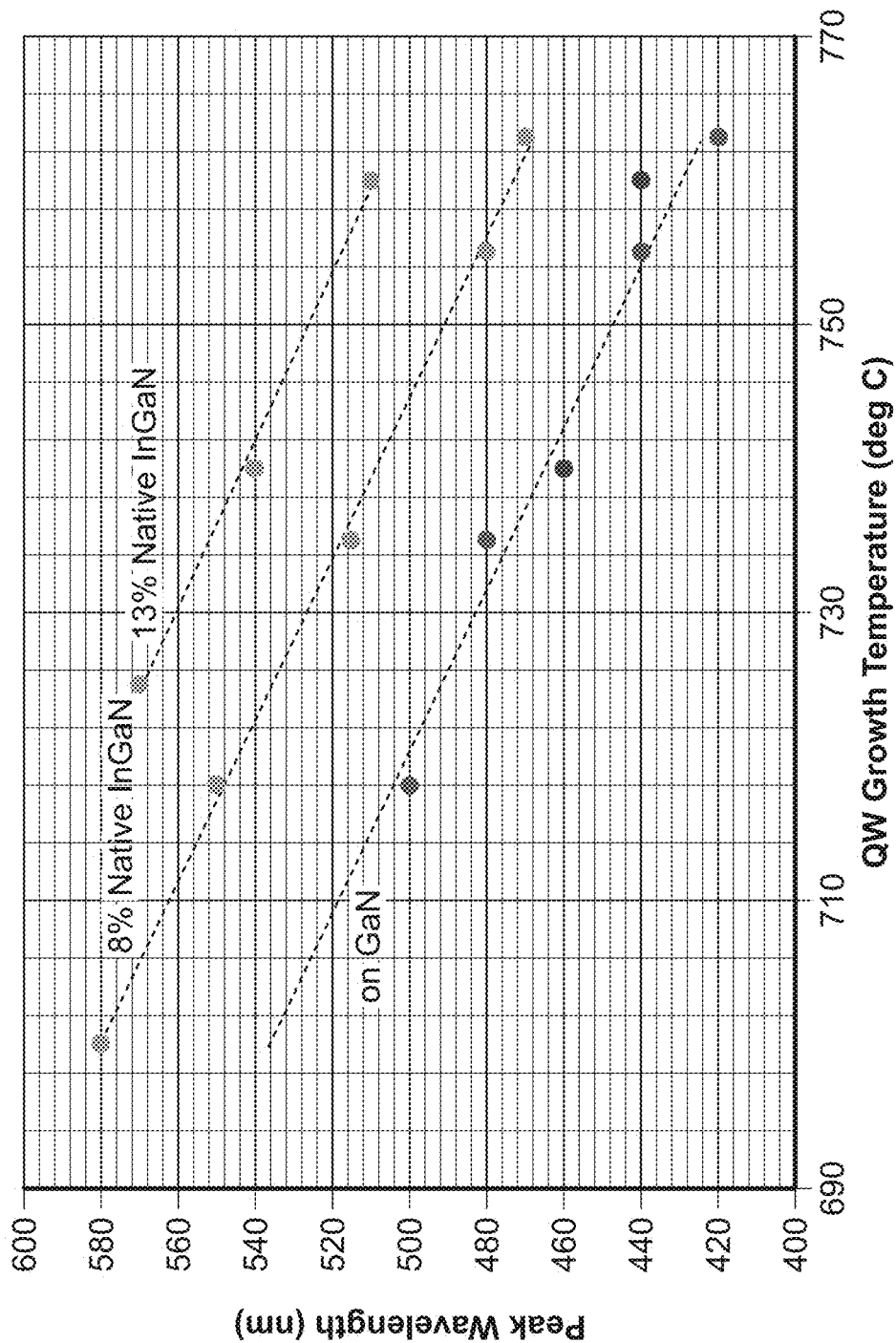
FIG. 25 shows the simulated photoluminescence (PL) peak emission wavelength of a series of MQW structures grown on GaN, relaxed 8% InGaN, and relaxed 13% InGaN layers as a function of growth temperature (PL excitation wavelength of 325 nm). The solid circles represent measurements.

FIG. 25 shows the relationship between MQW growth temperature and peak PL emission wavelength for three substrate conditions: GaN, 8% Native InGaN, and 13% Native InGaN®. Each dataset shows a linear trend, with Native InGaN®-based templates producing MQW emission red-shifts of approximately 50 nm (8%) and 80 nm (13%), respectively, relative to growth on GaN. Additionally, the relaxed lattice constant of Native InGaN permits MQWs to be grown at higher temperatures for the same emission wavelength, e.g., 500 nm emitters can be grown at about 760° C. on 13% Native InGaN® compared to about 20° C. on GaN. This increase in growth temperature (about 40° C. in this example) allows for better adatom mobility and improved optical and structural quality. Even higher temperature (and further improved quality) growth can be expected for growth using Atmospheric Pressure (AP) MOCVD.

Figure 26:
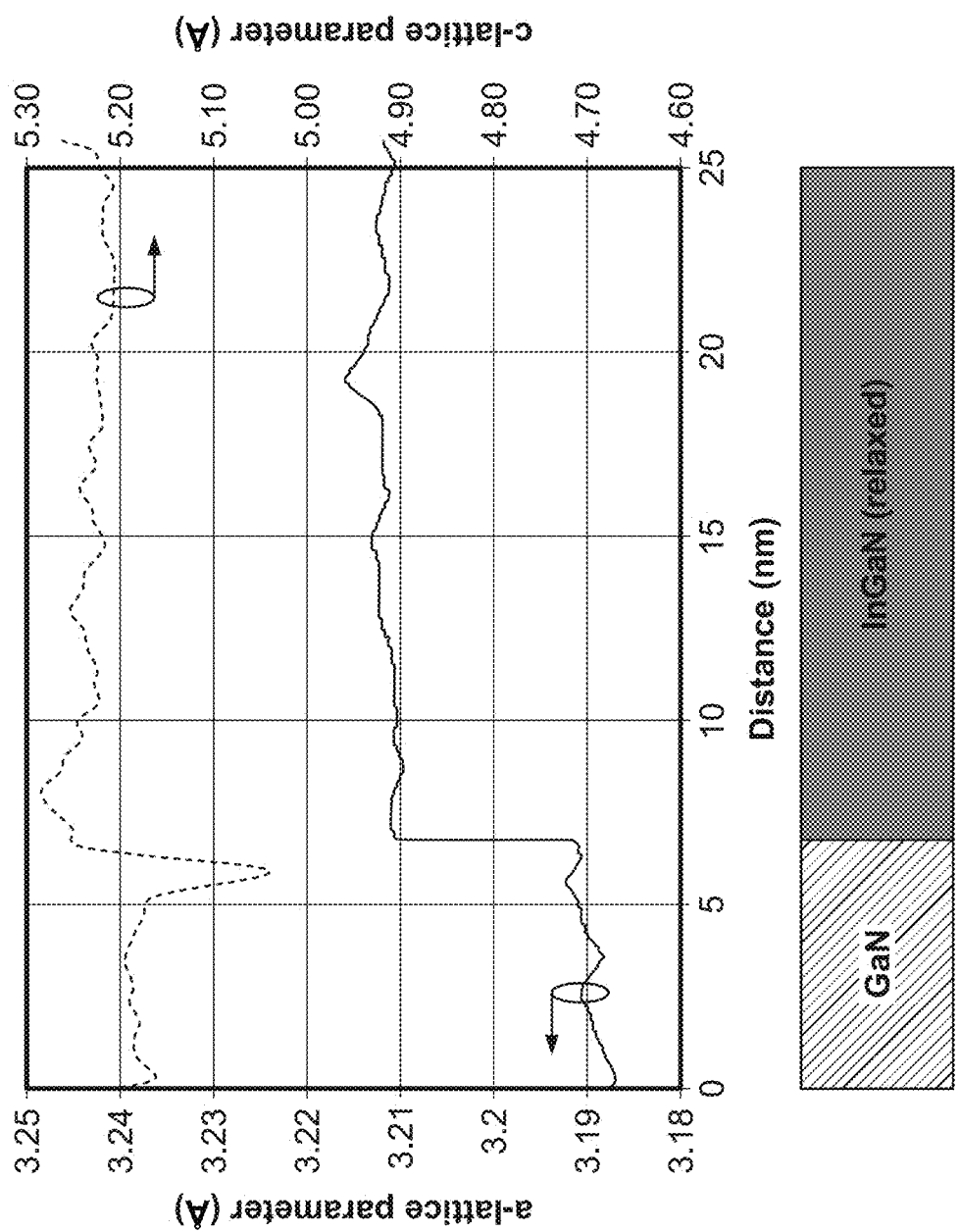
FIG. 26 shows the in-plane a-lattice parameter (solid line) and the c-lattice parameter (dashed line) of a semiconductor structure comprising a GaN layer, a relaxed InGaN layer, and a slip region (not shown) at the interface between the GaN layer and the InGaN layer, wherein the InGaN layer is grown under MR MOCVD conditions.

FIG. 26 shows a schematic representation of a GaN/InGaN stack lined up with (above) a high-resolution TEM strain map showing the a- and c-lattice parameters as a function of depth across the interface. The GaN region exhibits standard, expected lattice parameters for the a- and c-lattices. Near the interface, the c-lattice parameter compresses as the film accommodates compressive stress from InGaN. Almost simultaneously, the a-lattice parameter abruptly dilates over a very narrow region (<2 nm), followed by release of the c-lattice. This transition marks the onset of full relaxation in the InGaN film, confirming that strain decoupling is abrupt and localized, enabled by the presence of the slip layer which is present between the GaN and InGaN layers. The InGaN layer is grown under metal-rich conditions and is fully relaxed and smooth. The average a-lattice parameter for the InGaN layer is 3.212 Å, bounded by a measurement range of 3.210 Å to 3.216 Å.

Before growing the InGaN layer, a slip region was applied to the surface of the GaN template to partially cover the planar (0001) oriented GaN surface.

A semiconductor structure provided by the present disclosure can comprise one or more slip regions. For example, a semiconductor structure provided by the present disclosure can comprise one, two, three, four, or more slip regions. Each of the slip regions can be substantially the same or different. For example, each of the slip regions can comprise a different dielectric material, a different dielectric strength, a different average thickness, a different surface coverage, and/or can be deposited under different conditions.

A semiconductor structure can comprise a first slip region and a second slip region overlying a template such as a III-nitride template.

The first and second slip region can independently overly and adjoin, for example, a template, a relaxed In-containing III-nitride layer an In-containing III-nitride In-containing III-nitride layer, or other epitaxial layer.

For example, a first slip region can overlie a template, one or more epitaxial layers can overly the slip region and the template, and a second slip region can overlie the one or more epitaxial layers and can partially cover and adjoin the uppermost epitaxial layer.

A semiconductor structure can comprise, for example, a III-nitride template, a first slip region adjoining the III-nitride template surface, a first relaxed In-containing III-nitride layer adjoining the first slip region and a portion of the III-nitride template surface, optional one or more epitaxial layers overlying the first relaxed In-containing III-nitride layer, a second slip region adjoining the first relaxed In-containing III-nitride layer surface or uppermost epitaxial layer, and a second relaxed In-containing nitride layer adjoining the second slip region and a portion of the first relaxed In-containing III-nitride layer or uppermost epitaxial layer not covered by the second slip region.

A semiconductor structure can comprise, for example, a first III-nitride epitaxial layer, a first slip region adjoining the first III-nitride epitaxial layer surface, a first relaxed In-containing nitride layer adjoining the first slip region and a portion of the III-nitride epitaxial layer surface not covered by the first slip region, one or more first III-nitride epitaxial layers overlying the first relaxed In-containing III-nitride layer, a second slip region adjoining the uppermost of the one or more first III-nitride epaxial layers, a second relaxed In-containing III-nitride layer adjoining the second slip region and a portion of the uppermost of the one or more III-nitride epitaxial layers.

The semiconductor structure can further comprise, for example, a substrate underlying the first III-nitride epitaxial layer and/or one or more epitaxial layers overlying the second relaxed In-containing III-nitride layer.

Each of the first relaxed In-containing III-nitride layer and the second relaxed In-containing III-nitride layer can have a thickness greater than 100 nm and/or the surface can be substantially free of pits.

Each of the first relaxed In-containing III-nitride layer and the second relaxed In-containing III-nitride layer can have the same or different InN mole fraction.

Each of the first relaxed In-containing III-nitride layer and the second relaxed In-containing III-nitride layer can have a surface with the same or different in-plane a-lattice parameter.

Each of the one or more first epitaxial layers and the second one or more epitaxial layers can independently comprise an active region.

Each active region can comprise the same InN mole fraction or a different InN mole fraction.

Each active region can be configured to emit radiation within a different wavelength range.

Figure 27A:
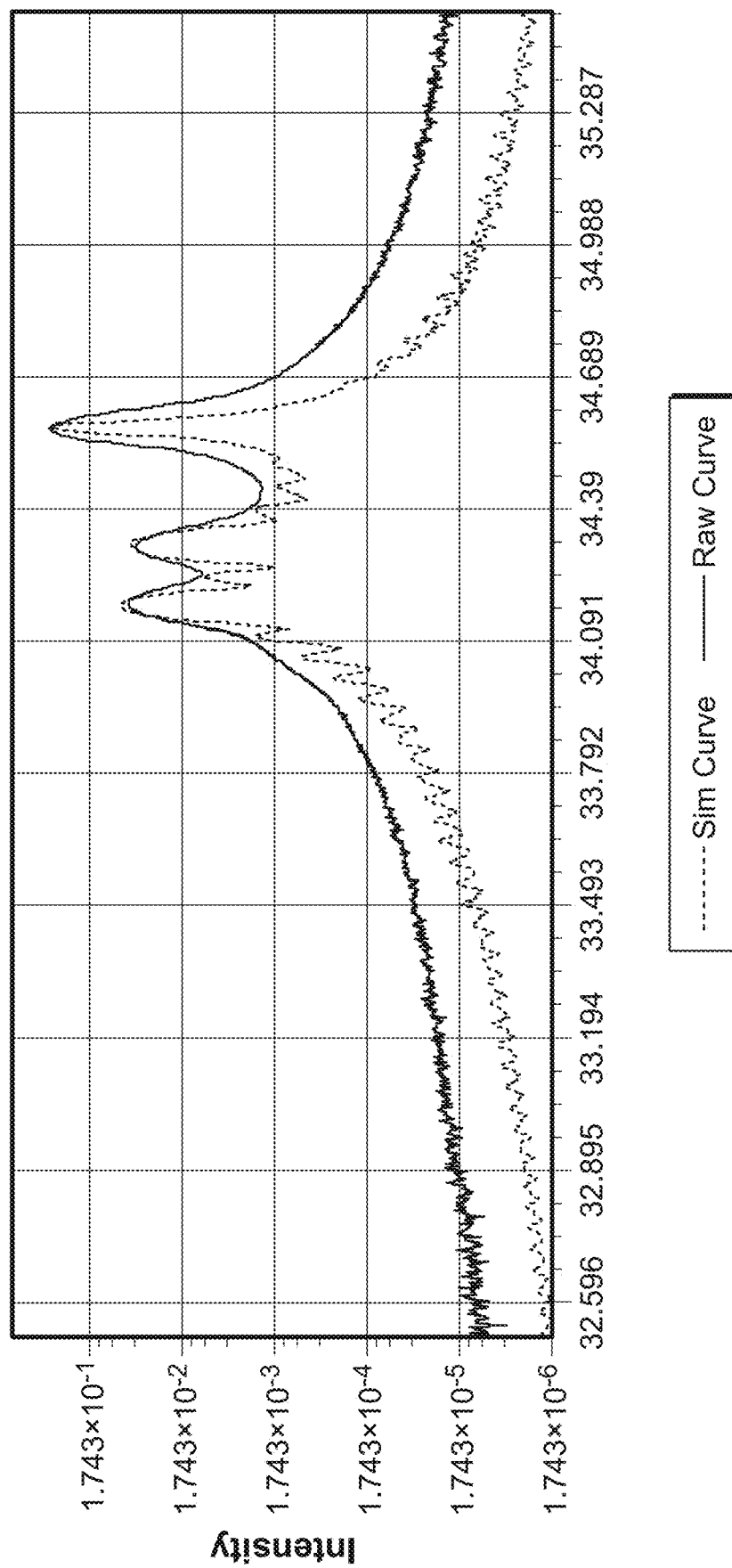
FIGS. 27A-27C show a semiconductor structure having a GaN template, and first slip region, a first relaxed InGaN layer having a 7.5% InN mole fraction, a second slip region, and a second relaxed InGaN layer having a 11.5% InN mole fraction. XRD RSM measurements of the monolithic structure shown in FIG. 27B, a ω-2θ XRD measurement of the structure is shown in FIG. 27A (solid line) compared to a simulated ω-2θ XRD scan (dotted line). The monolithic stack layout is shown in FIG. 27C.
Figure 27B:
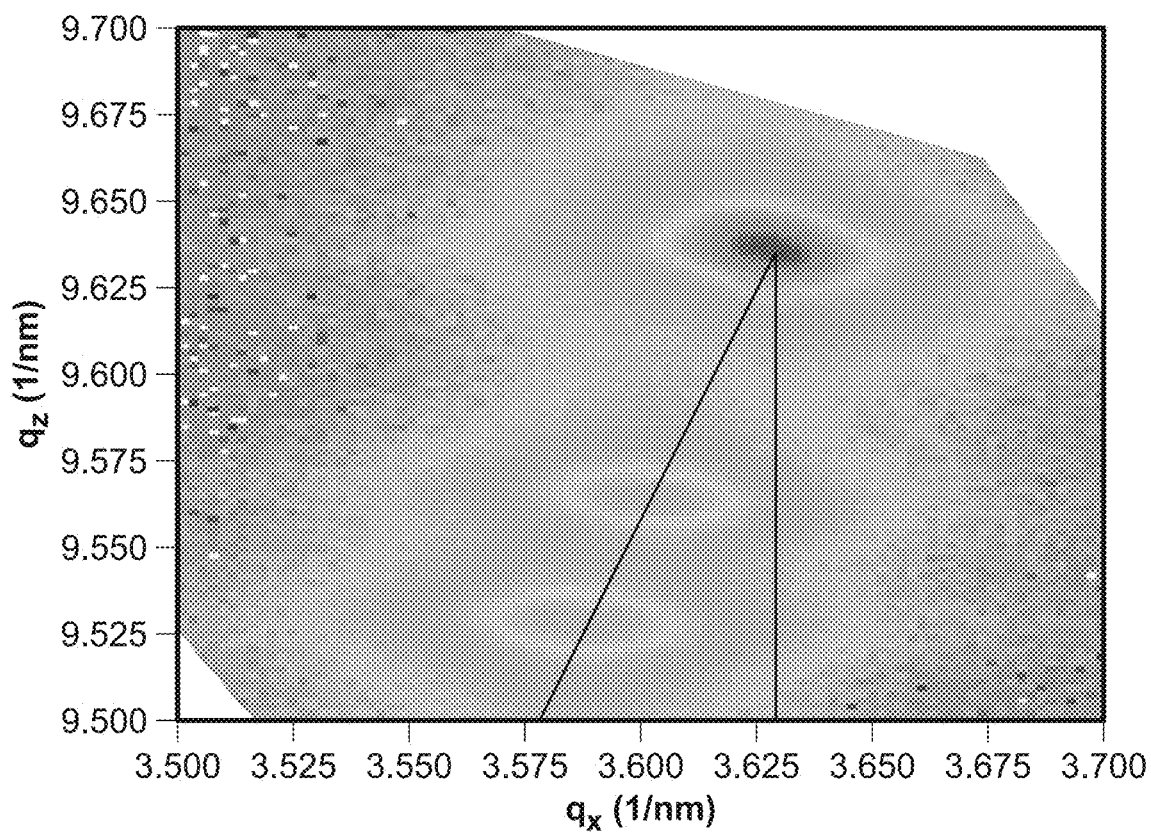
Figure 27C:
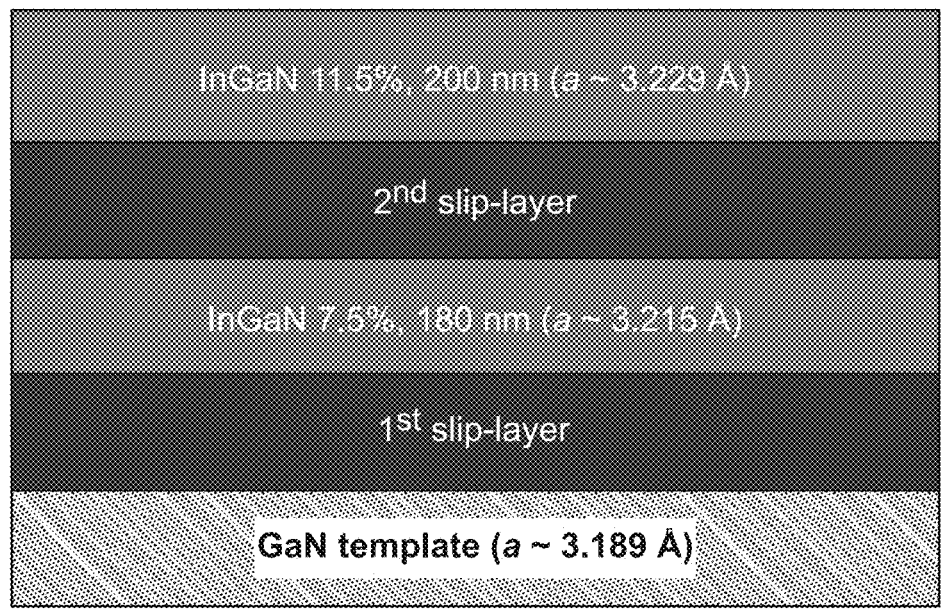

An example of a semiconductor structure is shown in FIG. 27C. As shown in FIG. 27C, a first slip region overlies a GaN template having an in-plane a-lattice parameter of about 3.186 Å grown on a planar GaN template with a slip region. A 180 nm-thick first relaxed InGaN layer having a 7.5% InN mole fraction and a characteristic in-plane a-lattice parameter of 3.215 Å overlies the first slip region. A second slip region overlies the planar surface of the first relaxed InGaN layer, and a second 200 nm-thick relaxed InGaN layer having an 11.5% InN mole fraction and a characteristic in-plane a-lattice parameter of 3.229 Å is grown. The semiconductor structure represents a fully planar, monolithic element, with thick InGaN layers having different in-plane a-lattice parameters, and both dilated with respect to the GaN template in-plane a-lattice parameter.

Although the first and second slip regions are shown as continuous layers in FIG. 27C, it will be understood that the first and second slip regions are non-continuous decorated areas partially covering the surface of the underlying material. Also, the layers shown in FIG. 27C are not drawn to scale. FIG. 27B shows an XRD RSM of a structure containing two relaxed InGaN layers of different compositions, grown in sequence with an intermediate (second) slip layer between them. The starting surface is GaN (0001). The first region is about 7.5% InGaN with a thickness of about 180 nm, grown on the GaN with a first slip-region in between. The second layer is about 11.5% InGaN with a thickness of about 200 nm, grown on the first region with the second slip-layer in between. XRD analysis gives the a-lattice parameters for the two layers as 3.215 Å, and 3.229 Å, respectively. The RSM shows two distinct Bragg peaks for the InGaN layers, shifted from the GaN pseudomorphic line, indicating that each layer has its own unique relaxed lattice constant. This evidence confirms that the invention enables the engineering of vertically stacked, compositionally distinct, relaxed InGaN layers: an unprecedented capability in III-nitride epitaxy.

FIG. 27A shows a $\omega$-$2\theta$ XRD scan of the semiconductor structure shown in FIG. 27C. The $\omega$-$2\theta$ XRD scan shows diffraction peaks associated with each two relaxed InGaN layers and the GaN template.

Figures 28A, 28B:
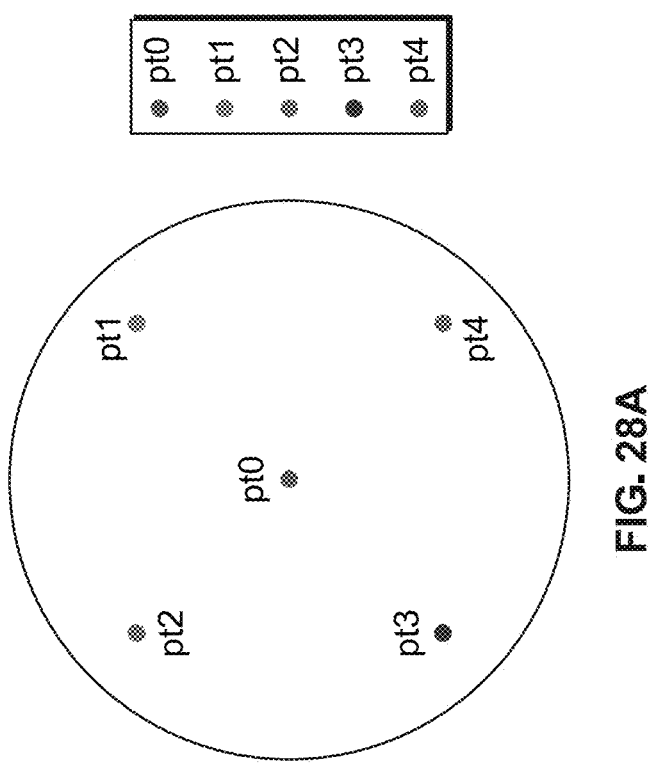
FIG. 28A shows locations on a 50 mm-diameter relaxed InGaN layer having a nominal 9% InN mole fraction and grown under MR-MOCVD conditions on a GaN layer with an intervening slip region.
FIG. 28B shows the InN mole fraction of the relaxed InGaN layer at the various positions (pt0-pt5) of the wafer shown in FIG. 39A.

FIG. 28A shows locations on a 50 mm-diameter relaxed InGaN layer having a nominal 9% InN mole fraction and grown under MR-MOCVD conditions on a GaN layer with an intervening slip region.

FIG. 28B shows the InN mole fraction of the relaxed InGaN layer at the various positions (pt0-pt5) of the wafer shown in FIG. 28A, as determined by XRD fitting.

Figure 28D:
FIG. 28C-28E show XRD RSM images at three locations (pt0, pt1, pt3) of a 50 mm-diameter wafer with a thick relaxed InGaN layer.
Figure 28D:
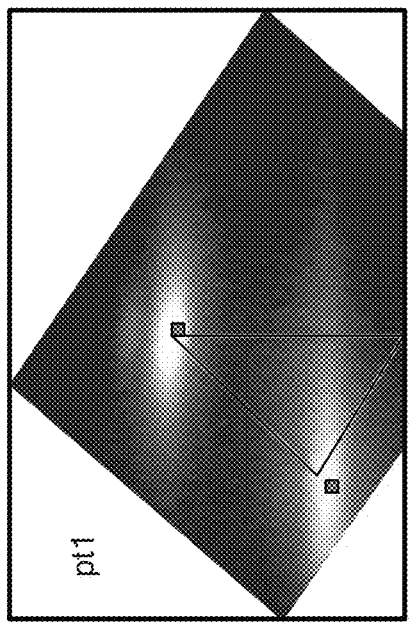
Figure 28C:
Figure 28C:
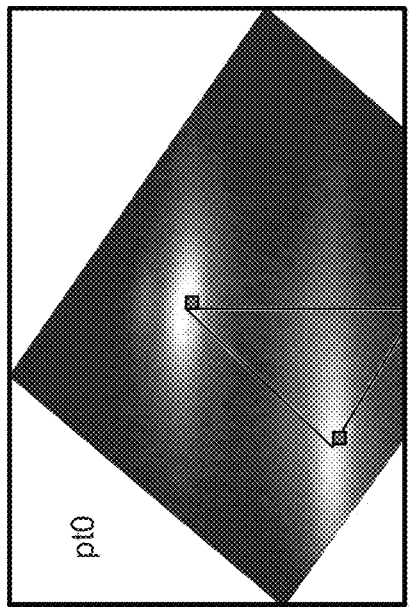
Figure 28E:
Figure 28E:
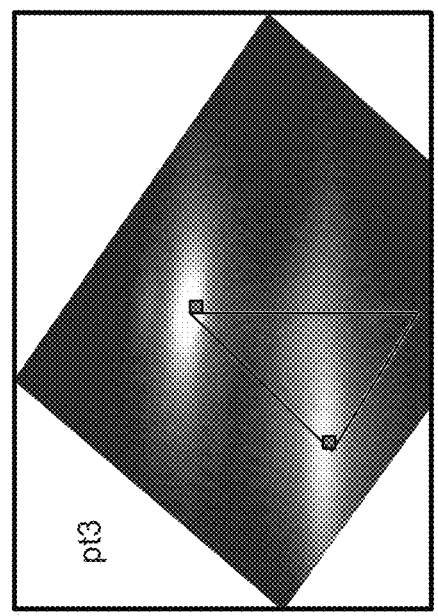

FIG. 28C-28E show XRD RSM images at three locations (pt0, pt1, pt3) on a 50 mm-diameter wafer with a thick relaxed InGaN layer.

FIG. 28F-29H show $\omega$-$2\theta$ XRD scans at the three locations (pt0, pt1, pt3) on the 50 mm-diameter wafer with a thick relaxed InGaN layer having a nominal 9% InN mole fraction and grown under MR-MOCVD conditions on a GaN layer with an intervening slip region.

In summary the results shown in FIGS. 28A-28H demonstrate wafer-scale uniformity across a 50 mm diameter substrate, which is fully extendable to larger area substrates and templates. XRD data were collected at five locations including the center and around the edge. InN content across these points ranged from 8.6% to 9.9%, with all regions showing approximately 100% relaxation as determined by XRD RSM. These results validate the uniform planar growth of thick Native InGaN® layers across the usable substrate area, facilitated by metal-rich growth conditions and the slip layer. The film thickness (>50 nm) also provides strong XRD signal quality.

Figure 13:
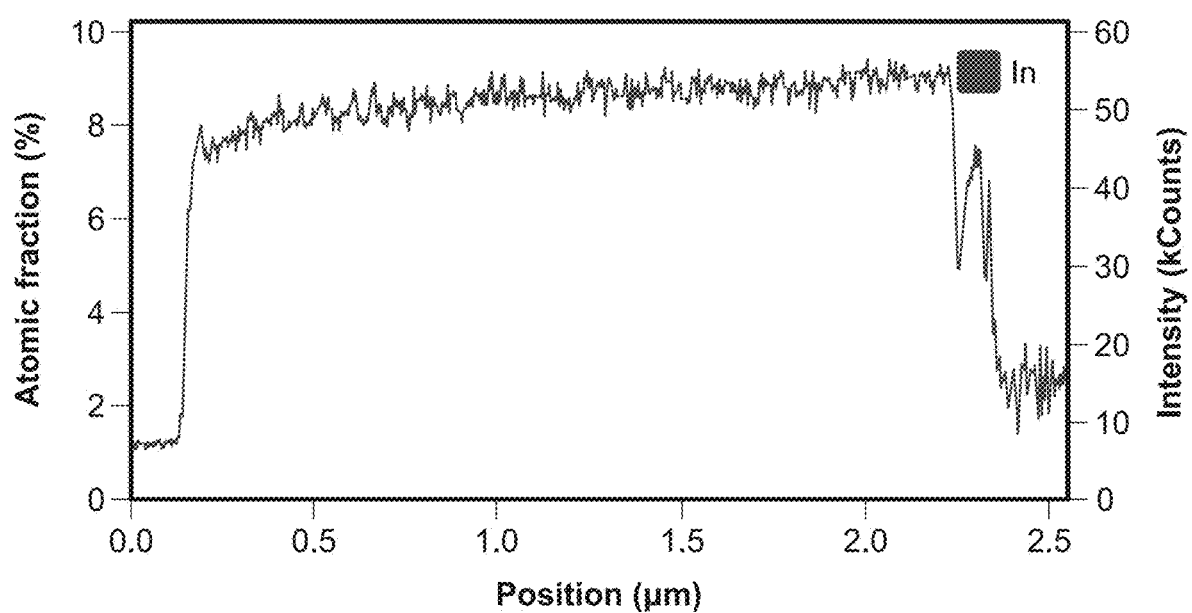
FIG. 13 shows a 2DEDX elemental line scan of the In content across a >2 μm thick Native InGaN® film grown on GaN with a slip region.
Figure 14A:
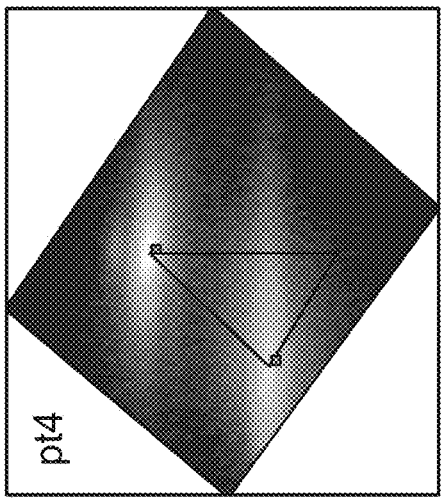
FIGS. 14A-14F show XRD RSM images at five regions of a 50 mm-diameter wafer with an about 2 μm-thick InGaN layer (9% InN mole fraction) grown on a GaN/sapphire template as described in Example 4 using MR MOCVD.
Figure 14B:
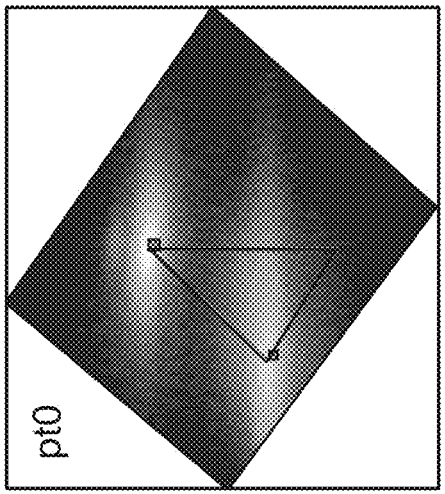
Figure 14C:
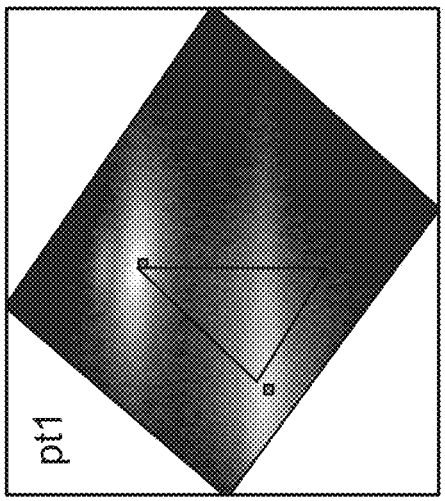
Figure 14D:
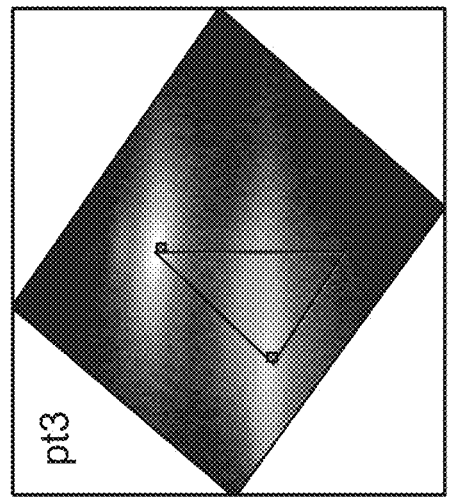
Figure 14E:
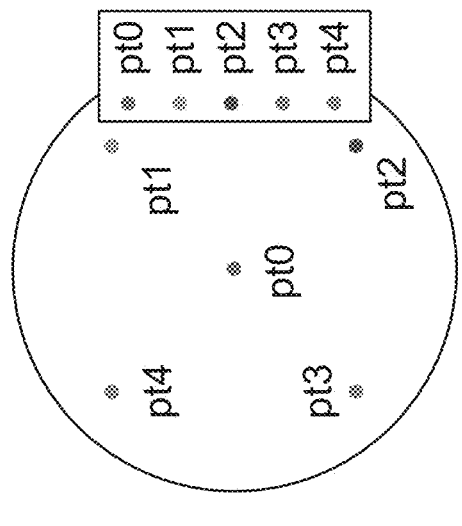
Figure 14F:
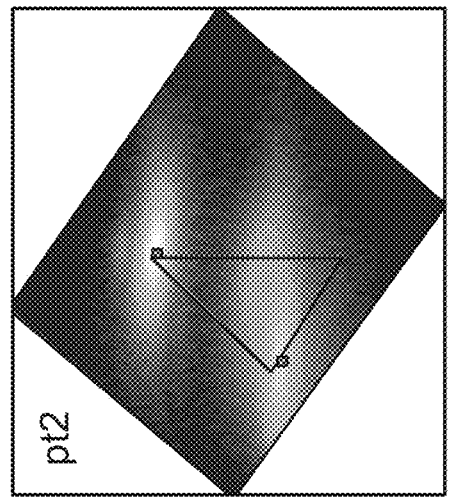
Figure 15C:
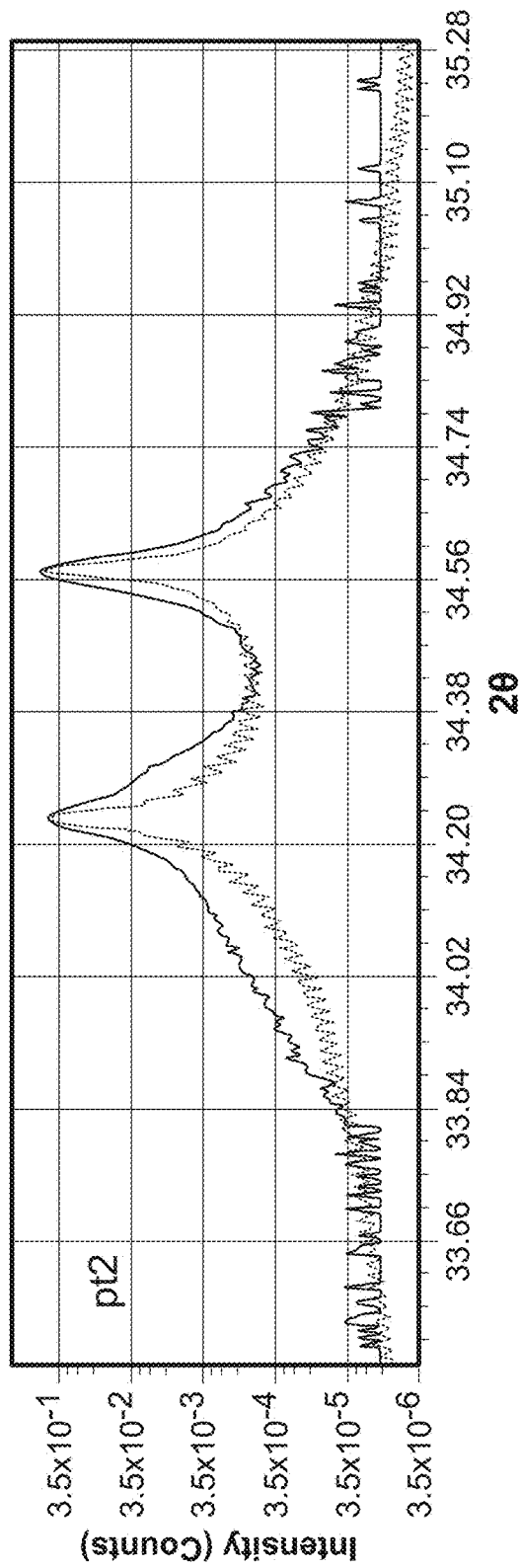
FIGS. 15A-15D show $\omega$-$2\theta$ XRD scans at the five regions of the 50 mm-diameter wafer of an MR InGaN layer described in FIG. 15E having an InN mole fraction of about 8% grown on a GaN/sapphire template, compared to a simulated $2\theta$-$\omega$ XRD scan (dotted curve).
Figure 15D:
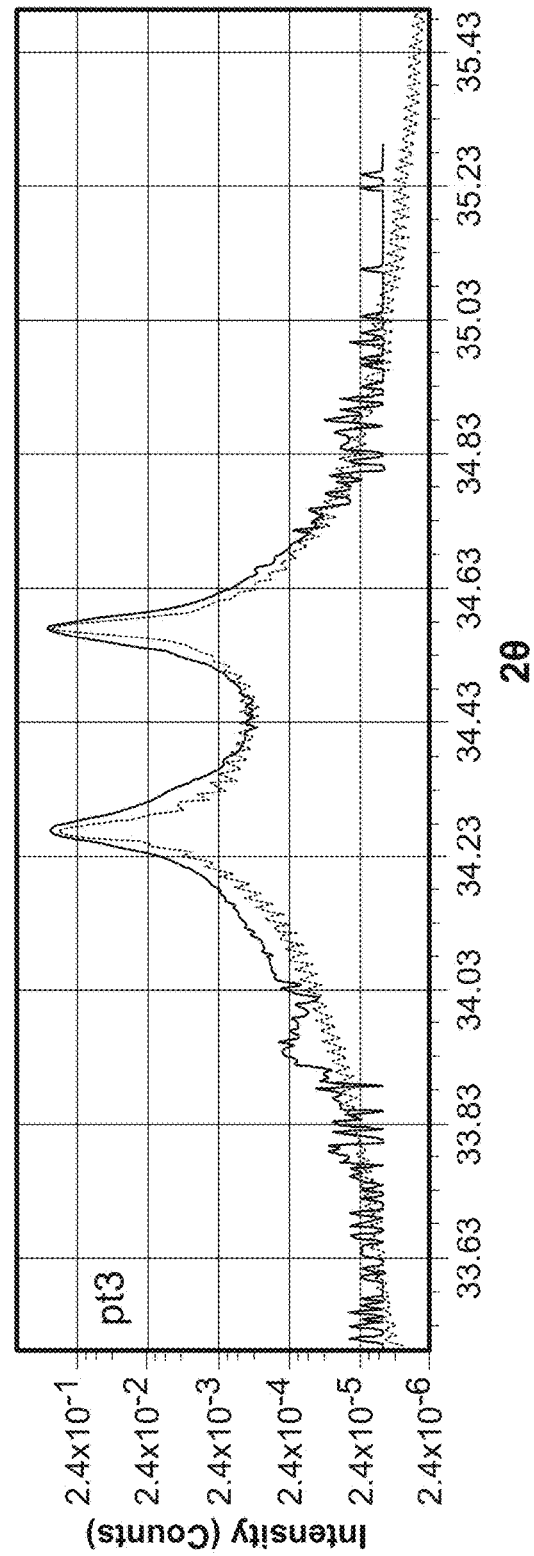
Figure 15E:
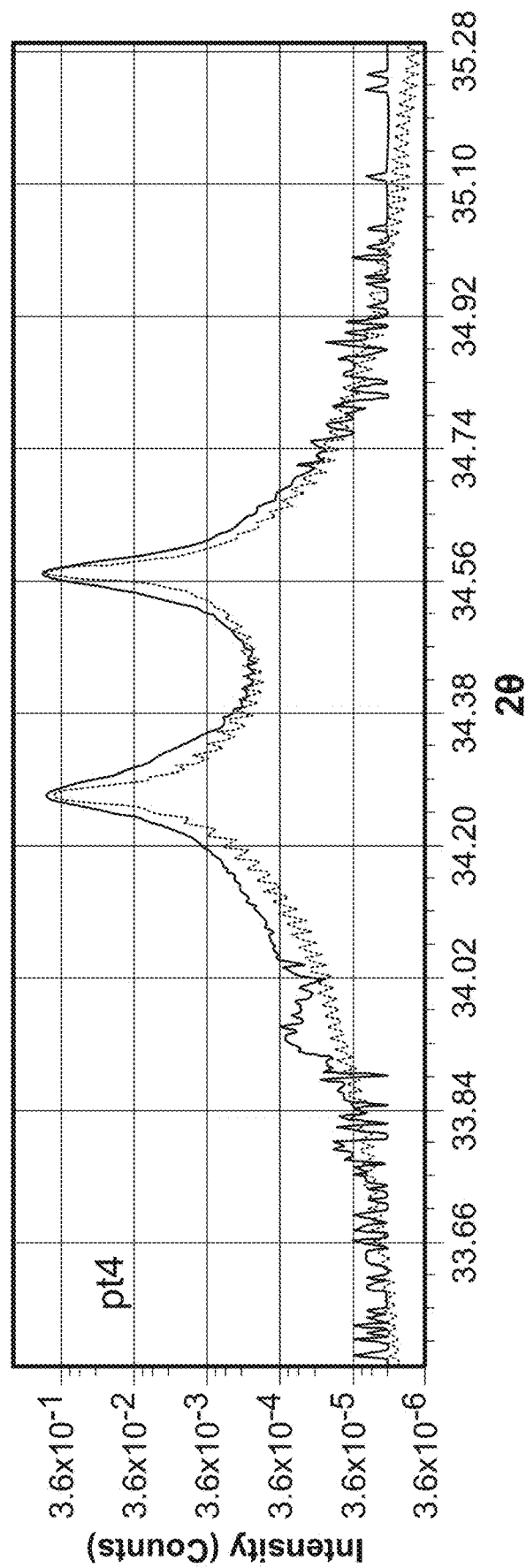
Figure 29:
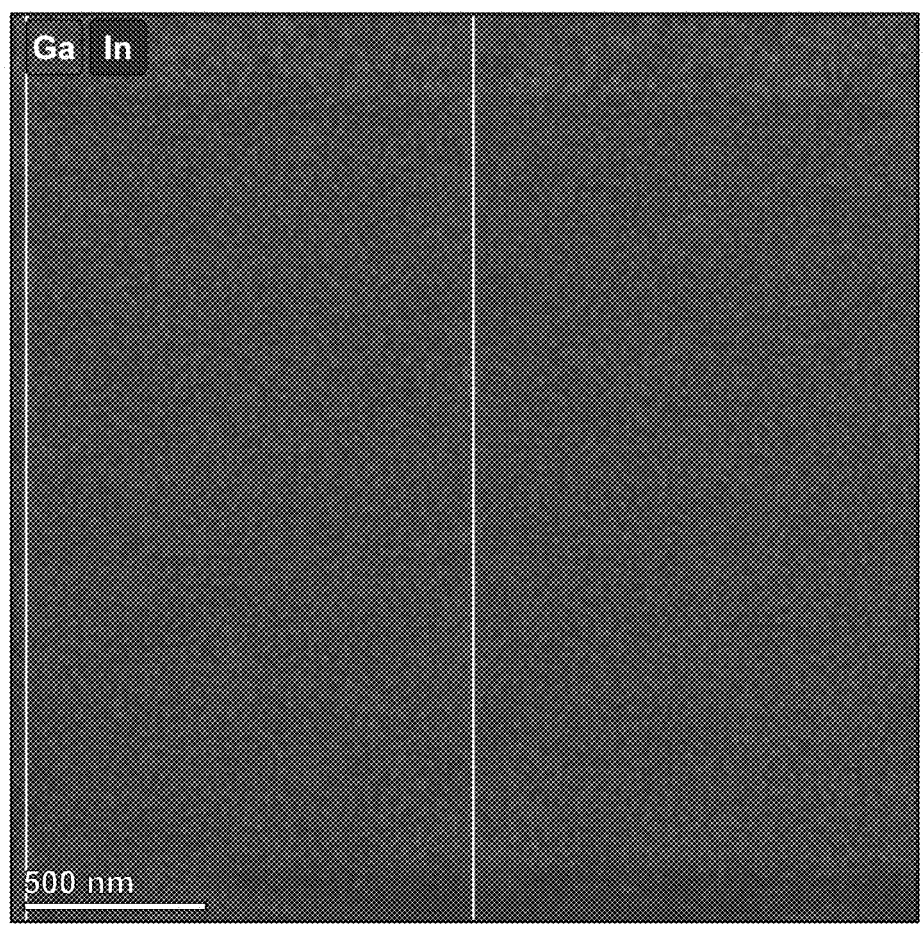
FIG. 29 shows a 2-dimensional EDX elemental map (left) across a greater than 2 μm thick Native InGaN® layer grown on GaN with an intervening slip layer. The corresponding line scan is shown in FIG. 13.

FIG. 29 shows a 2D EDX elemental map (left) across a greater than 2 μm-thick Native InGaN® film grown on GaN with a slip region. The corresponding line scan of the In content is shown in FIG. 13. The EDX map shows uniform distribution of indium and gallium, confirming the formation of a homogeneous random alloy. The line scan shown in FIG. 13 reveals a relatively stable InN mole fraction of about 8-9% throughout the main body of the relaxed InGaN layer. Additional features in the upper portion of the scan are attributed to a test structure deposited on top. These results demonstrate compositional uniformity and absence of In clustering and phase separation in thick Native InGaN® films.

Figure 30:
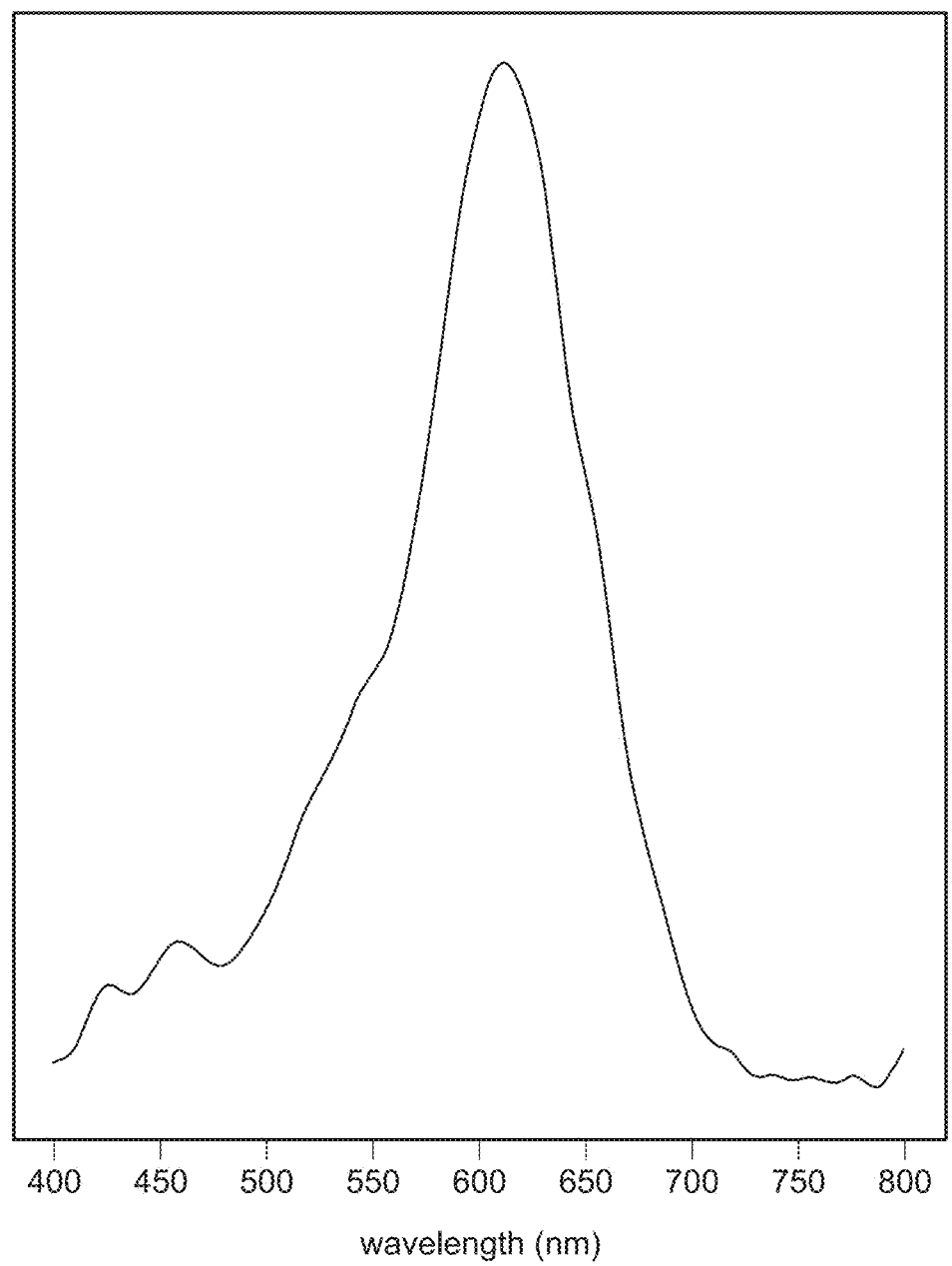
FIG. 30 shows a photoluminescence spectrum from a single quantum well (SQW) structure grown on a Native InGaN® template having an InN mole fraction of 8% with an overlying AlGaN layer having an AlN mole fraction of about 13%.

FIG. 30 shows a photoluminescence spectrum from a single quantum well (SQW) structure grown on an 8% Native InGaN® template with a ~13% AlGaN cap layer. The PL is excited at 325 nm and emission is observed centered at 612 nm with a full width at half maximum (FWHM) of approximately 60 nm. For comparison, a similar structure grown on GaN without the AlGaN cap would emit in the green around 530 nm. Defect-related luminescence from the underlying Native InGaN® was digitally subtracted to isolate the SQW contribution. This result demonstrates that the invention enables orange-red emission from SQW structures using relaxed InGaN templates and indicates much longer wavelengths are available using the combination of higher InN mole fraction Native InGaN® base layers along with advanced MQW stack design.

Figure 31:
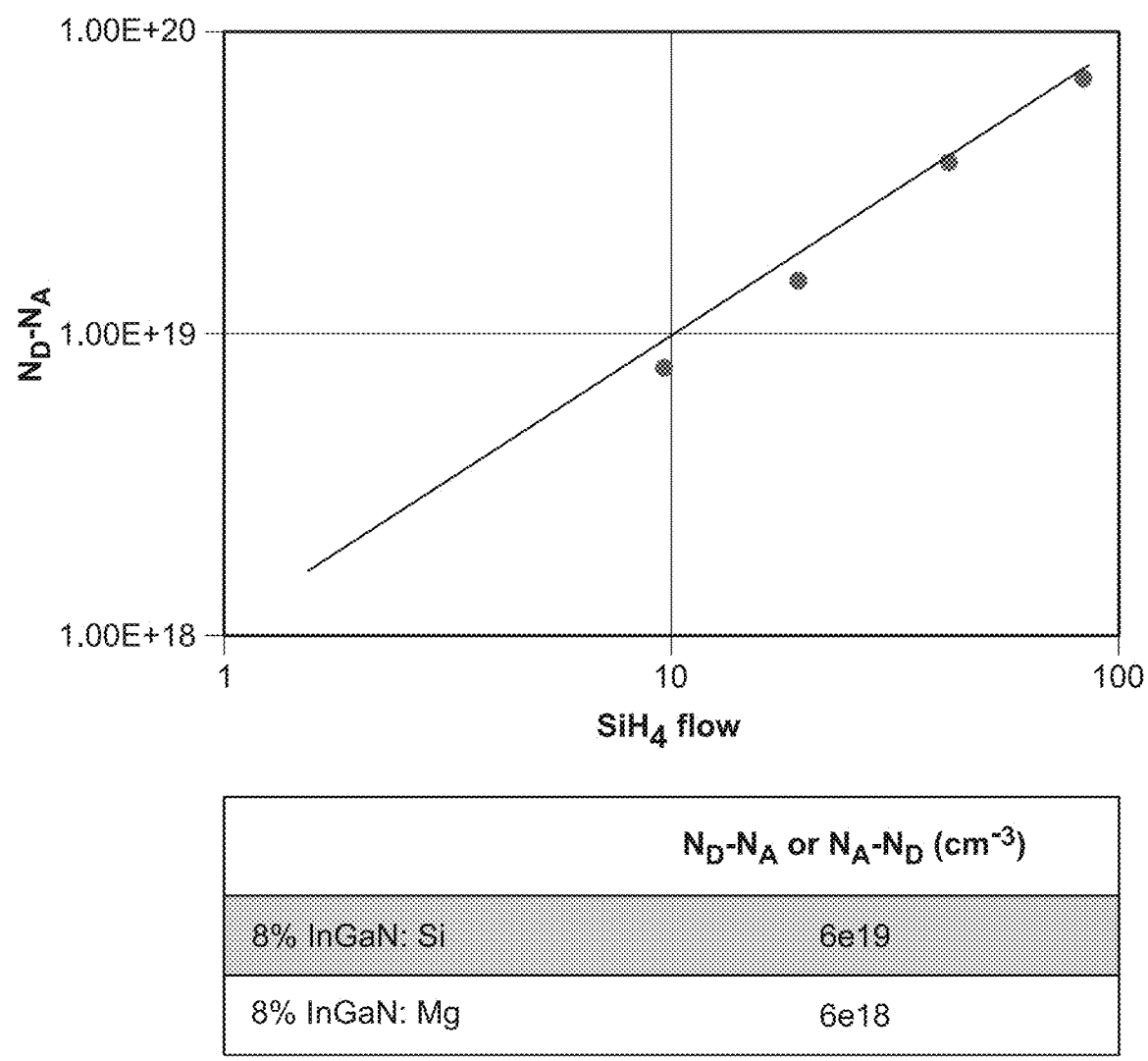
FIG. 31 shows an example of electrical doping characteristics of n-type and p-type Native InGaN® grown under metal-rich conditions.

FIG. 31 summarizes electrical doping characteristics of n-type and p-type Native InGaN grown under metal-rich conditions. For n-type doping, silane is used, and the net donor concentration vs silane flow from C-V measurements is shown in the chart at the top. In one embodiment, Si-doped 8% Native InGaN films showed net donor concentration of approximately $6 \times 10^{19}$ cm$^{-2}$, despite elevated carbon and oxygen levels associated with the lower growth temperatures (compensation estimated at about 5E18 cm 3). For p-type doping, the use of triethylgallium (TEG) instead of trimethylgallium (TMG) significantly reduced C and O contamination. Mg-doped InGaN films achieved net acceptor concentrations on the order of $6 \times 10^{18}$ cm-2 (C-V data not shown). These results confirm that both conduction types can be achieved in thick, relaxed metal-rich InGaN grown using the techniques disclosed herein, paving the way for optoelectronic devices such as LEDs, EELDs, VCSELs, etc.

A slip region can be a patterned slip region. For example, multiple slip regions can be deposited in areas defined by a mask. Each of the multiple slip regions can comprise the same or different dielectric material or a different dielectric material.

Methods provided by the present disclosure include methods of depositing a slip region on the surface of semiconductor layer such as a III-nitride layer.

The III-nitride layer can comprise any suitable III-nitride material including GaN, AlN, $In_xGa_{1-x}N$, and $In_xAl_yGa_{1-x-y}N$, where $0<x<1$, and $0\leq y\leq 1$, each of which can be undoped or doped.

A surface of the III-nitride material can be planar and can have a (0001) orientation.

A slip region can be deposited on the III-nitride layer surface in situ in a MOCVD reactor.

The slip region can be deposited, for example, using the following MOCVD reactor conditions: a temperature from 650° C. to 850° C., a $SiH_4$ flow rate from 60 sccm to 120 sccm, a $NH_3$ flow rate from 100 sccm to 300 sccm, $H_2$ as the carrier gas, a total gas flow rate of from 6,000 sccm to 10,000 sccm, a reactor pressure of from 50 mbar to 100 mbar, and a growth time from 1 minute to 10 minutes.

A slip region can be deposited by flowing silane and ammonia with no trimethylgallium into the MOCVD reaction chamber.

A method can comprise, for example, forming a slip region on a surface of a III-nitride layer; and growing a relaxed In-containing III-nitride layer such a $In_xAl_yGa_{1-x-y}N$ layer or a $In_xGa_{1-x}N$ layer, on the slip region and on the portions of the III-nitride layer not covered by the slip region. The surface of the III-nitride layer can be characterized by a first in-plane a-lattice parameter and the surface of the In-containing III-nitride layer can be characterized by a second in-plane a-lattice parameter, where the first and second in-plane a-lattice parameters are different. The relaxed In-containing III-nitride layer can have a different InN mole fraction than that of the III-nitride layer.

The slip region can be formed with or without lithographic patterning.

The method can comprise, before depositing the slip region, providing a III-nitride layer.

Growing a relaxed In-containing III-nitride layer can comprise growing the In-containing III-nitride layer to a thickness greater than 100 nm, such as from 0.1 μm to 4 μm, or from 0.1 μm to 10 μm.

The method can comprise growing an additional III-nitride layer over the relaxed In-containing III-nitride layer, wherein the additional III-nitride layer has a different InN mole fraction than that of the relaxed In-containing III-nitride layer. The additional III-nitride layer can have a higher compressive strain than the relaxed In-containing III-nitride layer. The additional III-nitride layer is configured to emit electromagnetic radiation at a different wavelength than and underlying active region.

A semiconductor structure provided by the present disclosure can be used in a semiconductor device such as an optoelectronic device.

Example of suitable optoelectronic devices include light-emitting diodes (LED), edge-emitting laser diodes (EELD), vertical-cavity surface-emitting lasers (VCSEL), and resonant-cavity LEDs (RCLED).

An optoelectronic device can be configured to emit electromagnetic wavelength range or can be configured to emit electromagnetic radiation in multiple wavelength ranges.

A multiwavelength optoelectronic device can be a single-pixel optoelectronic device in which two or more active regions are vertically stacked, and where each of the active regions is configured to emit electromagnetic radiation within a different wavelength range. The different active regions can be characterized, for example, by a different InN mole fraction and an in-plane a-lattice parameter. Each of the different active regions can overlie a different relaxed In-containing III-nitride material wherein each of the different relaxed In-containing III-nitride material has a different InN mole fraction and a different in-plane a-lattice parameter.

A multiwavelength optoelectronic device can be a multi-pixel optoelectronic device in which optoelectronic devices configured to emit within a different wavelength range are situated in a side-by-side configuration.

A multiwavelength optoelectronic device can be an integrated monolithic multiwavelength optoelectronic device in which optoelectronic devices configured to emit within a single wavelength range are fabricated on a single substrate and comprises one or more common epitaxial layers.

A multiwavelength optoelectronic device can comprise two or more discrete stripes or pixels, each comprising a relaxed In-containing III-nitride layer and an active region, wherein the stripes or pixels are configured to emit electromagnetic radiation at different wavelengths.

A monolithic optoelectronic wafer can comprise multiple light-emitting devices selected, for example, from LEDs, VCSELs, RCLEDs, or EELDs, where each of the devices independently comprises a relaxed In-containing III-nitride layer. Each of the light emitting devices can have the same or different InN mole fraction and in-plane a-lattice parameter.

An optoelectronic device comprising a relaxed In-containing III-nitride layer can be used, for example, in display, augmented reality, virtual reality, head-up display, projection, television, monitor, or automotive lighting systems and application applications.

An optoelectronic device provided by the present disclosure can comprise drive circuitry for independent addressable control of each active region or pixel.

An optoelectronic device provided by the present disclosure can comprise CMOS-compatible drive circuitry.

Semiconductor devices provided by the present disclosure can comprise a slip region between a III-nitride layer and a relaxed In-containing III-nitride layer.

A semiconductor device provided by the present disclosure can comprise a III-nitride layer, a slip region overlying the III-nitride layer, and a relaxed In-containing III-nitride layer overlying the slip region and portions of the III-nitride layer not covered by the slip region.

A semiconductor device provided by the present disclosure can comprise one or more epitaxial layers overlying the relaxed In-containing III-nitride layer such as a relaxed InGaN layer. One or more of the overlying epitaxial layers can be an In-containing III-nitride layer such as an InGaN layer. Each of the overlying epitaxial layers can be lattice matched to the relaxed In-containing III-nitride layer.

A semiconductor device provided by the present disclosure can comprise one or more relaxed In-containing III-nitride layers where each of the one or more relaxed In-containing III-nitride layers overlies a slip region and a portion of a III-nitride layer that is not covered by the slip region. Each of the one or more relaxed In-containing III-nitride layers can have the same or different thickness and/or the same or different InN mole fraction.

One or more epitaxial layers can independently overlie each of the relaxed In-containing III-nitride layers.

In semiconductor structures according to the present disclosure a slip region provided by the present disclosure can be disposed between any two epitaxial layer. Accordingly, a device provided by the present disclosure can comprise a slip region between two epitaxial layers.

MR MOCVD growth can be exploited to realize the deposition of variable composition III-V compound semiconductor alloys with high quality on a single growth substrate. Controlled crystal lattice engineering refers to the ability to fabricate high quality relaxed layers of III-V materials using a patterned growth layer that allows for the incorporation of different InN content determined by the configuration of the patterned growth layer to provide optoelectronic devices configured to emit radiation within a desired wavelength range.

In one method of fabricating a multi-color optoelectronic device, groups of optoelectronic elements, where each optoelectronic element within the group is characterized by a similar in-plane a-lattice parameter and a similar InN content, can be serially fabricated on the same growth substrate such as a GaN layer For example, a first group of optoelectronic elements can be fabricated on a first portion of a growth substrate, a second group of optoelectronic elements can be fabricated on a second portion of the growth substrate, and a third group of optoelectronic elements can be fabricated on a third portion of the growth substrate. Each of the first group, the second group, and third group of optoelectronic elements can be characterized by a different in-plane a-lattice parameter and a different InN content and can be configured to emit radiation within a different wavelength range.

A semiconductor structure provided by the present disclosure can comprise: a III-nitride base layer: a plurality of dielectric portions disposed non-uniformly on or proximate to a surface of the III-nitride base layer, the dielectric portions being formed without lithographic patterning; and a relaxed $In_xAl_yGa_{1-x-y}N$ layer grown over the base layer and dielectric portions, wherein the relaxed $In_xAl_yGa_{1-x-y}N$ layer planarizes topographical features of the base layer and provides a substantially smooth growth surface for subsequent epitaxy.

A method provided by the present disclosure can comprise: providing a III-nitride base layer; forming dielectric portions on or near a surface of the base layer without lithographic patterning; epitaxially growing a first relaxed $In_xAl_yGa_{1-x-y}N$ layer over the base layer and dielectric portions; and epitaxially growing a second III-nitride layer over the first layer, the second III-nitride layer having a higher indium content and compressive strain relative to the first layer.

A light-emitting structure provided by the present disclosure can comprise: a first relaxed $In_xAl_yGa_{1-x-y}N$ layer disposed over a III-nitride layer: a first active region disposed over the first relaxed layer: a second relaxed $In_xAl_yGa_{1-x-y}N$ layer disposed over the first active region; and a second active region disposed over the second relaxed layer, wherein the first and second relaxed layers have different in-plane lattice constants and enable emission at different wavelengths.

A III-nitride semiconductor structure provided by the present disclosure can comprise a relaxed $In_xAl_yGa_{1-x-y}N$ layer disposed over a III-nitride base layer, the improvement comprising: a plurality of non-lithographically defined dielectric portions positioned on or proximate to the surface of the base layer, wherein the relaxed layer is grown over the dielectric portions and exhibits an in-plane lattice constant different from that of the base layer.

Use of a III-nitride semiconductor structure provided by the present disclosure can comprise a relaxed $In_xAl_yGa_{1-x-y}N$ layer grown over a base layer with interspersed, non-lithographically defined dielectric portions, for enabling wavelength-stable emission from a light-emitting device selected from a LED, EELD, VCSEL, or RCLED.

A semiconductor wafer provided by the present disclosure can comprise a relaxed In-containing III-nitride layer provided by the present disclosure, a semiconductor structure provided by the present disclosure and/or a device such as optoelectronic device provided by the present disclosure.

A semiconductor wafer can comprise any suitable material and/or dimensions used in semiconductor manufacturing.

A semiconductor wafer can comprise a wafer substrate and epitaxial layers that include a relaxed In-containing III-nitride layer at any stage in a semiconductor manufacturing process.

A semiconductor wafer provided by the present disclosure can at least comprise a semiconductor layer such as a III-nitride layer on which a slip region according to the present disclosure is deposited or grown.

A semiconductor wafer provided by the present disclosure can comprise a semiconductor structure according to the present disclosure.

A semiconductor wafer provided by the present disclosure can comprise a relaxed In-containing III-nitride layer overlying a III-nitride layer according to the present disclosure.

A semiconductor wafer provided by the present disclosure can comprise a semiconductor layer such as, for example, a relaxed In-containing III-nitride layer, fabricated using metal-rich MOCVD conditions.

A semiconductor wafer provided by the present disclosure can comprise a device such as an optoelectronic device according to the present disclosure.

A semiconductor layer provided by the present disclosure can comprise a semiconductor layer fabricated using metal-rich MOCVD according to the present disclosure.

A semiconductor layer grown using metal-rich MOCVD growth conditions includes any semiconductor layer, such as, for example a III-nitride layer or an In-containing III-nitride layer grown using metal-rich MOCVD growth conditions.

A semiconductor layer provided by the present disclosure can comprise a semiconductor layer decorated with a slip region provided by the present disclosure.

A semiconductor structure provided by the present disclosure can comprise a first semiconductor layer, an overlying second semiconductor layer, and a slip region provided by the present disclosure disposed between the first and second semiconductor layers. As disclosed herein, the slip region can cover a portion of the first semiconductor layer, and the overlying second semiconductor layer can adjoin the slip region and the first semiconductor layer in areas not covered by the slip region.

A semiconductor device provided by the present disclosure can comprise a semiconductor layer comprising a slip region or a semiconductor structure comprising a slip region provided by the present disclosure.

Methods provided by the present disclosure comprise fabricating a semiconductor layer using metal-rich MOCVD growth conditions.

Growing a semiconductor layer using metal-rich MOCVD growth conditions can comprise growing the semiconductor layer using the MOCVD reactor conditions listed in Table 5.

TABLE 5

Examples of Metal-Rich MOCVD Growth Conditions

| Reactor Parameter | Parameter Value |
| --- | --- |
| Reactor Temperature | 740° C. to 800° C. |
| TMI Flow Rate | 250 sccm to 500 sccm |
| TMG Flow Rate | 25 sccm to 75 sccm |
| $NH_3$ Flow Rate | 200 sccm to 400 sccm |
| Total Gas Flow Rate | 6,000 sccm to 10,000 sccm |
| Chamber Pressure | 300 mbar to 500 mbar |
| V/III Ratio | 50 to 150 |

Growing a semiconductor layer under metal-rich MOCVD growth conditions can comprise growing a layer comprising a III-nitride material or an In-containing III-nitride material.

Methods provided by the present disclosure include methods of deposition a slip region provided by the present disclosure. Method of depositing a slip region using in situ MOCVD growth conditions provided by the present disclosure are summarized in Table 6.

TABLE 6

Examples of in-situ MOCVD Conditions for Depositing a Slip Region.

| Reactor Parameter | Parameter Value |
| --- | --- |
| Chamber Temperature | 650° C. to 850° C. |
| $SiH_4$ Flow Rate | 60 sccm to 120 sccm |
| $NH_3$ Flow Rate | 100 sccm to 300 sccm |
| Carrier Gas | $H_2$ |
| Total Gas Flow Rate | 6,000 sccm to 10,000 sccm |
| Reactor Pressure | 50 mbar to 100 mbar |
| Growth Time | 1 minute to 10 minutes |

Methods of fabricated relaxed In-containing III-nitride layers, semiconductor structures, and devices provided by the present disclosure are compatible with wafer-scale growth processes and can be fabricated on substrates 150 mm or greater in diameter, including 200 mm or 300 mm silicon substrates, or engineered substrates, thereby enabling scalable device manufacturing.

Aspects

The invention is further defined by one or more of the following aspects.

Aspect 1. A bulk relaxed Wurtzite In-containing III-nitride layer comprising a first interface and a first interface region, wherein the first interface region is characterized by: a single-phase gallium-polar (0001) orientation: a Wurtzite In-containing III-nitride material comprising a first InN mole fraction, wherein the first InN mole fraction is greater than 0; and a substantially relaxed in-plane a-lattice parameter.

Aspect 2. The bulk relaxed layer of aspect 1, wherein the bulk relaxed In-containing III-nitride layer has a thickness greater than 100 nm.

Aspect 3. The bulk relaxed layer of any one of aspects 1 to 2, wherein the bulk relaxed layer is grown by metal-rich MOCVD.

Aspect 4. The bulk relaxed layer of any one of aspects 1 to 3, wherein in a 2θ XRD scan the intensity at an angular distance Δθ from the GaN peak and at an angular distance Δθ from an $In_xAl_yGa_{1-x-y}N$ peak is less than 1E3 less than the intensity of the GaN peak and the $In_xAl_yGa_{1-x-y}N$ peak, wherein 4θ is the angular distance between the peak of the GaN peak and the $In_xAl_yGa_{1-x-y}N$ peak.

Aspect 5. The bulk relaxed layer of any one of aspects 1 to 4, wherein the bulk relaxed In-containing III-nitride layer comprises a second interface and a second interface region, wherein, the second interface is opposite the first interface; and the second interface is planar.

Aspect 6. The bulk relaxed layer of aspect 5, wherein the second interface region is characterized by a single-phase gallium-polar (0001) orientation.

Aspect 7. The bulk relaxed layer of any one of aspects 5 to 6, wherein the second interface region is characterized by an InN mole fraction greater than 0.

Aspect 8. The bulk relaxed layer of any one of aspects 5 to 7, wherein the second interface region is characterized by a substantially relaxed in-plane a-lattice parameter.

Aspect 9. The bulk relaxed layer of any one of aspects 1 to 3, wherein the bulk relaxed In-containing III-nitride layer comprises a second interface and a second interface region, wherein the second interface is opposite the first interface; and the second interface is non-planar.

Aspect 10. The bulk relaxed layer of aspect 9, wherein the second interface region is not characterized by a single-phase gallium-polar (0001) orientation.

Aspect 11. The bulk relaxed layer of any one of aspects 9 to 10, wherein the second interface region is characterized by a single-phase gallium-polar (0001) orientation.

Aspect 12. The bulk relaxed layer of any one of aspects 9 to 11, wherein the second interface region is characterized by an In-containing III-nitride in-plane a-lattice parameter.

Aspect 13. The bulk relaxed layer of any one of aspects 9 to 12, wherein the second interface region comprises a plurality of impressions.

Aspect 14. The bulk relaxed layer of any one of aspects 1 to 12, wherein the plurality of impressions are disposed in a regular array.

Aspect 15. The bulk relaxed layer of aspect 14, wherein the plurality of impressions do not comprise a facet that is parallel to the first interface.

Aspect 16. The bulk relaxed layer of any one of aspects 14 to 15, wherein the impressions comprise facets that meet a single apex.

Aspect 17. The bulk relaxed layer of aspect 16, wherein the impressions comprise six triangular facets.

Aspect 18. The bulk relaxed layer of aspect 17, wherein the six triangular facets meet a single apex.

Aspect 19. The bulk relaxed layer of any one of aspects 14 to 18, wherein the impressions comprise a hexagonal base.

Aspect 20. The bulk relaxed layer of any one of aspects 5 to 19, wherein the second interface region is characterized by a second InN mole fraction, wherein the second InN mole fraction is greater than 0.

Aspect 21. The bulk relaxed layer of any one of aspects 1 to 20, wherein the first InN mole fraction is from 0.1% to 40%.

Aspect 22. The bulk relaxed layer of any one of aspects 1 to 20, wherein the first InN mole fraction is from 1% to 40%.

Aspect 23. The bulk relaxed layer of any one of aspects 1 to 20, wherein the first InN mole fraction is from 5% to 40%.

Aspect 24. The bulk relaxed layer of any one of aspects 1 to 20, wherein the first InN mole fraction is from 10% to 40%.

Aspect 25. The bulk relaxed layer of any one of aspects 1 to 20, wherein the thickness is greater than 300 nm.

Aspect 26. The bulk relaxed layer of any one of aspects 1 to 25, wherein the first interface region is characterized by a root-mean-square roughness less than 5 nm over a 5×5 µm² area; and the roughness is determined by atomic force microscopy.

Aspect 27. The bulk relaxed layer of any one of aspects 1 to 26, wherein the first interface region is characterized by a root-mean-square roughness less of than 1 nm over a 1×1 µm² area; and the roughness is determined by atomic force microscopy.

Aspect 28. The bulk relaxed layer of any one of aspects 1 to 27, wherein the first interface region is characterized by a pit density of less than 1E9 cm$^{-2}$, and the pit density is determined by electron microscopy, atomic force microscopy, or cathodoluminescence.

Aspect 29. The bulk relaxed layer of any one of aspects 1 to 28, wherein the first interface region is characterized by an average pit size of less than 10 nm in diameter; and the average pit size is determined by electron microscopy, atomic force microscopy, or cathodoluminescence.

Aspect 30. The bulk relaxed layer of any one of aspects 1 to 29, wherein the first interface region is characterized by a maximum pit size of less than 10 nm in diameter; and the maximum pit size is determined by electron microscopy, atomic force microscopy, or cathodoluminescence.

Aspect 31. The bulk relaxed layer of any one of aspects 1 to 30, wherein the first interface region is characterized by a threading dislocation density of less than 1E9 cm$^{-2}$; and the threading dislocation density is determined by electron microscopy, or cathodoluminescence.

Aspect 32. The bulk relaxed layer of any one of aspects 1 to 31, wherein the bulk relaxed In-containing III-nitride layer comprises $In_xAl_yGa_{1-x-y}N$, wherein $0<x<0.4$ and $0 \leq y<1$.

Aspect 33. The bulk relaxed layer of any one of aspects 1 to 32, wherein the bulk relaxed In-containing III-nitride layer comprises $In_xGa_{1-x}N$, wherein $0<x<0.4$.

Aspect 34. The bulk relaxed layer of any one of aspects 1 to 33, wherein the relaxed in-plane a-lattice parameter is within +0.1% that of a fully relaxed in-plane a-lattice parameter of the Wurtzite In-containing III-nitride alloy.

Aspect 35. The bulk relaxed layer of any one of aspects 1 to 34, wherein the relaxed in-plane a-lattice parameter is within 0.005 Å of a fully relaxed in-plane a-lattice parameter of the Wurtzite In-containing III-nitride alloy.

Aspect 36. The bulk relaxed layer of any one of aspects 1 to 35, wherein the bulk relaxed In-containing III-nitride layer is characterized by a 002 (symmetric) XRD full-width-at-half-maximum (FWHM) of less than 300 arcsec.

Aspect 37. The bulk relaxed layer of any one of aspects 1 to 36, wherein the bulk relaxed In-containing III-nitride layer is characterized by a 211 asymmetric XRD full-width-at-half-maximum (FWHM) of less than 1,800 arcsec.

Aspect 38. The bulk relaxed layer of any one of aspects 1 to 37, wherein the bulk relaxed layer is characterized by an edge dislocation density less than 1E10 cm$^{-2}$, and the edge dislocation density is determined by electron microscopy and/or cathodoluminescence.

Aspect 39. The bulk relaxed layer of any one of aspects 1 to 38, wherein the bulk relaxed In-containing III-nitride layer has a maximum lateral dimension of from 50 mm to 300 mm.

Aspect 40. The bulk relaxed layer of any one of aspects 1 to 38, wherein the bulk relaxed In-containing III-nitride layer has an area greater than 2,000 mm².

Aspect 41. The bulk relaxed layer of any one of aspects 1 to 38, wherein the bulk relaxed In-containing III-nitride layer has a maximum lateral dimension of from 1 µm to 1,000 µm.

Aspect 42. The bulk relaxed layer of any one of aspects 1 to 38, wherein the bulk relaxed In-containing III-nitride layer has an area less than 1E6 µm².

Aspect 43. A semiconductor structure comprising the bulk relaxed Wurtzite In-containing III-nitride layer of any one of aspects 1 to 42 overlying a substrate.

Aspect 44. The semiconductor structure of aspect 43, wherein the substrate comprises a substrate interface and the bulk relaxed In-containing III-nitride layer adjoins the substrate interface.

Aspect 45. The semiconductor structure of aspect 44, wherein the substrate interface is planar.

Aspect 46. The semiconductor structure of any one of aspects 43 to 45, wherein the semiconductor structure comprises a template, wherein the bulk relaxed In-containing III-nitride layer overlies the template and the template overlies the substrate.

Aspect 47. The semiconductor structure of aspect 46, wherein the template comprises GaN, $In_xGa_{1-x}N$ wherein $x>0$, or AlN.

Aspect 48. The semiconductor structure of any one of aspects 46 to 47, wherein the template comprises a planar layer.

Aspect 49. The semiconductor structure of any one of aspects 46 to 47, wherein the template comprises a patterned template.

Aspect 50. The semiconductor structure of aspect 49, wherein the patterned template comprises a plurality of seed regions.

Aspect 51. The semiconductor structure of aspect 50, wherein the seed regions comprise seed structures.

Aspect 52. The semiconductor structure of aspect 51, wherein the seed structures are disposed on regular an array.

Aspect 53. The semiconductor structure of aspect 52, wherein the regular array comprises a hexagonal array.

Aspect 54. The semiconductor structure of aspect 52, wherein the regular array comprises a trigonal array.

Aspect 55. The semiconductor structure of aspect 50, wherein the seed structures comprise pyramidal seed structures.

Aspect 56. The semiconductor structure of aspect 55, wherein the pyramidal seed structures comprise six {10-11} equivalent triagonal facets.

Aspect 57. The semiconductor structure of any one of aspects 51 to 56, wherein the seed structures are characterized by a dislocation density less than 1E9 cm$^{-2}$, wherein the dislocation density is determined by electron microscopy and/or cathodoluminescence.

Aspect 58. The semiconductor structure of any one of aspects 51 to 57, wherein the seed structures have a maximum lateral dimension from 10 nm to 2,000 nm.

Aspect 59. The semiconductor structure of any one of aspects 51 to 58, wherein the seed structures are characterized by a pitch from 10 nm to 2,000 nm with respect to the nearest seed structure.

Aspect 60. The semiconductor structure of any one of aspects 51 to 59, wherein the seed structures comprise $In_xAl_yGa_{1-x-y}N$, wherein x>0 and 0≤y≤1.

Aspect 61. The semiconductor structure of aspect 59, wherein 0<x<0.4 and 0≤y≤1.

Aspect 62. The semiconductor structure of any one of aspects 51 to 59, wherein the seed structures comprise $In_xGa_{1-x}N$, wherein x>0.

Aspect 63. The semiconductor structure of aspect 62, wherein 0<x<0.4.

Aspect 64. The semiconductor structure of aspect 62, wherein the seed structures comprise GaN.

Aspect 65. The semiconductor structure of any one of aspects 49 to 64, wherein the patterned template comprises a mask.

Aspect 66. The semiconductor structure of aspect 65, wherein seed structures overlie the substrate in openings in the mask.

Aspect 67. The semiconductor structure of any one of aspects 65 to 66, wherein the openings are disposed in a hexagonal pattern.

Aspect 68. The semiconductor structure of any one of aspects 65 to 68, wherein the mask comprises $SiN_x$ or $SiO_x$.

Aspect 69. The semiconductor structure of any one of aspects 65 to 68, wherein the mask has a thickness of from 3 nm to 300 nm.

Aspect 70. The semiconductor structure of any one of aspects 43 to 69, wherein the substrate comprises sapphire.

Aspect 71. The semiconductor structure of any one of aspects 43 to 69, wherein the substrate comprises sapphire, silicon, silicon carbide, AlN, or GaN.

Aspect 72. A semiconductor device comprising the bulk relaxed Wurtzite In-containing III-nitride layer of any one of aspects 1 to 42, or the semiconductor structure of any one of aspects 43 to 71.

Aspect 73. The semiconductor device of aspect 72, wherein the semiconductor device comprises an active region.

Aspect 74. The semiconductor device of aspect 72, wherein the semiconductor device comprises: a first doped semiconductor layer characterized by a first conductivity type overlying the bulk relaxed Wurtzite In-containing III-nitride layer: an active region overlying the first doped semiconductor layer, wherein the active region is configured to emit electromagnetic radiation: a second doped semiconductor layer characterized by a second conductivity type overlying the active region: a first electrode electrically contacting the first doped semiconductor layer, and a second electrode electrically contacting the second doped semiconductor layer.

Aspect 75. The semiconductor device of aspect 74, wherein the first conductivity type is p-type and the second conductivity type is n-type.

Aspect 76. The semiconductor device of aspect 74, wherein the first conductivity type is n-type and the second conductivity type is p-type.

Aspect 77. The semiconductor device of any one of aspects 74 to 76, wherein each of the first doped semiconductor layer and the second semiconductor layer independently comprises InGaN.

Aspect 78. The semiconductor device of any one of aspects 74 to 77, wherein the active region comprises one or more quantum wells comprising InGaN.

Aspect 79. The semiconductor device of any one of aspects 74 to 78, wherein the first electrode and the second electrode are independently selected from a metal stack.

Aspect 80. The semiconductor device of any one of aspects 73 to 79, wherein the active region is not strained with respect to the first interface region.

Aspect 81. The semiconductor device of any one of aspects 72 to 80, wherein the relaxed Wurtzite In-containing III-nitride layer is characterized by an InN mole fraction from 0.1% to 4%, and the active region is configured to emit radiation with a peak emission wavelength between 380 nm and 500 nm.

Aspect 82. The semiconductor device of any one of aspects 72 to 80, wherein the relaxed Wurtzite In-containing III-nitride layer is characterized by a InN mole fraction from 4% to 8%, and the active region is configured to emit radiation with a peak emission wavelength between 430 nm and 530 nm.

Aspect 83. The semiconductor device of any one of aspects 72 to 80, wherein the relaxed Wurtzite In-containing III-nitride layer is characterized by a InN mole fraction from 8% to 12%, and the active region is configured to emit radiation with a peak emission wavelength between 450 nm and 575 nm.

Aspect 84. The semiconductor device of any one of aspects 72 to 80, wherein the relaxed Wurtzite In-containing III-nitride layer is characterized by a InN mole fraction from 12% to 16%, and the active region is configured to emit radiation with a peak emission wavelength between 475 nm and 600 nm.

Aspect 85. The semiconductor device of any one of aspects 72 to 80, wherein the relaxed Wurtzite In-containing III-nitride layer is characterized by a InN mole fraction from 16% to 20%, and the active region is configured to emit radiation with a peak emission wavelength between 500 nm and 650 nm.

Aspect 86. The semiconductor device of any one of aspects 72 to 80, wherein the relaxed Wurtzite In-containing III-nitride layer is characterized by a InN mole fraction from 20% to 24%, and the active region is configured to emit light with a peak emission wavelength between 530 nm and 680 nm.

Aspect 87. The semiconductor device of any one of aspects 72 to 80, wherein the relaxed Wurtzite In-containing III-nitride layer is characterized by a InN mole fraction from 24% to 28%, and the active region is configured to emit light with a peak emission wavelength between 560 nm and 720 nm.

Aspect 88. The semiconductor device of any one of aspects 72 to 80, wherein the relaxed Wurtzite In-containing III-nitride layer is characterized by a InN mole fraction from 28% to 32%, and the active region is configured to emit light with a peak emission wavelength between 600 nm and 800 nm.

Aspect 88. The semiconductor device of any one of aspects 72 to 80, wherein the relaxed Wurtzite In-containing III-nitride layer is characterized by a InN mole fraction from 28% to 32%, and the active region is configured to emit light with a peak emission wavelength between 630 nm and 850 nm.

Aspect 89. The semiconductor device of any one of aspects 72 to 80, wherein the semiconductor device comprises an optoelectronic device.

Aspect 90. The semiconductor device of aspect 89, wherein the optoelectronic device is selected from a light emitting diode, micro-light emitting diode, a laser diode, a vertical cavity surface emitting laser, and a solar cell.

Aspect 91. The semiconductor device of any one of aspects 89 to 90, wherein the optoelectronic device is a multi-wavelength optoelectronic device.

Aspect 92. A method of making a bulk relaxed Wurtzite In-containing III-nitride layer comprising growing $In_xAl_yGa_{1-x-y}N$ using MOCVD growth conditions, wherein x>0 and 0<y<1.

Aspect 93. The method of aspect 92, wherein the $In_xAl_yGa_{1-x-y}N$ is $In_xGa_{1-x}N$.

Aspect 94. The method of any one of aspects 92 to 93, wherein growing is characterized by a growth rate greater than 0.1 μm per hour.

Aspect 95. The method of any one of aspects 92 to 94, wherein growing is characterized by a growth temperature from 740° C. to 800° C.

Aspect 96. The method of any one of aspects 92 to 94, wherein growing is characterized by a reactor pressure from 200 mbar to 600 mbar.

Aspect 97. The method of any one of aspects 92 to 94, wherein growing is characterized by a total gas flow rate from 6,000 sccm to 10,000 sccm, wherein the total gas flow rate comprises a flow rate of metalorganic, a flow rate of $NH_3$, and a flow rate of carrier gas.

Aspect 98. The method of aspect 97, wherein the carrier gas comprises $N_2$.

Aspect 99. The method of any one of aspects 92 to 98, wherein growing is characterized by a gas flow rate from 100 sccm to 400 sccm, wherein the gas flow rate comprises a flow rate of $NH_3$.

Aspect 100. The method of any one of aspects 92 to 99, wherein growing is characterized by a TMG flow rate from 25 sccm to 75 sccm.

Aspect 101. The method of any one of aspects 92 to 100, wherein growing is characterized by a TMI flow is rate from 300 sccm to 400 sccm.

Aspect 102. The method of any one of aspects 92 to 101, wherein growing comprises using an $NH_3$ flow rate from 150 sccm to 250 sccm.

Aspect 103. The method of any one of aspects 92 to 102, wherein growing comprises growing $In_xAl_yGa_{1-x-y}N$ on a surface of a substrate or on a surface of a template.

Aspect 104. The method of aspect 103, wherein the substrate surface is planar.

Aspect 105. The method of aspect 103, wherein the substrate surface is non-planar.

Aspect 106. The method of any one of aspects 92 to 105, wherein growing comprises growing the bulk relaxed Wurtzite In-containing III-nitride layer on a template.

Aspect 107. The method of aspect 106, wherein the template comprises $In_xAl_yGa_{1-x-y}N$, $In_xGa_{1-x}N$, or GaN, wherein 0<x≤1 and 0≤y≤1.

Aspect 108. The method of any one of aspects 106 to 107, wherein the template comprises a planar template.

Aspect 109. The method of any one of aspects 106 to 107, wherein the template comprises a patterned template.

Aspect 110. The method of aspect 109, wherein the patterned template comprises a plurality of seed regions.

Aspect 111. The method of any one of aspects 108 to 109, wherein the patterned template comprises an array of $In_xAl_yGa_{1-x-y}N$ seed regions.

Aspect 112. The method of any one of aspects 108 to 109, wherein the patterned template comprises an array of GaN seed regions.

Aspect 113. The method of any one of aspects 110 to 112, wherein the seed regions comprise seed structures.

Aspect 114. The method of any one of aspects 92 to 113, wherein growing using MOCVD comprises growing under metal-rich MOCVD growth conditions.

Aspect 115. The method of aspect 114, wherein the metal-rich MOCVD growth conditions comprise: a TMG flow rate of from 25 sccm to 75 sccm: a TMI flow rate of from 250 sccm to 500 sccm; a $NH_3$ flow rate of from 200 sccm to 400 sccm; and a growth temperature of from 740° C. to 800° C.

Aspect 116. The method of any one of aspects 92 to 115, wherein growing comprises growing to a thickness greater than 100 nm.

Aspect 117. A bulk relaxed Wurtzite In-containing III-nitride layer made by the method of any one of aspects 92 to 115.

Aspect 118. A method of making a semiconductor device comprising growing one or more epitaxial layers overlying the bulk relaxed Wurtzite In-containing III-nitride layer of any one of aspects 1 to 42 and 117, or overlying the semiconductor structure of any one of aspects 43 to 91.

Aspect 119. A semiconductor device made by the method of aspect 118.

Aspect 120. The semiconductor device of aspect 119, wherein the semiconductor device comprises an optoelectronic device.

Aspect 121. The semiconductor device of aspect 120, wherein the optoelectronic device is selected from a light emitting diode, micro-light emitting diode, a laser diode, a vertical cavity surface emitting laser, a solar cell, and a projection display.

Aspect 122. The semiconductor device of any one of aspects 120 to 121, wherein the optoelectronic device is a multi-wavelength optoelectronic device.

Aspect 123. A semiconductor structure comprising: an In-containing III-nitride Wurtzite In-containing III-nitride region or a first bulk relaxed Wurtzite In-containing III-nitride region; and a second bulk relaxed Wurtzite In-containing III-nitride region, wherein each of the first and second bulk relaxed regions is independently characterized by: a thickness greater than 100 nm; and a first interface region characterized by: a single-phase gallium-polar (0001) orientation: an InN mole fraction greater than 0; and a substantially relaxed in-plane a-lattice parameter.

Aspect 124. The semiconductor structure of aspect 123, wherein the InN mole fraction of the In-containing III-nitride region or the first bulk relaxed region is different than the InN mole fraction of the second bulk relaxed region.

Aspect 125. The semiconductor structure of any one of aspects 123 to 124, the In-containing III-nitride region or the first bulk relaxed region, and the second bulk relaxed region overlie a common substrate.

Aspect 126. The semiconductor structure of any one of aspects 123 to 125, the first bulk relaxed region overlies a first template and the second bulk relaxed region overlies a second template.

Aspect 127. The semiconductor structure of aspect 126, the first template and the second template comprise a different $In_xAl_yGa_{1-x-y}N$ composition.

Aspect 128. The semiconductor structure of any one of aspects 126 to 127, the first template and/or the second template independently comprises seed regions.

Aspect 129. The semiconductor structure of aspect 128, the seed regions comprise seed structures.

Aspect 130. The semiconductor structure of any one of aspects 126 to 129, the first template and/or the second template comprises a patterned template.

Aspect 131. The semiconductor structure of any one of aspects 126 to 130, the first patterned template and the second patterned template comprise a different $In_xAl_yGa_{1-x-y}N$ composition, wherein $0<x\leq1$ and $0\leq y\leq1$.

Aspect 132. The semiconductor structure of any one of aspects 126 to 131, each of the first patterned template and the second patterned template comprise a different pattern.

Aspect 133. A multiwavelength semiconductor device comprising the semiconductor structure of any one of aspects 123 to 132.

Aspect 134. The multiwavelength semiconductor device of aspect 133, wherein the semiconductor device comprises: at least one epitaxial layer overlying the first bulk relaxed region; and at least one epitaxial layer overlying the second bulk relaxed region.

Aspect 135. The multiwavelength semiconductor device of aspect 134, wherein each of the at least one epitaxial layer independently comprises: a first doped semiconductor layer of a first conductivity type overlying the bulk relaxed region: an active region overlying the first doped semiconductor layer, wherein the active region is configured to emit electromagnetic radiation: a second doped semiconductor layer of a second conductivity type overlying the active region: a first electrode electrically contacting the first doped semiconductor layer, and a second electrode electrically contacting the second doped semiconductor layer.

Aspect 136. A method of making a semiconductor structure comprising: (a) growing an In-containing III-nitride Wurtzite In-containing III-nitride layer or a first bulk relaxed Wurtzite In-containing III-nitride layer comprising a first InN mole fraction overlying a first region of a substrate: (b) growing a second bulk relaxed Wurtzite In-containing III-nitride layer comprising a second InN mole fraction overlying a second region of the substrate, wherein, growing comprises growing $In_xAl_yGa_{1-x-y}N$ using MOCVD, wherein x>0 and $0\leq y\leq1$; and the first InN mole fraction is less than the second InN mole fraction.

Aspect 137. The method of aspect 136, wherein $In_xAl_yGa_{1-x-y}N$ is $In_xGa_{1-x}N$.

Aspect 138. The method of any one of aspects 136 to 137, wherein growing is characterized by a growth rate of less than 5 μm/hour.

Aspect 139. The method of any one of aspects 136 to 138, wherein growing is characterized by a growth temperature from 740° C. to 800° C.

Aspect 140. The method of any one of aspects 136 to 139, wherein growing is characterized by a reactor pressure from 200 mbar to 600 mbar.

Aspect 141. The method of any one of aspects 136 to 140, wherein growing is characterized by a total gas flow rate from 6,000 sccm to 10,000 sccm, wherein the total gas flow rate comprises a flow rate of metalorganic, a flow of $NH_3$, and a flow rate of carrier gas.

Aspect 142. The method of any one of aspects 136 to 141, wherein growing is characterized by a gas flow rate of metalorganic, and a flow rate of $NH_3$ is from 400 sccm to 1,000 sccm.

Aspect 143. The method of aspect 139, wherein the carrier gas comprises $N_2$.

Aspect 144. The method of any one of aspects 136 to 142, wherein growing is characterized by a TMGa flow rate from 25 sccm to 75 sccm.

Aspect 145. The method of any one of aspects 136 to 144, wherein growing is characterized by a TMIn flow rate from 300 sccm to 400 sccm.

Aspect 146. The method of any one of aspects 136 to 145, wherein growing comprises using an $NH_3$ flow rate from 200 sccm to 250 sccm.

Aspect 147. The method of any one of aspects 136 to 146, wherein growing comprises growing $In_xAl_yGa_{1-x-y}N$ on a surface of substrate.

Aspect 148. The method of any one of aspects 136 to 147, wherein the substrate surface is planar.

Aspect 149. The method of any one of aspects 136 to 147, wherein the substrate surface is non-planar.

Aspect 150. The method of any one of aspects 136 to 149, wherein growing comprises growing the bulk relaxed Wurtzite In-containing III-nitride layer on a template.

Aspect 151. The method of aspect 150, wherein the template comprises a planar template.

Aspect 152. The method of any one of aspects 148 to 149, wherein the template comprises $In_xAl_yGa_{1-x-y}N$, $In_xGa_{1-x}N$, or GaN, wherein $0<x\leq1$ and $0\leq y\leq1$.

Aspect 153. The method of aspect 152, wherein the template comprises a patterned template.

Aspect 154. The method of aspect 153, wherein the patterned template comprises a plurality of seed regions.

Aspect 155. The method of aspect 154, wherein the patterned template comprises an array of $In_xAl_yGa_{1-x-y}N$ seed regions.

Aspect 156. The method of aspect 154, wherein the patterned template comprises an array of GaN seed regions.

Aspect 157. The method of any one of aspects 154 to 156, wherein the seed regions comprise seed structures.

Aspect 158. The method of any one of aspects 136 to 157, wherein growing using MOCVD comprises growing under metal-rich MOCVD growth conditions.

Aspect 159. The method of aspect 158, wherein the metal-rich MOCVD growth conditions comprise: a TMG flow rate of from 25 sccm to 75 sccm: a TMI flow rate of from 250 sccm to 500 sccm; a $NH_3$ flow rate of from 200 sccm to 400 sccm; and a growth temperature of from 740° C. to 800° C.

Aspect 160. The method of any one of aspects 136 to 159, wherein growing comprises growing to a thickness greater than 100 nm.

Aspect 161. A multi-wavelength semiconductor structure fabricated using the method of any one of aspects 136 to 160.

Additional, the invention is further defined by one or more of the following aspects.

Aspect 1. A semiconductor structure comprising: a III-nitride layer comprising a III-nitride surface; and a relaxed In-containing III-nitride layer overlying the III-nitride surface, wherein the relaxed In-containing III-nitride layer comprises a relaxed In-containing III-nitride surface.

Aspect 2. The semiconductor structure of aspect 1, wherein the relaxed In-containing III-nitride layer adjoins at least a portion of the III-nitride surface.

Aspect 3. The semiconductor structure of any one of aspects 1 to 2, wherein the relaxed In-containing III-nitride layer has an in-plane a-lattice parameter that is different than the in-plane a-lattice parameter of the III-nitride layer.

Aspect 4. The semiconductor structure of any one of aspects 1 to 3, wherein the relaxed In-containing III-nitride layer has an in-plane a-lattice parameter that is different than the in-plane a-lattice parameter of the III-nitride layer by at least ±0.5%.

Aspect 5. The semiconductor structure of any one of aspects 1 to 4, wherein the III-nitride layer comprises GaN, $In_xGa_{1-x}N$, or $In_xAl_yGa_{1-x-y}N$ where $0<x<1$ and $0 \leq y \leq 1$.

Aspect 6. The semiconductor structure of any one of aspects 1 to 4, wherein the III-nitride layer comprises GaN.

Aspect 7. The semiconductor structure of any one of aspects 1 to 6, wherein the in-plane a-lattice parameter of the relaxed In-containing III-nitride layer differs from the in-plane a-lattice parameter of the III-nitride layer by ±0.5%.

Aspect 8. The semiconductor structure of any one of aspects 1 to 7, wherein the in-plane a-lattice parameter of the relaxed In-containing III-nitride layer differs from the in-plane a-lattice parameter of the III-nitride layer by ±0.01 Å.

Aspect 9. The semiconductor structure of any one of aspects 1 to 8, wherein the III-nitride surface is planar.

Aspect 10. The semiconductor structure of any one of aspects 1 to 9, wherein the III-nitride surface has a (0001) orientation.

Aspect 11. The semiconductor structure of any one of aspects 1 to 10, wherein the III-nitride surface has a roughness of less than 1 nm RMS over a 1 μm×1 μm area.

Aspect 12. The semiconductor structure of any one of aspects 1 to 11, wherein the III-nitride surface has a roughness of less than 5 nm RMS over a 5 μm×5 μm area.

Aspect 13. The semiconductor structure of any one of aspects 1 to 12, wherein the relaxed In-containing III-nitride layer comprises $In_xAl_yGa_{1-x-y}N$, wherein $0<x<1$ and $0 \leq y \leq 1$.

Aspect 14. The semiconductor structure of any one of aspects 1 to 12, wherein the relaxed In-containing III-nitride layer comprises $In_xAl_yGa_{1-x-y}N$, wherein $x>0$ and $0 \leq y \leq 1$.

Aspect 15. The semiconductor structure of any one of aspects 1 to 12, wherein the relaxed In-containing III-nitride layer comprises $In_xGa_{1-x}N$, wherein $0<x<1$.

Aspect 16. The semiconductor structure of aspect 15, wherein $0.01<x<0.4$.

Aspect 17. The semiconductor structure of aspect 15, wherein $0.05<x<0.4$.

Aspect 18. The semiconductor structure of any one of aspects 1 to 17, wherein the relaxed In-containing III-nitride layer has an InN mole fraction greater than 1%.

Aspect 19. The semiconductor structure of any one of aspects 1 to 17, wherein the relaxed In-containing III-nitride layer has an InN mole fraction greater than 5%.

Aspect 20. The semiconductor structure of any one of aspects 1 to 17, wherein the relaxed In-containing III-nitride layer has an InN mole fraction greater than 10%.

Aspect 21. The semiconductor device of any one of aspects 1 to 17, wherein the relaxed In-containing III-nitride layer is characterized by a InN mole fraction from 1% to 40%.

Aspect 22. The semiconductor device of any one of aspects 1 to 17, wherein the relaxed In-containing III-nitride layer is characterized by a InN mole fraction from 4% to 8%.

Aspect 23. The semiconductor device of any one of aspects 1 to 17, wherein the relaxed In-containing III-nitride layer is characterized by a InN mole fraction from 8% to 12%.

Aspect 24. The semiconductor device of any one of aspects 1 to 17, wherein the relaxed In-containing III-nitride layer is characterized by a InN mole fraction from 12% to 16%.

Aspect 25. The semiconductor device of any one of aspects 1 to 17, wherein the relaxed In-containing III-nitride layer is characterized by a InN mole fraction from 16% to 20%.

Aspect 26. The semiconductor device of any one of aspects 1 to 17, wherein the relaxed In-containing III-nitride layer is characterized by a InN mole fraction from 20% to 24%.

Aspect 27. The semiconductor device of any one of aspects 1 to 17, wherein the relaxed In-containing III-nitride layer is characterized by a InN mole fraction from 24% to 28%.

Aspect 28. The semiconductor device of any one of aspects 1 to 17, wherein the relaxed In-containing III-nitride layer is characterized by a InN mole fraction from 28% to 32%.

Aspect 29. The semiconductor structure of any one of aspects 1 to 28, wherein the relaxed In-containing III-nitride layer has a substantially homogeneous InN mole fraction throughout the thickness of the relaxed In-containing III-nitride layer.

Aspect 30. The semiconductor structure of any one of aspects 1 to 29, wherein local thickness variation of the relaxed In-containing III-nitride layer is less than +10% relative to the average thickness over a 5 μm×5 μm area.

Aspect 31. The semiconductor structure of any one of aspects 1 to 30, wherein the relaxed In-containing III-nitride layer has a thickness greater than 50 nm.

Aspect 32. The semiconductor structure of any one of aspects 1 to 30, wherein the relaxed In-containing III-nitride layer has a thickness greater than 100 nm.

Aspect 33. The semiconductor structure of any one of aspects 1 to 30, wherein the relaxed In-containing III-nitride layer has a thickness from 0.1 μm to 4 μm.

Aspect 34. The semiconductor structure of any one of aspects 1 to 30, wherein the relaxed In-containing III-nitride layer has a thickness from 10 nm to 1,000 nm.

Aspect 35. The semiconductor structure of any one of aspects 1 to 34, wherein a region of the relaxed In-containing III-nitride layer at a distance of less than 20 nm from the III-nitride surface is characterized by a relaxed in-plane a-lattice parameter.

Aspect 36. The semiconductor structure of any one of aspects 1 to 34, wherein a region of the relaxed In-containing III-nitride layer at a distance of less than 5 nm from the III-nitride surface is characterized by a relaxed in-plane a-lattice parameter.

Aspect 37. The semiconductor structure of any one of aspects 1 to 36, wherein a region of the relaxed In-containing III-nitride layer at a distance of less than 10 nm from the III-nitride surface is characterized by an in-plane a-lattice parameter within 0.1% of a fully relaxed in-plane a-lattice parameter of the In-containing III-nitride alloy.

Aspect 38. The semiconductor structure of any one of aspects 1 to 36, wherein a region of the relaxed In-containing III-nitride layer at a distance of less than 5 nm from the III-nitride surface is characterized by an in-plane a-lattice parameter within 0.05% of the theoretical in-plane a-lattice parameter.

Aspect 39. The semiconductor structure of any one of aspects 1 to 36, wherein a region of the relaxed In-containing III-nitride layer at a distance of less than 5 nm from the III-nitride surface is characterized by an in-plane a-lattice parameter that is within +0.005 Å of a fully relaxed in-plane a-lattice parameter of the In-containing III-nitride alloy.

Aspect 40. The semiconductor structure of any one of aspects 1 to 39, wherein the relaxed In-containing III-nitride surface is planar.

Aspect 41. The semiconductor structure of any one of aspects 1 to 40, wherein the relaxed In-containing III-nitride surface has a roughness of less than 1 nm RMS over a 1 µm×1 µm area.

Aspect 42. The semiconductor structure of any one of aspects 1 to 41, wherein the relaxed In-containing III-nitride surface has a roughness of less than 5 nm RMS over a 5 µm×5 µm area.

Aspect 43. The semiconductor structure of any one of aspects 1 to 42, wherein the relaxed In-containing III-nitride surface is substantially free of pits.

Aspect 44. The semiconductor structure of any one of aspects 1 to 42, wherein the relaxed In-containing III-nitride surface has a pit density of less than $1E-9$ $cm^{-2}$ as determined by electron microscopy, atomic force microscopy, or cathodoluminescence.

Aspect 45. The semiconductor structure of any one of aspects 1 to 44, wherein the relaxed In-containing III-nitride surface has an in-plane a-lattice parameter within ±0.1% of a fully relaxed in-plane a-lattice parameter of the In-containing III-nitride alloy.

Aspect 46. The semiconductor structure of any one of aspects 1 to 44, wherein the relaxed In-containing III-nitride surface is substantially free of pits, the relaxed In-containing layer has an in-plane a-lattice parameter that is within ±0.05 Å of a fully relaxed in-plane a-lattice parameter of the In-containing III-nitride alloy.

Aspect 47. The semiconductor structure of any one of aspects 1 to 46, wherein the relaxed In-containing III-nitride surface has an InN mole fraction within ±0.1% of the average InN mole fraction across the area of the relaxed In-containing III-nitride surface.

Aspect 48. The semiconductor structure of any one of aspects 1 to 47, wherein a standard deviation of the InN mole fraction across a two-inch diameter relaxed In-containing III-nitride surface is less than 7% of the average InN mole fraction.

Aspect 49. The semiconductor structure of any one of aspects 1 to 48, wherein a reciprocal space map of the semiconductor structure is characterized by a Bragg diffraction peak corresponding to the III-nitride layer and a Bragg diffraction peak corresponding to the In-containing III-nitride layer.

Aspect 50. The semiconductor structure of any one of aspects 1 to 48, wherein an X-ray reciprocal space map of the structure shows at least two Bragg peaks, including one Bragg peak corresponding to the relaxed In-containing III-nitride layer which is laterally offset from another Bragg peak corresponding to the III-nitride base layer.

Aspect 51. The semiconductor structure of any one of aspects 1 to 50, wherein a regularly patterned material does not overly the III-nitride surface.

Aspect 52. The semiconductor structure of any one of aspects 1 to 51, wherein a lithographically defined material or structure does not overly the III-nitride surface.

Aspect 53. The semiconductor structure of any one of aspects 1 to 52, wherein a discreet semiconductor structure comprising GaN or an In-containing III-nitride material is not disposed between the III-nitride surface and the relaxed In-containing III-nitride layer.

Aspect 54. The semiconductor structure of any one of aspects 1 to 50, comprising a slip region overlying a portion of the III-nitride surface and underlying a portion of the relaxed In-containing III-nitride layer.

Aspect 55. The semiconductor structure of aspect 54, wherein the relaxed In-containing III-nitride layer overlies the slip region and the portion of the III-nitride layer not covered by the slip region.

Aspect 56. The semiconductor structure of any one of aspects 54 to 55, wherein the slip region comprises a metal oxide, a non-metal oxide, a metal nitride, a non-metal nitride, or a combination of any of the foregoing.

Aspect 57. The semiconductor structure of any one of aspects 54 to 55, wherein the slip region comprises AlN, TlN, SiOx, SiNx, or a combination of any of the foregoing.

Aspect 58. The semiconductor structure of any one of aspects 54 to 55, wherein the dielectric material comprises SiNx.

Aspect 59. The semiconductor structure of any one of aspects 54 to 58, wherein the slip region is non-continuous.

Aspect 60. The semiconductor structure of any one of aspects 54 to 59, wherein the slip region does not form a regular pattern.

Aspect 61. The semiconductor structure of any one of aspects 54 to 60, wherein the slip region is randomly distributed on the III-nitride surface.

Aspect 62. The semiconductor structure of any one of aspects 54 to 61, wherein the slip region is amorphous.

Aspect 63. The semiconductor structure of any one of aspects 54 to 62, wherein the slip region comprises discrete nanoscale islands.

Aspect 64. The semiconductor structure of any one of aspects 54 to 62, wherein the slip region comprises non-continuous nanoscale platelets.

Aspect 65. The semiconductor structure of any one of aspects 54 to 64, wherein the slip region overlies at least 1% of the III-nitride surface.

Aspect 66. The semiconductor structure of any one of aspects 54 to 64, wherein the slip region overlies from 10% to 90% of the III-nitride surface.

Aspect 67. The semiconductor structure of any one of aspects 54 to 66, wherein the slip region has an average thickness less than 1 nm.

Aspect 68. The semiconductor structure of any one of aspects 54 to 66, wherein the slip region has a maximum thickness less than 0.1 nm.

Aspect 69. The semiconductor structure of any one of aspects 54 to 68, wherein the slip region is partially embedded in the relaxed In-containing III-nitride layer.

Aspect 70. The semiconductor structure of any one of aspects 54 to 69, wherein the slip region is disposed above the III-nitride surface.

Aspect 71. The semiconductor structure of any one of aspects 54 to 70, wherein the slip region is formed without lithographic patterning.

Aspect 72. The semiconductor structure of any one of aspects 54 to 71, wherein the slip region is formed in situ under MOCVD conditions.

Aspect 73. The semiconductor structure of any one of aspects 54 to 72, wherein the relaxed In-containing III-nitride layer is substantially free of coherent epitaxial registry with the slip region.

Aspect 74. The semiconductor structure of any one of aspects 54 to 73, wherein the slip region comprises two or more slip regions.

Aspect 75. The semiconductor structure of aspect 74, wherein each of the two or more slip regions comprises a different dielectric material, a different thickness, and/or a different surface coverage.

Aspect 76. The semiconductor structure of any one of aspects 74 to 75, wherein the slip region comprises: a first slip region overlying a first portion of the III-nitride layer; and a second slip region overlying a second portion of the III-nitride layer.

Aspect 77. The semiconductor structure of aspect 76, wherein the first slip region and the second slip region comprise different dielectric materials, have a different structure and/or a different coverage.

Aspect 78. The semiconductor structure of any one of aspects 74 to 75, comprising: a first relaxed In-containing nitride layer overlying the first slip region; and a second relaxed In-containing nitride layer overlying the second slip region.

Aspect 79. The semiconductor structure of aspect 78, wherein the first relaxed In-containing III-nitride layer and the second relaxed In-containing III-nitride layer have a different thickness, a different InN mole fraction, and/or a different in-plane a-lattice parameter.

Aspect 80. The semiconductor structure of any one of aspects 78 to 79, comprising: a first one or more epitaxial layers overlying the first relaxed In-containing III-nitride layer: a second one or more epitaxial layers overlying the second relaxed In-containing III-nitride layer: wherein, the first one or more epitaxial layers are lattice matched to the first relaxed In-containing III-nitride layer; and the second one or more epitaxial layers are lattice matched to the second relaxed In-containing III-nitride layer.

Aspect 81. The semiconductor structure of any one of aspects 78 to 80, comprising: a first optoelectronic element overlying the first relaxed In-containing III-nitride layer; and a second optoelectronic element overlying the second relaxed In-containing III-nitride layer.

Aspect 82. The semiconductor structure of aspect 81, wherein the first and second optoelectronic elements are configured to emit electromagnetic radiation within a different wavelength range.

Aspect 83. The semiconductor structure of aspect 81, wherein the first and second optoelectronic elements independently comprise an EELD, a VCSEL, an LED, and an RCLED.

Aspect 84. The semiconductor structure of any one of aspects 78 to 80, comprising: a first active region overlying the first relaxed In-containing III-nitride layer; and a second active region overlying the second relaxed In-containing III-nitride layer.

Aspect 85. The semiconductor structure of aspect 84, wherein, the first active region is lattice matched to the first relaxed In-containing III-nitride layer; and the second active region is lattice matched to the second relaxed In-containing III-nitride layer.

Aspect 86. The semiconductor structure of aspect 84, comprising: the first active region has substantially the same in-plane a-lattice parameter as the first relaxed In-containing III-nitride layer; and the second active region has substantially the same in-plane a-lattice parameter as the second relaxed In-containing III-nitride layer.

Aspect 87. The semiconductor structure of aspect 84, wherein each of the first active region and the second active region is independently configured to emit electromagnetic radiation within a different wavelength range.

Aspect 88. The semiconductor structure of any one of aspects 74 to 75, comprising a second slip region overlying the relaxed In-containing III-nitride layer.

Aspect 89. The semiconductor structure of aspect 88, comprising: one or more epitaxial layers overlying the In-containing III-nitride layer; and a second slip region overlying an epitaxial layer.

Aspect 90. The semiconductor structure of aspect 89, wherein the epitaxial layer comprises an In-containing III-nitride layer.

Aspect 91. The semiconductor structure of aspect 89, wherein the first slip region and the second slip region comprise different dielectric materials, have a different structure, and/or a different coverage.

Aspect 92. The semiconductor structure of aspect 88, comprising a second relaxed In-containing III-nitride layer overlying the second slip region and a portion of the underlying epitaxial layer.

Aspect 93. The semiconductor structure of aspect 92, wherein the relaxed In-containing III-nitride layer and the second relaxed In-containing III-nitride layer have a different thickness, a different InN mole fraction, and/or a different in-plane a-lattice parameter.

Aspect 95. The semiconductor structure of aspect 92, wherein an X-ray reciprocal space map of the semiconductor structure shows at least three Bragg peaks, including a first Bragg peak corresponding to the relaxed In-containing nitride layer and a second Bragg peak corresponding to the second relaxed In-containing nitride layer, each of which is laterally offset from a Bragg peak corresponding to the III-nitride layer.

Aspect 96. The semiconductor structure of any one of aspects 1 to 96, comprising a substrate underlying the III-nitride layer.

Aspect 97. The semiconductor structure of aspect 96, wherein the substrate comprises GaN, ASIN, sapphire, AlYN, Si, or SiC.

Aspect 98. The semiconductor structure of any one of aspects 1 to 97, comprising one or more epitaxial layers overlying the relaxed In-containing III-nitride layer.

Aspect 99. The semiconductor structure of aspect 98, wherein the one or more epitaxial layers are lattice matched to the relaxed In-containing III-nitride layer.

Aspect 100. The semiconductor structure of aspect 98, wherein the one or more epitaxial layers comprise an optically active region overlying the relaxed In-containing III-nitride layer.

Aspect 101. The semiconductor structure of aspect 100, wherein the optically active region is lattice matched to the relaxed In-containing III-nitride layer.

Aspect 102. The semiconductor structure of any one of aspects 100 to 101, wherein the optically active region has an in-plane a-lattice parameter that is within ±5% of an in-plane a-lattice parameter of the In-containing III-nitride layer.

Aspect 103. The semiconductor structure of aspect 98, wherein the one or more epitaxial layers comprises an optoelectronic element.

Aspect 104. The semiconductor structure of aspect 103, wherein the optoelectronic element comprises an EELD, a VCSEL, an LED, and a RCLED.

Aspect 105. The semiconductor structure of aspect 1, wherein, the III-nitride layer comprises GaN; and the relaxed In-containing III-nitride layer comprises $In_xGa_{1-x}N$, wherein $0<x<1$.

Aspect 106. The semiconductor structure of aspect 105, comprising a second relaxed In-containing III-nitride layer overlying the relaxed In-containing III-nitride layer.

Aspect 107. The semiconductor structure of aspect 106, wherein, the relaxed In-containing III-nitride layer has a first relaxed in-plane a-lattice parameter: the second relaxed In-containing III-nitride layer has a second relaxed in-plane a-lattice parameter; and the second relaxed in-plane a-lattice parameter is different than the first in-plane a-lattice parameter.

Aspect 108. The semiconductor structure of aspect 106, wherein, the relaxed In-containing III-nitride layer has a first InN mole fraction: the second relaxed In-containing III-nitride layer has a second InN mole fraction; and the second InN mole fraction is different than the first InN mole fraction.

Aspect 109. The semiconductor structure of aspect 106, wherein a reciprocal space map of the semiconductor structure is characterized by: a Bragg diffraction peak associated with the III-nitride layer; a Bragg diffraction peak associated with the relaxed In-containing III-nitride layer; and a Bragg diffraction peak associated with the second relaxed In-containing III-nitride layer.

Aspect 110. The semiconductor structure of aspect 106, comprising: a first active region overlying the relaxed In-containing III-nitride layer and underlying the second relaxed In-containing III-nitride layer; and a second active region overlying the second relaxed In-containing III-nitride layer.

Aspect 111. The semiconductor structure of aspect 110, wherein, the first active region is lattice-matched to the relaxed In-containing III-nitride layer; and the second active region is lattice match to the second relaxed In-continuing III-nitride layer.

Aspect 112. The semiconductor structure of any one of aspects 110 to 111, wherein, the first active region is configured to emit electromagnetic wavelength range: the second active region is configured to emit electromagnetic radiation is a second wavelength range; and wherein the first and second wavelength ranges are different.

Aspect 113. A method of fabricating a semiconductor structure comprising: forming a slip region on a portion of the III-nitride surface; and growing a relaxed In-containing III-nitride layer on the slip region and on portions of the III-nitride layer not covered by the slip region.

Aspect 114. The method of aspect 113, wherein the III-nitride layer has a first in-plane a-lattice parameter and the relaxed In-containing III-nitride layer has a second in-plane a-lattice parameter, wherein the first and second in-plane a-lattice parameters are different.

Aspect 115. The method of any one of aspects 113 to 114, wherein the slip region is deposited in situ using MOCVD conditions.

Aspect 116. The method of any one of aspects 113 to 115, wherein the slip region is deposited by flowing dielectric material precursors into the MOCVD reaction chamber.

Aspect 117. The method of any one of aspects 113 to 115, wherein the slip region is deposited by flowing silane and ammonia with no trimethylgallium into the MOCVD reaction chamber.

Aspect 118. The method of any one of aspects 113 to 115, wherein flowing comprises exposing the III-nitride layer to the dielectric material precursors for less than 5 seconds.

Aspect 119. The method of any one of aspects 113 to 118, wherein forming the slip region comprises using the following MOCVD reactor conditions: a temperature from 650° C. to 850° C., a $SiH_4$ flow rate from 60 sccm to 120 sccm, a $NH_3$ flow rate from 100 sccm to 300 sccm, $H_2$ as the carrier gas, a total gas flow rate of from 6,000 sccm to 10,000 sccm, a reactor pressure of from 50 mbar to 100 mbar, and a growth time from 1 minute to 10 minutes.

Aspect 120. The method of any one of aspects 113 to 119, wherein the slip region comprises a metal oxide, a non-metal oxide, a metal nitride, a non-metal nitride, or a combination of any of the foregoing.

Aspect 121. The method of any one of aspects 113 to 119, wherein the slip region comprises AlN, TlN, SiOx, SiNx, or a combination of any of the foregoing.

Aspect 122. The method of any one of aspects 113 to 119, wherein the slip region comprises SiNx.

Aspect 123. The method of any one of aspects 113 to 122, wherein the slip region is non-continuous.

Aspect 124. The method of any one of aspects 113 to 123, wherein the slip region does not form a regular pattern.

Aspect 125. The method of any one of aspects 113 to 124, wherein the slip region is randomly distributed on the surface of the III-nitride layer.

Aspect 126. The method of any one of aspects 113 to 125, wherein the slip region is amorphous.

Aspect 127. The method of any one of aspects 113 to 126, wherein the slip region comprises discrete nanoscale islands.

Aspect 128. The method of any one of aspects 113 to 127, wherein the slip region comprises non-continuous nanoscale platelets.

Aspect 129. The method of any one of aspects 113 to 128, wherein the slip region overlies at least 1% of the III-nitride surface.

Aspect 130. The method of any one of aspects 113 to 129, wherein the slip region overlies from 1% to 99% of the III-nitride surface.

Aspect 131. The method of any one of aspects 113 to 130, wherein the slip region has an average thickness less than 1 nm.

Aspect 132. The method of any one of aspects 113 to 130, wherein the slip region has a maximum thickness less than 0.1 nm.

Aspect 133. The method of any one of aspects 113 to 131, wherein the slip region is partially embedded in the relaxed In-containing III-nitride layer.

Aspect 134. The method of any one of aspects 113 to 131, wherein the slip region is disposed above the surface of the III-nitride layer.

Aspect 135. The method of any one of aspects 113 to 134, wherein the slip region is formed without lithographic patterning.

Aspect 136. The method of any one of aspects 113 to 135, wherein the slip region is formed in situ under MOCVD conditions.

Aspect 137. The method of any one of aspects 113 to 136, wherein the relaxed In-containing III-nitride layer is substantially free of coherent epitaxial registry with the slip region.

Aspect 138. The method of any one of aspects 113 to 137, comprising, before forming the slip region, providing the III-nitride layer.

Aspect 139. The method of any one of aspects 113 to 138, wherein the relaxed In-containing III-nitride layer has a different InN mole fraction than that of the III-nitride layer.

Aspect 140. The method of any one of aspects 113 to 139, wherein growing the relaxed In-containing III-nitride layer comprises growing the In-containing III-nitride layer to a thickness greater than 100 nm.

Aspect 141. The method of any one of aspects 113 to 140, comprising growing an additional relaxed In-containing III-nitride layer over the relaxed In-containing II-nitride layer, wherein the additional relaxed In-containing III-nitride layer has a different InN mole fraction than that of the relaxed In-containing III-nitride layer.

Aspect 142. The method of aspect 141, wherein the additional In-containing III-nitride layer has higher compressive strain than the relaxed In-containing III-nitride layer.

Aspect 143. A slip region fabricated by the method of any one of aspects 113 to 142.

Aspect 144. A semiconductor structure comprising the slip region fabricated by the method of aspect 143.

Aspect 145. A device comprising the semiconductor structure of aspect 144.

Aspect 146. A wafer comprising the semiconductor structure of aspect 144 or the device of aspect 145.

Aspect 147. A method of fabricating a semiconductor layer using metal-rich MOCVD.

Aspect 148. The method of aspect 147, wherein the semiconductor layer comprises a Wurtzite In-containing III-nitride layer.

Aspect 149. The method of aspect 148, wherein the Wurtzite In-containing III-nitride layer is a relaxed Wurtzite In-containing III-nitride layer.

Aspect 150. A semiconductor layer fabricated using the method of any one of aspects 147 to 149.

Aspect 151. A semiconductor device comprising the semiconductor structure of any one of aspects 1 to 112, 114, and 156, or the semiconductor layer of any one of aspects 150 and 155.

Aspect 152. The semiconductor device of aspect 151, wherein the semiconductor device comprises and optoelectronic device.

Aspect 153. The semiconductor device of aspect 152, wherein the optoelectronic device comprises and LED, RCLED, EELD, or a VCSEI.

Aspect 154. A wafer comprising the semiconductor structure of aspect 1, the semiconductor structure of any one of aspects 112, 144, and 156, the semiconductor layer of any of aspects 150 and 155, or the semiconductor device of any one of aspects 145, 151-153, 157-159, and 161 to 180.

Aspect 155. A relaxed In-containing III-nitride layer fabricated using the method of aspect 147.

Aspect 156. A semiconductor structure comprising the relaxed In-containing III-nitride layer of aspect 155.

Aspect 157. A semiconductor device comprising the relaxed In-containing III-nitride layer of aspect 155 or the semiconductor structure of aspect 156.

Aspect 158. The semiconductor device of aspect 157, wherein the semiconductor device comprises and optoelectronic device.

Aspect 159. The semiconductor device of aspect 158, wherein the optoelectronic device comprises and LED, RCLED, EELD, or a VCSEL.

Aspect 160. A wafer comprising the relaxed In-containing III-nitride structure of aspect 155, the semiconductor structure of aspect 156, or the semiconductor device of aspect 157.

Aspect 161. A semiconductor device comprising the semiconductor structure of any one of aspects 1-112, 144, and 156, or the semiconductor layer of any one of aspects 150 and 155.

Aspect 162. The semiconductor device of aspect 161, wherein the semiconductor device comprises an optoelectronic device.

Aspect 163. The semiconductor device of aspect 162, wherein the optoelectronic device comprises a light-emitting diodes (LED), edge-emitting laser diodes (EELD), vertical-cavity surface-emitting lasers (VCSEL), and resonant-cavity LEDs (RCLED).

Aspect 164. The semiconductor device of any one of aspects 161 to 163, wherein the semiconductor device comprises two or more optoelectronic devices.

Aspect 165. The semiconductor device of aspect 164, wherein each of the optoelectronic device is configured to emit electromagnetic radiation within a single wavelength range.

Aspect 166. The semiconductor device of aspect 165, wherein each of the optoelectronic device is configured to emit electromagnetic radiation within multiple wavelength ranges.

Aspect 167. The semiconductor device of any one of aspects 161 to 163, comprising two or more of the semiconductor structures.

Aspect 167. The semiconductor device of aspect 167, comprising an optoelectronic element independently overlying each of the two or more semiconductor structures.

Aspect 168. The semiconductor device of aspect 168, wherein each of the optoelectronic elements is configured to emit electromagnetic radiation within a different wavelength range.

Aspect 170. The semiconductor device of any one of aspects 168 to 169, wherein each of the optoelectronic elements independently comprises and active region.

Aspect 171. The semiconductor device of aspect 170, wherein each of the active regions is lattice matched to the underlying relaxed In-containing III-nitride layer.

Aspect 172. The semiconductor device of aspect 168, wherein each of the optoelectronic elements comprise a light-emitting diodes (LED), edge-emitting laser diodes (EELD), vertical-cavity surface-emitting lasers (VCSEL), and resonant-cavity LEDs (RCLED).

Aspect 173. The semiconductor device of any one of aspects 161 to 172, wherein each of the two or more semiconductor structures are disposed in a lateral configuration.

Aspect 174. The semiconductor device of any one of aspects 161 to 172, wherein each of the two or more semiconductor structures are disposed in a vertical configuration.

Aspect 175. The semiconductor device of any one of aspects 164 to 166, wherein the two or more optoelectronic devices are vertically stacked.

Aspect 176. The semiconductor device of any one of aspects 164 to 166, wherein the two or more optoelectronic devices are situated in a lateral configuration.

Aspect 177. The semiconductor device of any one of aspects 161 to 166, wherein the two or more optoelectronic devices share a common substrate.

Aspect 178. The semiconductor device of any one of aspects 164 to 166, wherein the two or more optoelectronic devices share one or more common epitaxial layers.

Aspect 179. The semiconductor device of any one of aspects 164 to 166, comprising drive circuitry for independent addressable control of each optoelectronic device.

Aspect 180. The semiconductor device of any one of aspects 164 to 166, wherein the drive circuitry comprises CMOS-compatible drive circuitry.

Aspect 181. A wafer comprising the semiconductor device of any one of aspects 161 to 180.

Aspect 182. A system comprising the semiconductor device of any one of aspects 161 to 180, wherein the system comprises a display, an augmented reality system, virtual reality system, head-up display, projection system, a television system, a monitor, or a lighting systems.

Aspect 183. An optical system comprising the semiconductor device of any one of aspects 161 to 180.

Aspect 184. The optical system of aspect 180, wherein the optical system comprises a laser projector, a laser television, a cinema projector, a head-up display, an augmented reality and/or virtual reality wearable, an augmented reality and/or virtual reality display, high-speed interconnects, a sensing system, a light detection and ranging apparatus (LiDAR) system, a communication system, a medical device, machining equipment, or additive manufacturing equipment.

Aspect 185. A semiconductor structure comprising: a III-nitride base layer: a plurality of slip regions disposed non-uniformly on or proximate to a surface of the III-nitride base layer, the slip regions being formed without lithographic patterning; and a relaxed $In_xAl_yGa_{1-x-y}N$ layer grown over the base layer and slip regions, wherein the relaxed $In_xAl_yGa_{1-x-y}N$ layer planarizes topographical features of the base layer and provides a substantially smooth growth surface for subsequent epitaxy.

Aspect 186. A method comprising: providing a III-nitride base layer; forming slip regions on or near a surface of the base layer without lithographic patterning: epitaxially growing a first relaxed $In_xAl_yGa_{1-x-y}N$ layer over the base layer and slip regions; and epitaxially growing a second III-nitride layer over the first layer, the second layer having a higher indium content and compressive strain relative to the first layer.

Aspect 187. A light-emitting structure comprising: a first relaxed $In_xAl_yGa_{1-x-y}N$ layer disposed over a III-nitride base layer: a first active region disposed over the first relaxed layer; a second relaxed $In_xAl_yGa_{1-x-y}N$ layer disposed over the first active region; and a second active region disposed over the second relaxed layer, wherein the first and second relaxed layers have different in-plane lattice constants and enable emission at different wavelengths.

Aspect 188. In a III-nitride semiconductor structure comprising a relaxed $In_xAl_yGa_{1-x-y}N$ layer disposed over a III-nitride base layer, the improvement comprising: a plurality of non-lithographically defined slip regions positioned on or proximate to the surface of the base layer, wherein the relaxed layer is grown over the slip regions and exhibits an in-plane lattice constant different from that of the base layer.

Aspect 189. Use of a III-nitride semiconductor structure comprising a relaxed $In_xAl_yGa_{1-x-y}N$ layer grown over a base layer with interspersed, non-lithographically defined slip regions, for enabling wavelength-stable emission from a light-emitting device selected from a LED, EELD, VCSEL, or RCLED.

Aspect 190. A bulk relaxed Wurtzite In-containing III-nitride layer comprising a first interface and a first interface region, wherein the first interface region is characterized by: a single-phase gallium-polar (0001) orientation: a Wurtzite In-containing III-nitride material comprising a first InN mole fraction, wherein the first InN mole fraction is greater than 0; and a substantially relaxed in-plane a-lattice parameter, wherein the layer has a thickness greater than 100 nm; and the Wurtzite In-containing III-nitride material comprises $In_xAl_yGa_{1-x-y}N$, where $0<x\leq0.4$ and $0\leq y<1$.

Aspect 191. The bulk relaxed layer of aspect 190, wherein the first interface region is characterized by: (a) a root-mean-square surface roughness less than 1 nm over a 1×1 µm$^2$ area, and (b) a pit density less than $1\times10^9$ cm$^{-2}$, as determined by atomic force microscopy or electron microscopy.

Aspect 192. The bulk relaxed layer of aspect 190, wherein the (002) symmetric XRD linewidth is less than 300 arcsec and the asymmetric (105) linewidth is less than 1500 arcsec.

Aspect 193. The bulk relaxed layer of aspect 190, wherein the first interface region is characterized by a substantially pit-free surface morphology.

Aspect 194. The bulk relaxed layer of aspect 190, wherein relaxation occurs via misfit dislocation formation near the interface and dislocation termination within the layer, enabling strain relaxation.

Aspect 195. A semiconductor structure comprising: a GaN layer comprising a slip region having a periodic array of pyramidal features; and a bulk relaxed Wurtzite $In_xGa_{1-x}N$ layer overlying the slip region, wherein the layer exhibits an InN mole fraction between 1% and 40% and a substantially relaxed in-plane a-lattice parameter.

Aspect 196. A semiconductor structure comprising: a first bulk relaxed $In_{x1}Ga_{1-x1}N$ layer overlying a GaN layer, and a second bulk relaxed $In_{x2}Ga_{1-x2}N$ layer overlying the first layer, wherein $x_2>x_1$, and each layer has a thickness greater than 100 nm and is substantially relaxed.

Aspect 197. A wafer comprising a substrate and a bulk relaxed Wurtzite In-containing III-nitride layer overlying the substrate, wherein the wafer is suitable for epitaxial regrowth of III-nitride optoelectronic structures.

Aspect 198. A semiconductor structure comprising the bulk relaxed Wurtzite In-containing III-nitride layer of aspect 190 overlying an engineered substrate incorporating a III-nitride layer.

Aspect 199. A method of forming a bulk relaxed Wurtzite In-containing III-nitride layer, comprising\growing $In_xAl_yGa_{1-x-y}N$ under metal-rich MOCVD conditions, wherein $0<x\leq0.4$ and $0\leq y<1$, such that the grown layer comprises a substantially relaxed in-plane a-lattice parameter and a smooth surface morphology.

Aspect 200. The method of aspect 199, wherein the In-containing III-nitride layer is grown on a patterned GaN slip region comprising pyramidal features having a height from 0.1 µm to 20 µm.

Aspect 201. A method of forming a semiconductor device comprising: growing an active optoelectronic device structure on the bulk relaxed layer of aspect 190, wherein the active region is configured to emit at a wavelength between 520 nm and 650 nm.

EXAMPLES

The following examples describe in detail bulk relaxed Wurtzite In-containing III-nitride layers provided by the present disclosure, semiconductor structures comprising the bulk relaxed layers, semiconductor devices comprising the bulk relaxed layers, and methods of making the bulk relaxed layers, semiconductor structures, and semiconductor devices. It will be apparent to those skilled in the art that many modifications, both to materials and methods, may be practiced without departing from the scope of the invention.

Comparative Example 1

Fast-Growth MOCVD of InGaN on GaN

"Thick" (e.g., >100 nm) InGaN layers grown on GaN regardless of the underlying substrate by MOCVD are associated with large pits and a high dislocation density.

FIG. 1 shows a SEM plan-view of an about 400 nm-thick, InGaN layer having an InN mole fraction of about 10% on GaN/sapphire grown by MOCVD using conventional (N-rich) conditions, showing trench defects and large pits (up to about 300 nm in diameter) formed at threading dislocations.

Due to the conventional (N-rich) growth conditions and low temperature growth required for InGaN under these conditions, large pits open up in the layer, nucleating at threading dislocation cores in the GaN template. As a result, N-rich InGaN growth conditions are only useful for providing very thin InGaN layers such as quantum wells, interlayers, and super-lattices.

Comparative Example 2

Fast-Growth MOCVD of InGaN on GaN

To achieve thick, substantially pit-free InGaN films, fast-growth MOCVD of InGaN on GaN by using TMG was explored for high growth rates of up to 4 µm/hr. The growth was carried out at 760° C. under a reactor pressure at 400 mbar. During growth, the ammonia flow rate and TMI flow rate were fixed at 6,000 sccm and 350 sccm, respectively, with $N_2$ used as the carrier gas. The total flow rate of TMG predominantly determined the growth rate. For example, a TMG flow rate of about 50 sccm provided a growth rate of about 2 µm/hour. See FIG. 2. The total gas flow rate (MO, $NH_3$ and carrier gas) entering the reactor was fixed at 12,000 sccm. The V/III ratio was about 2100 (real TMG flow rate was 2.36 sccm, TMI flow rate was 0.49 sccm).

These growth conditions resulted in a bulk, substantially relaxed, InGaN film having an InN mole fraction of about 10% (as determined XRD RSM—not shown), but with a rough surface morphology.

Example 3

Metal-Rich MOCVD Growth of InGaN on GaN

Bulk relaxed InGaN films having improved surface morphology compared to InGaN films grown using fast-growth MOCVD conditions as in Example 2 were grown on GaN templates with a slip region using "metal-rich" MOCVD growth conditions with lower ammonia flow rates.

InGaN growth on a 1.75 µm-thick GaN template was carried out at 760° C. under a reactor pressure at 400 mbar. The total gas flow rate (MO, $NH_3$ and carrier gas) in the reactor was fixed at 8,000 sccm. For a growth rate of around 2 µm/hour, the TMG and TMI flow rates were fixed at 50 sccm and 350 sccm, respectively, with $N_2$ used as the carrier gas. For growth of this MR InGaN thick layer, the ammonia flow rate was fixed at 200 sccm. The V/III flow rate ratio was 65. After one hour of growth, an approximately 1.75 µm-thick, smooth and substantially pit-free InGaN layer was obtained. The template was a GaN/sapphire structure, i.e., a planar GaN template overlying a sapphire substrate.

Figure 7A:
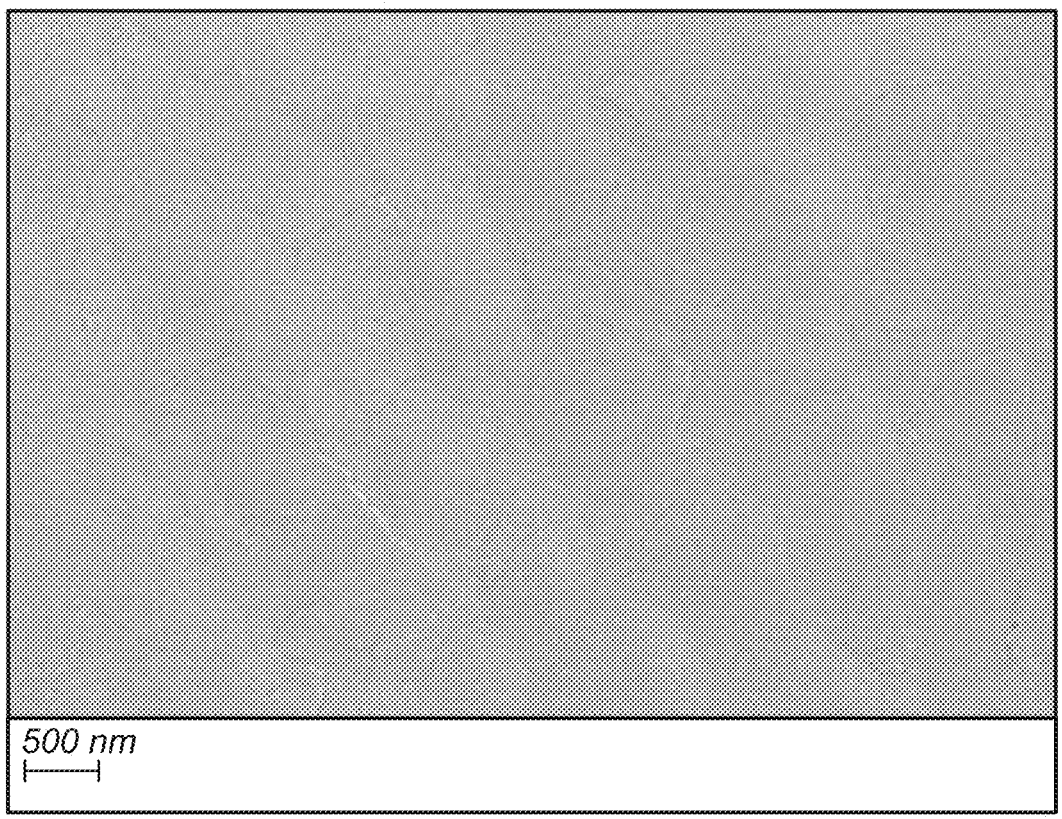
FIGS. 7A-7B show a plan-view (FIG. 7A) and cross-sectional view (FIG. 7B) of a thick, relaxed MR InGaN layer having an InN mole fraction of about 8% grown under metal-rich (MR) MOCVD conditions, having a smooth and substantially pit-free surface morphology.
Figure 7B:
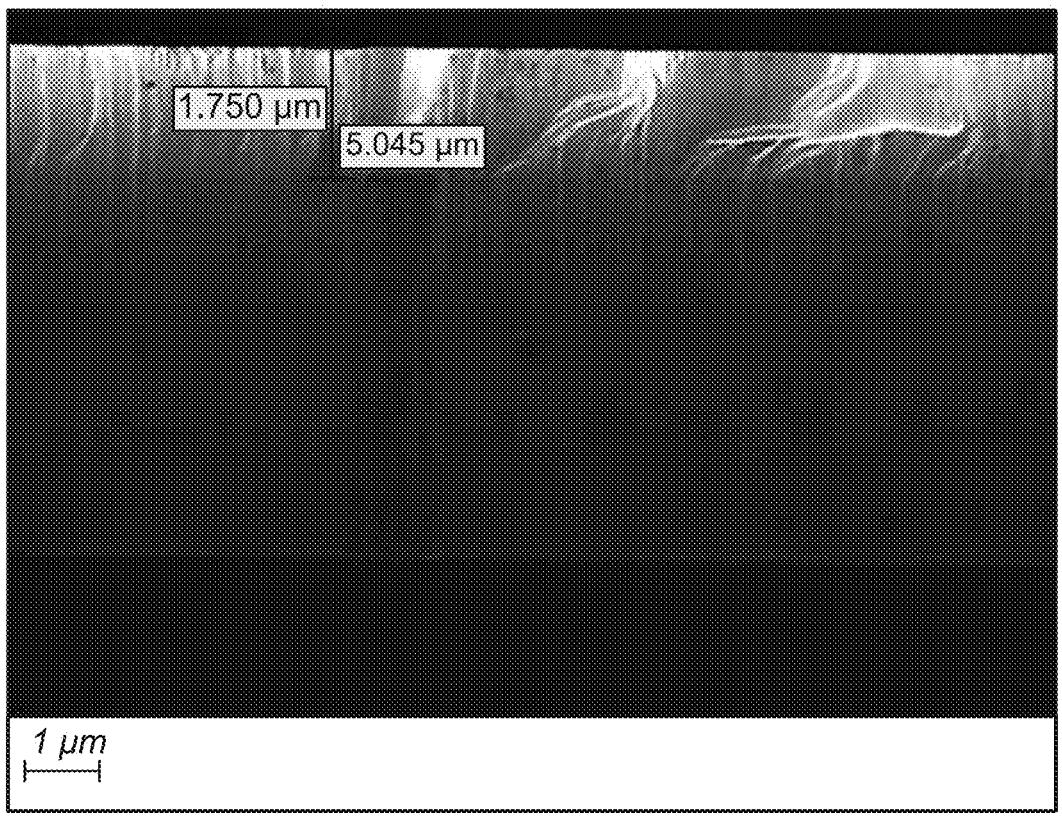

A plan-view and a cross-sectional view of the thick relaxed InGaN layer having an InN mole fraction of about 8% is shown in FIGS. 7A and 7B, respectively.

The growth regime within this window is referred to as "metal rich" (MR) InGaN.

The surface smoothness was characterized by atomic force microscopy (AFM) and had an RMS roughness of 4.3 nm over a scanning area of 4×4 µm², and 0.7 nm over a scanning area of 1.5×1.5 µm² for a 1.75 µm-thick relaxed InGaN layer having an InN mole fraction of 8%. The interface region was smooth and free of pits.

X-ray diffraction (XRD) analysis of the InGaN layer shown in FIGS. 7A-7B was consistent with high-quality, single-phase layer for the MR InGaN, of about 8% InGaN and fully relaxed. The ω-2θ XRD curve is shown in FIG. 8.

The 002 (symmetric) diffraction full-width-at-half-maximum (FWHM) is 250 arcsec. The 211 asymmetric (not shown) was 1,800 arcsec, suggesting an edge dislocation density of greater than 1E10 cm$^{-2}$.

InGaN multiple-quantum-well (MQW) structures were simultaneously grown on MR InGaN templates (InN mole fraction of about 8%) and on conventional GaN/sapphire templates. As shown in FIG. 9A, the MQW structures grown on the relaxed MR InGaN film showed a sharp room-temperature photoluminescence (PL) peak (excitation at 325 nm) with a consistent red-shift of about 50 nm in peak emission wavelength compared to the MQW structures grown on GaN/sapphire, consistent with an increase in MQW InN mole fraction of greater than 5%. This result demonstrates that the relaxed InGaN interface region can facilitate increased In incorporation in overlying device layers. See FIG. 9B.

Figures 10A, 10B:
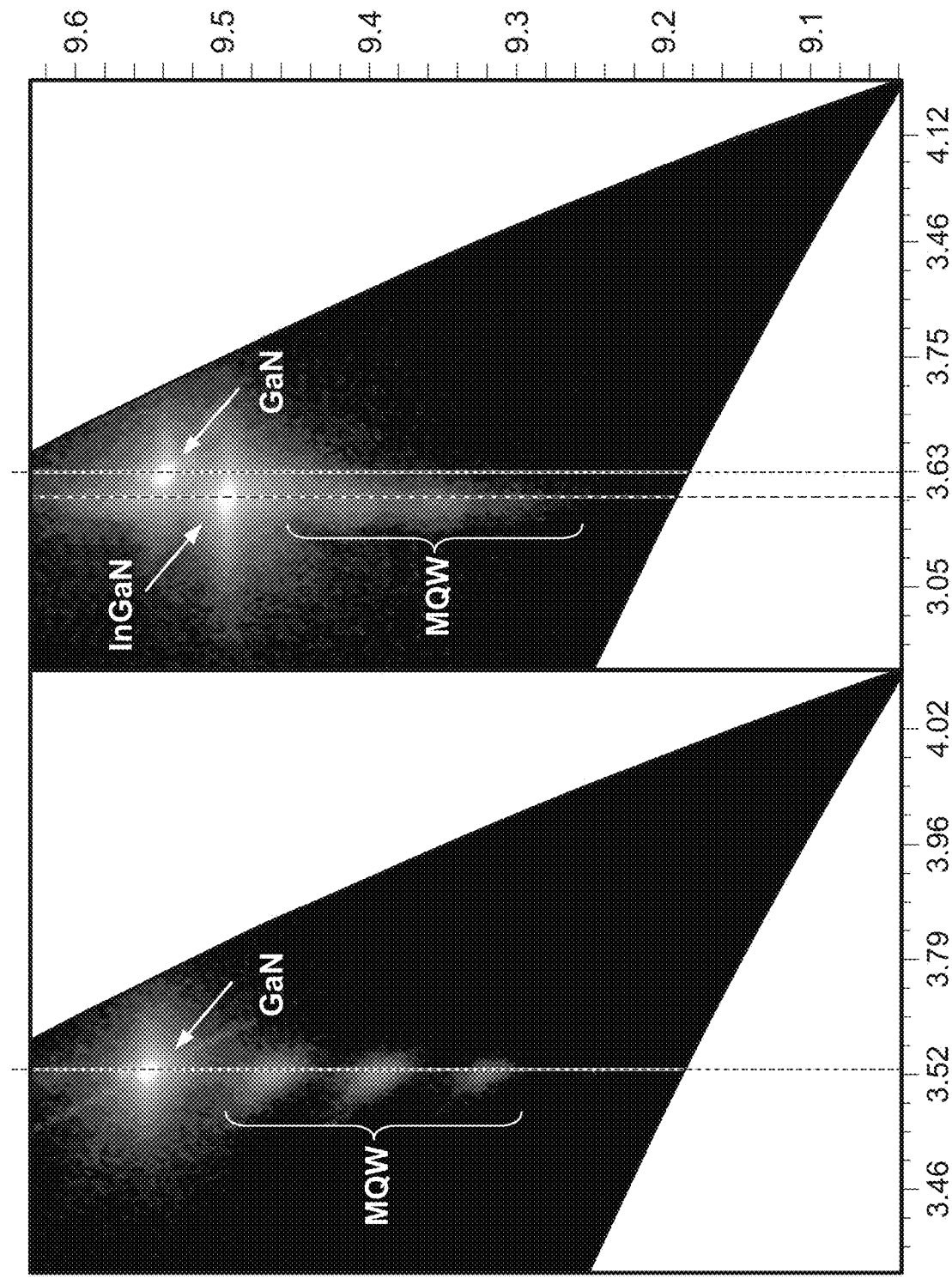
FIGS. 10A-10B show XRD reciprocal space map (RSM) images of MQW structures grown simultaneously on GaN (FIG. 10A) and on relaxed MR InGaN layers (8% InN mole fraction) (FIG. 10B).

As shown in FIG. 10A. XRD reciprocal space maps (RSM's) of the MQWs grown on GaN show that the MQW layer were pseudomorphic to (e.g., lattice-locked) to GaN. In contrast, as shown in FIG. 10B, the MQWs grown on MR InGaN were pseudomorphic to the underlying relaxed MR InGaN base layer.

Relaxation (e.g., in-plane lattice dilation) in the MR InGaN base layer reduces the strain of the MQW layers compared to the MQW layers grown on GaN under the same conditions. Epitaxial growth on MR InGaN allows for incorporation of a higher InN mole fraction and/or thicker quantum wells which can improve device efficiency, as well as enable achieving longer wavelength emission.

A thick MR InGaN layer was grown on a GaN/sapphire template at a growth temperature of 760° C. under reactor pressure at 400 mbar. The total gas flow (MO, $NH_3$ and carrier gas) was 8,000 sccm. The TMG and TMI flows were fixed at 50 sccm and 350 sccm, respectively, with $N_2$ used as the carrier gas (real TMG flow rate was 2.36 sccm; real TMI flow rate was 0.49 sccm). The ammonia flow was fixed at 250 sccm. The V/III ratio was about 88. After one hour of MR MOCVD growth, an InGaN layer with an interface region having a smooth and substantially pit-free morphology was obtained. XRD RSM data (not shown) indicated the InGaN layer as about 100% relaxed with an a-lattice spacing of about 3.22 Å, corresponding to an InN mole fraction of about 9%. An InGaN spacer layer (about 110 nm thickness) and a 5×MQW stack (3 nm InGaN wells, separated by 8 nm GaN barriers) was grown on the thick, relaxed InGaN layer. This film was characterized by TEM and EDX.

Figure 11:
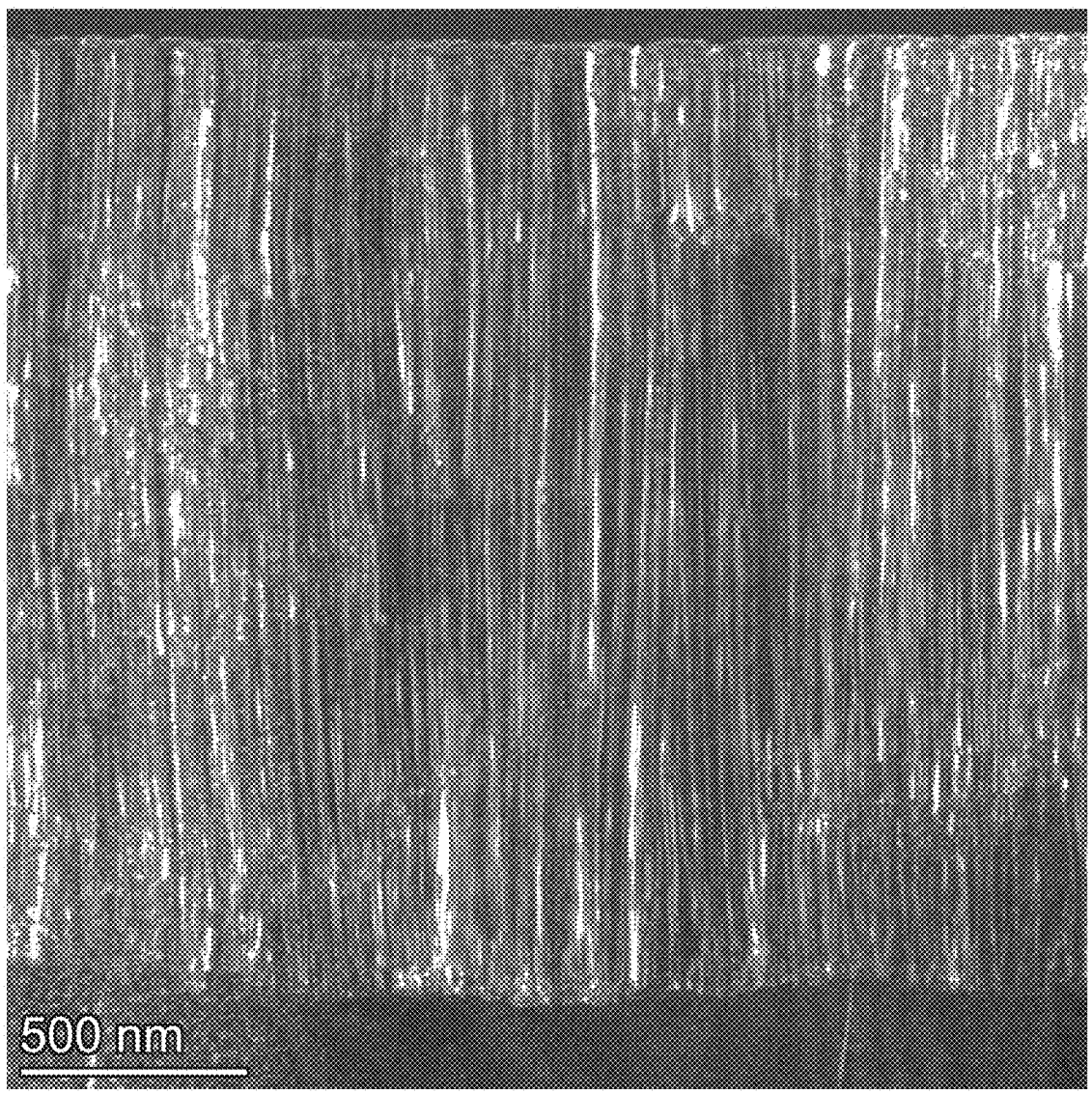
FIG. 11 shows a bright field transmission electron microscopy (TEM) image of a GaN/InGaN heterojunction.

Weak-beam dark field TEM showed that the total structure thickness was about 2.1 µm. Bright-field TEM with g=(1-210) showed a high density of edge dislocations from the GaN/InGaN interface region and propagating upward throughout the film. See FIG. 11.

Figure 12:
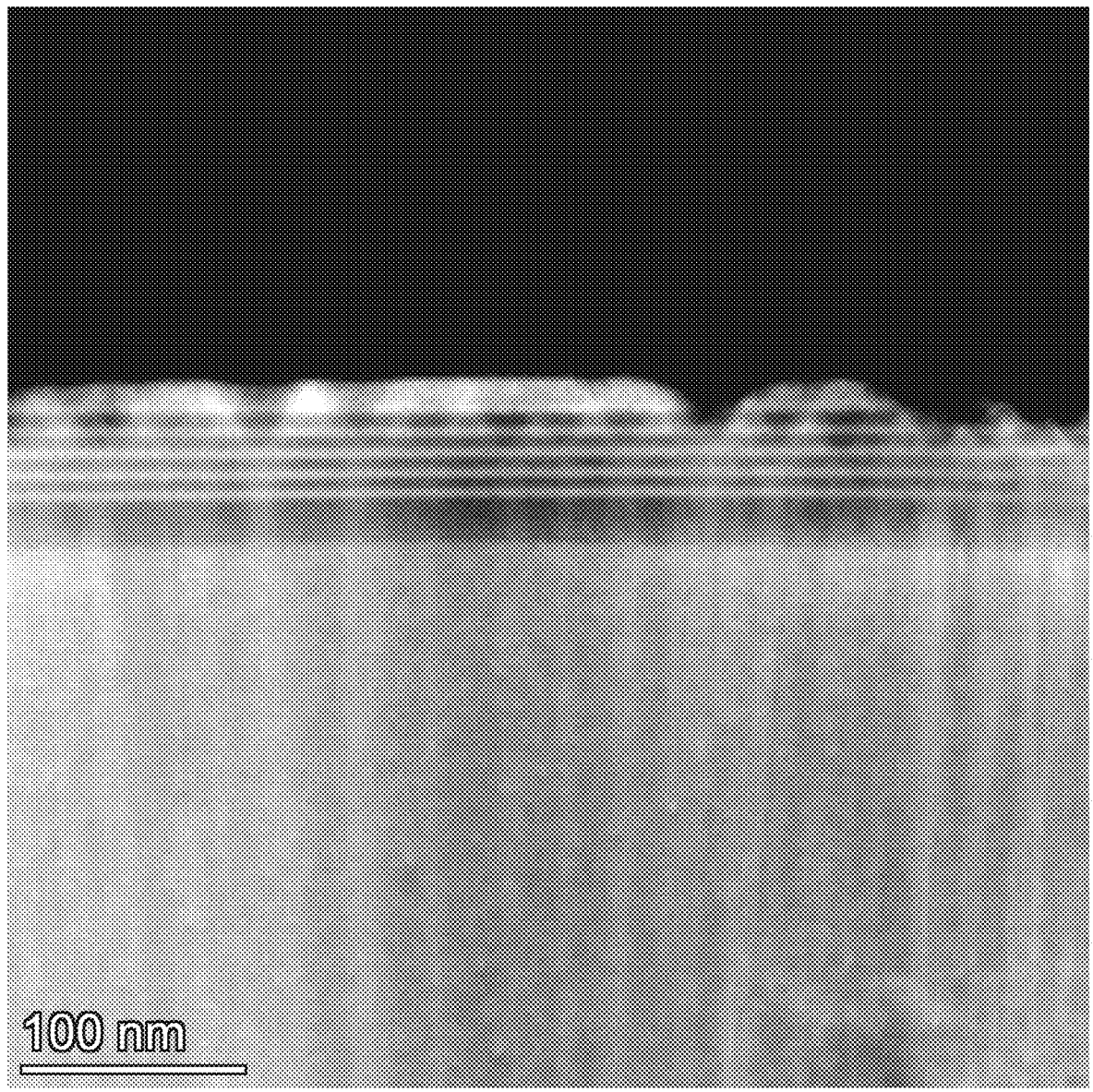
FIG. 12 shows a high-angle annular dark-field (HAADF) scanning transmission electron microcopy (STEM) image obtained using the Z-contrast method with zone axis diffraction condition [1-100] of a multi-quantum well stack grown on relaxed MR InGaN.

Despite the high edge dislocation density, as confirmed using High-Angle Annular Dark-Field (HAADF) Scanning Transmission Electron Microscopy (STEM) and Z-contrast method with zone axis diffraction condition [1-100], the structure of the MQW stack grown on the relaxed InGaN layer was observed to be of high quality as shown in FIG. 12.

Referring to FIG. 12, the corrugated surface at the top of the structure is due to V-pits which open up at dislocations during MQW growth, which was performed under standard N-rich conditions, as opposed to the underlying InGaN layer grown using metal-rich conditions. Nevertheless, as is evident by the first three QWs, the QW structure was intact, of high quality, and exhibited smooth interfaces. The QWs exhibited bright peak emission at about 500 nm under PL excitation at 325 nm (data not shown).

A vertical line-scan using Energy Dispersive X-ray Spectroscopy (EDX) was performed on the structure, and confirmed a relatively uniform InGaN mole fraction, from about 8% to about 9%, throughout the thickness of the MR InGaN layer, as shown in FIG. 13, consistent with the XRD RSM data.

Example 4

Metal-Rich MOCVD Growth of InGaN on GaN/Sapphire Wafer

Another relaxed InGaN growth was carried out essentially similar to that of Example 3. In this example, the growth was carried out across the full face of a 50 mm diameter GaN/sapphire template, and was characterized at (5) different locations across the wafer. The morphology across the full 50-mm diameter epi-wafer was glass smooth. XRD RSM (FIGS. 14A-14F) at the different locations show an about 2 μm-thick, relaxed InGaN layer with an InN mole fraction of about 9%. ω-2θ XRD scans at each position are shown in FIGS. 15A-15E and clearly show that the diffraction peak associated with the crystalline relaxed InGaN layer is distinct from the diffraction peak associated with the GaN layer (solid curve is measured: dotted curve is simulated).

The inventors found that in assessing the quality of the relaxed InGaN film, a reliable metric involves analyzing the ω-2θ XRD scan for specific characteristics. High-quality films typically exhibit sharp, Lorentzian-like diffraction profiles without any "bulges" or "side lobes," which are indicative of a uniform and well-ordered crystal structure. Conversely, the presence of these features in the XRD profile suggests lower quality, often due to faceting and mixed composition, typically resulting in a composition deviation of about twice the target value, for InGaN. The metric entails examining the diffraction intensity of the relaxed film at a position Δθ away from its peak intensity, where Δθ is the angular difference, in degrees, between the GaN (substrate or template) XRD peak and the XRD peak of relaxed InGaN film. At this location, in the direction opposite that of the GaN peak, the intensity should drop to at least three, for example, at least four or more, orders of magnitude lower than the XRD peak intensity of the relaxed InGaN film. Alternatively, a reduction in intensity should at least be within 10× of the intensity reduction of the diffracted peak intensity measured at an angular distance Δθ away from the GaN layer peak intensity in a direction opposite that of the XRD peak of the relaxed InGaN film. If the intensity at Δθ does not exhibit this significant reduction in intensity, the inventors typically observed that the film has structural imperfections and compositional inconsistencies, that is, characteristics of a lower quality film.

Energy-dispersive X-ray (EDX) spectroscopy was performed at each of the five positions and the average values of the InN mole fraction is shown in Table 7.

TABLE 7

| InN Mole Fraction. | |
| --- | --- |
| Region | InN Mole Fraction |
| pt0 | 9.3% |
| pt1 | 9.9% |
| pt2 | 9.6% |
| pt3 | 8.6% |
| pt4 | 8.6% |

The surface of the epi-wafer at each position is characterized by a smooth, substantially pit-free morphology.

Example 5

Fabrication of Patterned Template Comprising Pyramidal GaN Seed Structures

A planar layer of nominally undoped (0001) GaN layer on a (flat) (0001) sapphire substrate was provided. The total thickness of the GaN layer was about 3 μm and was deposited by metalorganic chemical vapor deposition (MOCVD).

A 45 nm-thick masking layer of plasma-enhanced chemical vapor deposition (PECVD) $SiN_x$ was deposited onto the surface of the GaN layer. The masked substrate was then coated with photoresist and patterned using laser-lithography to define nominally 1.5 μm-diameter circular holes on a 3.5 μm-pitch in a hexagonal pattern. The patterned wafer was then subjected to dry etching in a fluorine ($CHF_3/O_2$) chemistry to remove the $SiN_x$ masking layer and to expose the underlying GaN layer in the regions defined by the holes. The photoresist was then removed by inserting the wafer into a photoresist-stripper Microposit™ Remover 1165 (Dow Chemical Company) at 70° C. for 2 hours followed by an ultrasonic bath cleaning and rinsing step using deionized water.

The template with the patterned mask layer was then placed in a MOCVD reactor for growing the pyramidal GaN structures on the exposed GaN layer such that each pyramidal GaN structure was nominally a fully formed pyramid with a single sharp apex and consisting of six terminated (10-11) GaN facets. The GaN pyramid growth was initiated by flowing ammonia and trimethylgallium (TMGa) into the MOCVD reactor at 900° C. for 1 min and then the temperature was ramped to 1,020° C., after which the growth continued for 11 mins. The temperature ramp-up lasted for 3 min without interruption of growth. During GaN growth the ammonia flow rate and TMGa flow rate were fixed at 3,600 sccm and 10 sccm respectively, with $H_2$ used as carrier gas with a flow rate of 4,400 sccm under a reactor pressure at 150 mbar. The hexagonal base of the pyramidal GaN structures are grown to extend slightly beyond the diameter of the holes in the mask layer.

Figure 16A:
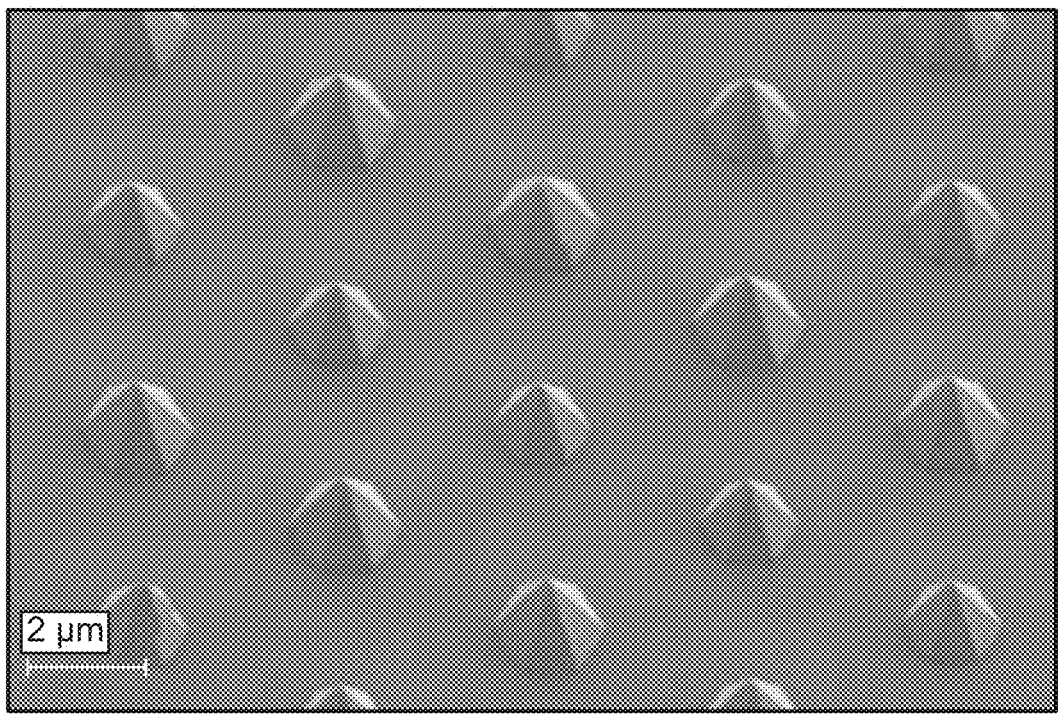
FIGS. 16A-16B show a perspective view (FIG. 16A) and a plan-view (FIG. 16B) of a patterned GaN template consisting of a hexagonal array of pyramidal GaN structures having a height of about 15 μm on a pitch of about 3.5 μm.
Figure 16B:
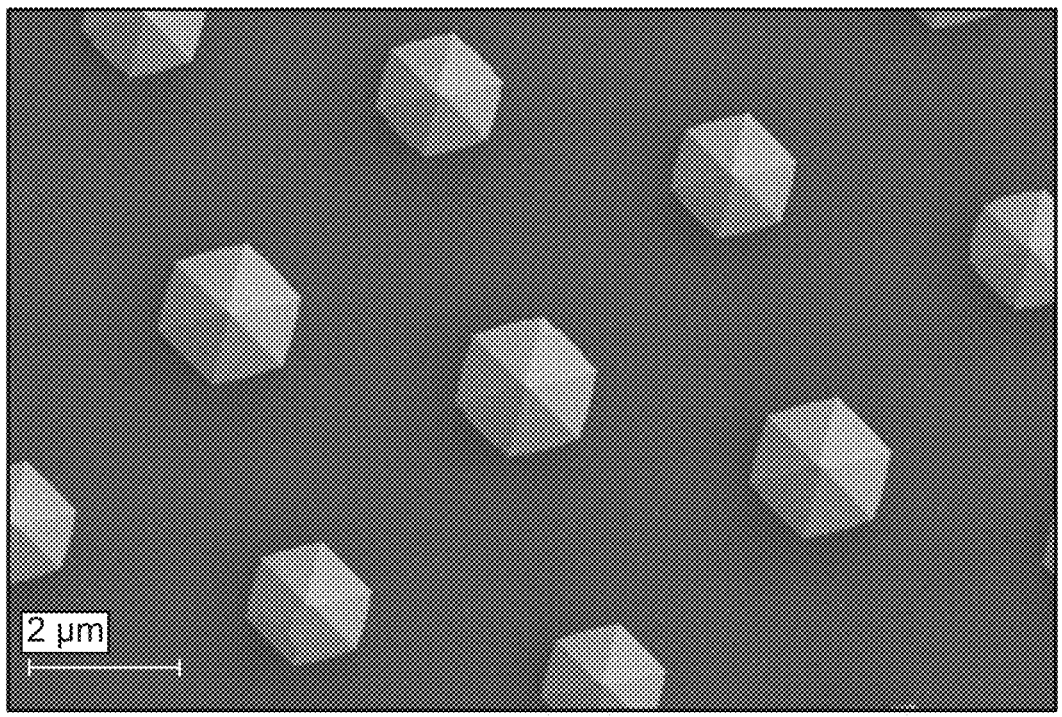

The resulting GaN pyramidal structures are shown (from a stop-growth perspective) in the plan-view SEM micrographs shown in FIGS. 16A-16B.

Figure 17:
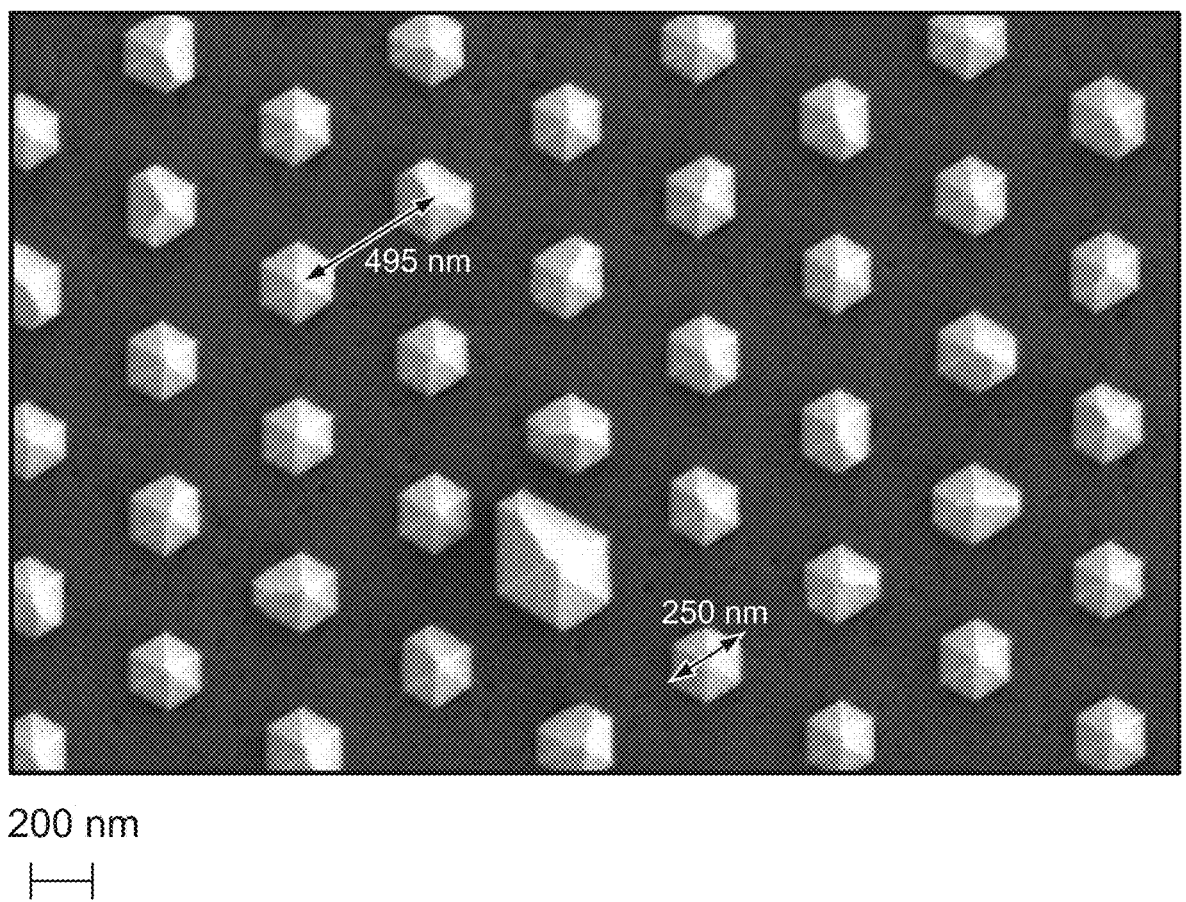
FIG. 17 shows a patterned GaN template consisting of a hexagonal array of pyramidal GaN structures having a width of about 250 nm on a pitch of about 500 nm.

A similar processing and growth procedure can be used to generate nano-scale pyramids. For example, a stepper aligner was used to lithographically define the mask pattern, and then about 250-nm wide pyramidal GaN protrusions on a pitch of about 500 nm, in a hexagonal arrangement, were grown on a $SiN_x$ patterned GaN template. A SEM plan-view of these structures is shown in FIG. 17.

Example 6

Fabrication of a Relaxed InGaN Layer on Pyramidal Seeds Using MOCVD

The reactor growth conditions were changed for growing InGaN having a high InN mole fraction, such as a InN mole fraction greater than 5% on the {10-11} facets of the GaN pyramidal structures provided in Example 5. The InGaN growth was performed at 760° C. under a 400 mbar reactor pressure. The hydride source was NH$_3$ (6,000 sccm) and the metalorganic sources were triethylgallium (TEGa) (70 sccm) and trimethylindium (TMIn) (75 sccm). The carrier gas was pure N$_2$ (6,000 sccm). Different samples with increasing thicknesses of InGaN where grown corresponding to growth times of about 230 sec, about 1,380 sec, and about 8,280 sec, corresponding to InGaN layer thicknesses of about 20 nm, about 120 nm, and about 400 nm, respectively. After InGaN growth was terminated the pyramidal InGaN/GaN structures were characterized by scanning electron microscopy (SEM), and X-ray diffraction (XRD).

Figure 18A:
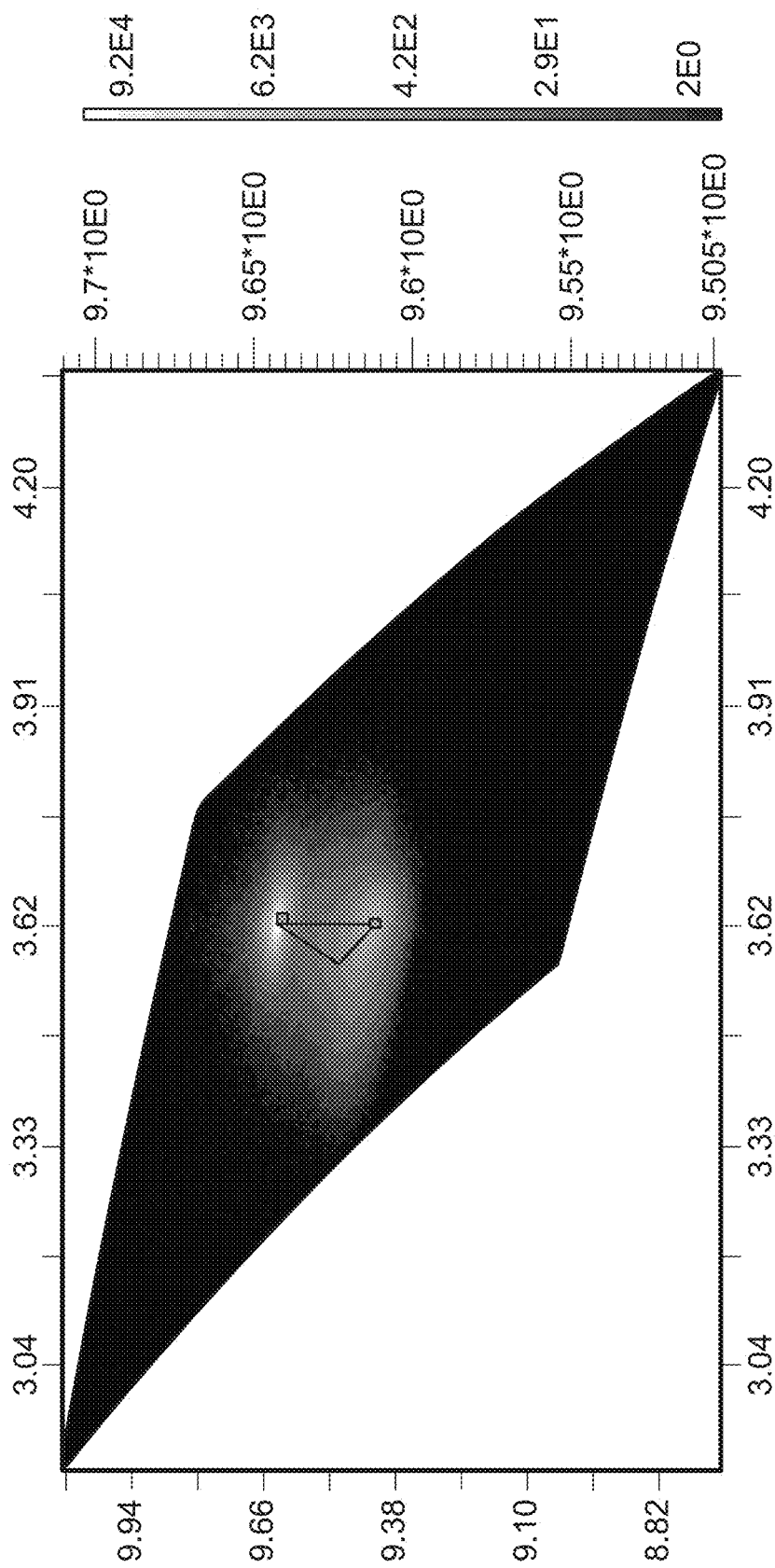
FIGS. 18A-18B show XRD RSM images of a 400 nm-thick InGaN layer (14% InN mole fraction, substantially strained) grown on planar GaN (FIG. 18A) and a 400 nm-thick InGaN layer (11% to 12% InN mole fraction, substantially relaxed) grown on GaN pyramidal structures (FIG. 18B) as described in Example 6 using MR MOCVD.
Figure 18B:
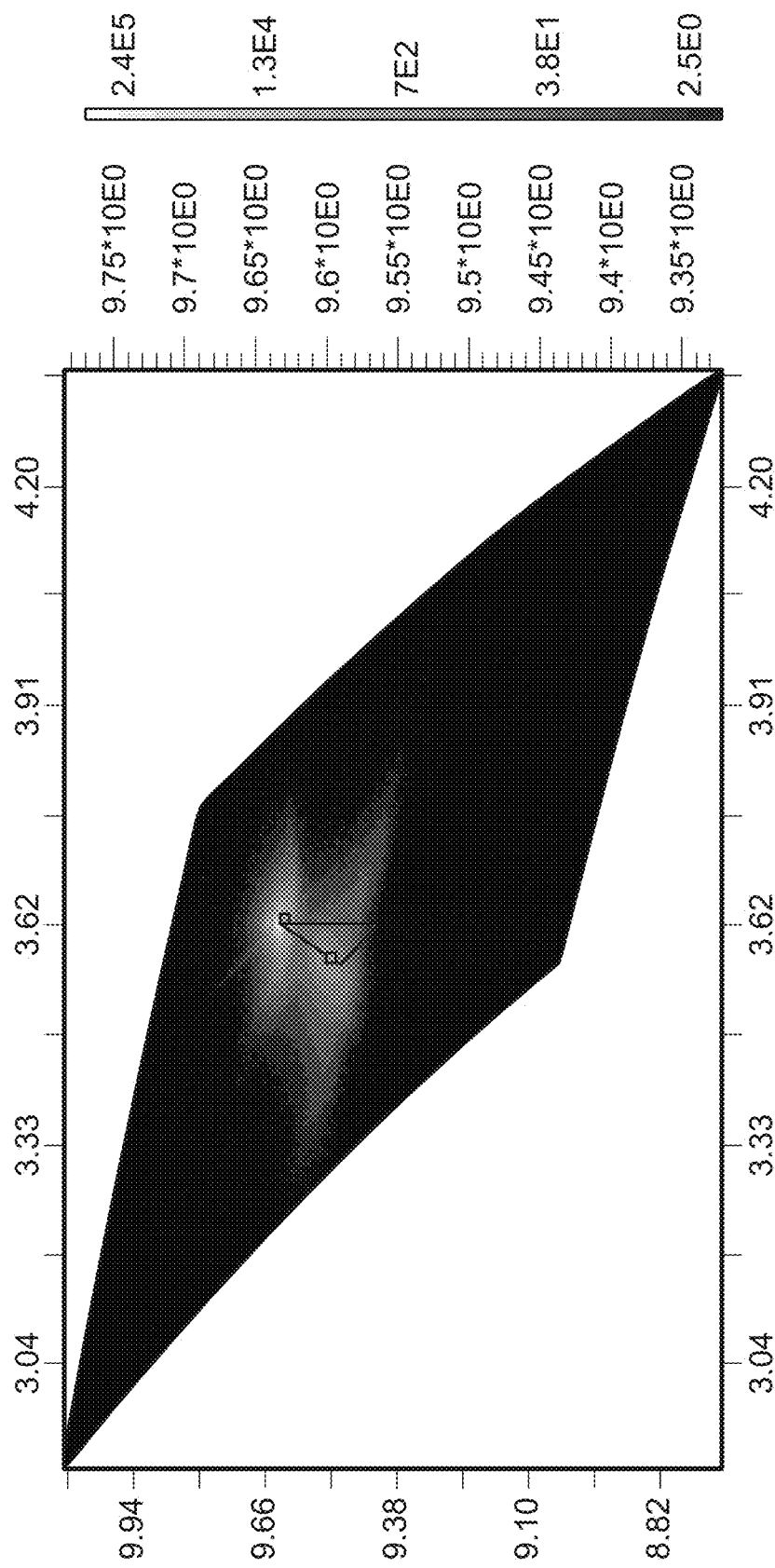

XRD reciprocal space maps (RSM's) were generated for the 400 nm-thick InGaN/GaN pyramidal structures and compared to InGaN grown under the same conditions, but on a planar (0001) GaN template. For the latter, an about 90% pseudomorphic (i.e., nearly fully strained) InGaN layer, with a calculated InN mole fraction of 14%, was observed (see FIG. 18A). For the InGaN/GaN pyramidal structures, a shifted InGaN peak was observed in the RSM, and is consistent with a nearly completely relaxed InGaN layer with an InN mole fraction of about 12% (see FIG. 18B). Considering the low fill-factor and thickness of the InGaN layer compared to the underlying pyramidal GaN template, the brightness of the RSM signal suggests the formation of high quality InGaN growth and that the InGaN grown on each of the GaN structures has a similar morphology and composition. The a-lattice parameter of the relaxed InGaN layers was calculated to be 3.23 Å, assuming 3.189 Å for the underlying pyramidal GaN structure (consistent with the estimate typical for GaN on sapphire).

To elucidate more details about the InGaN layer relaxation, a "sandwich" structure was grown and analyzed. For this sandwich structure, after the array of pyramidal GaN structures with {10-11} facets were formed, a first multiple-quantum-well (MQW) "marker" stack was grown overlying the GaN structures, followed by a relatively thick InGaN layer having an InN mole fraction of about 14%, and followed by a second "MQW "marker" stack. The two MQW stacks had identical epitaxial structures with 10 periods of GaN/InGaN pairs (growth time of 45 sec and 25 sec, respectively, corresponding to 4.8 nm-thick GaN and 2.7 nm-thick InGaN layers). The first MQW was grown at 780° C. immediately after the pyramidal GaN structures were formed. The thick InGaN layer was grown at 760° C. for 183 mins to a thickness of about 500 nm. The second MQW was grown at 780° C. Apart from the growth temperature and the switch-off of the TEGa source during GaN growth, all other growth conditions for this MQW sandwich stack were the same as those for InGaN growth on the pyramidal GaN structures.

Figure 19:
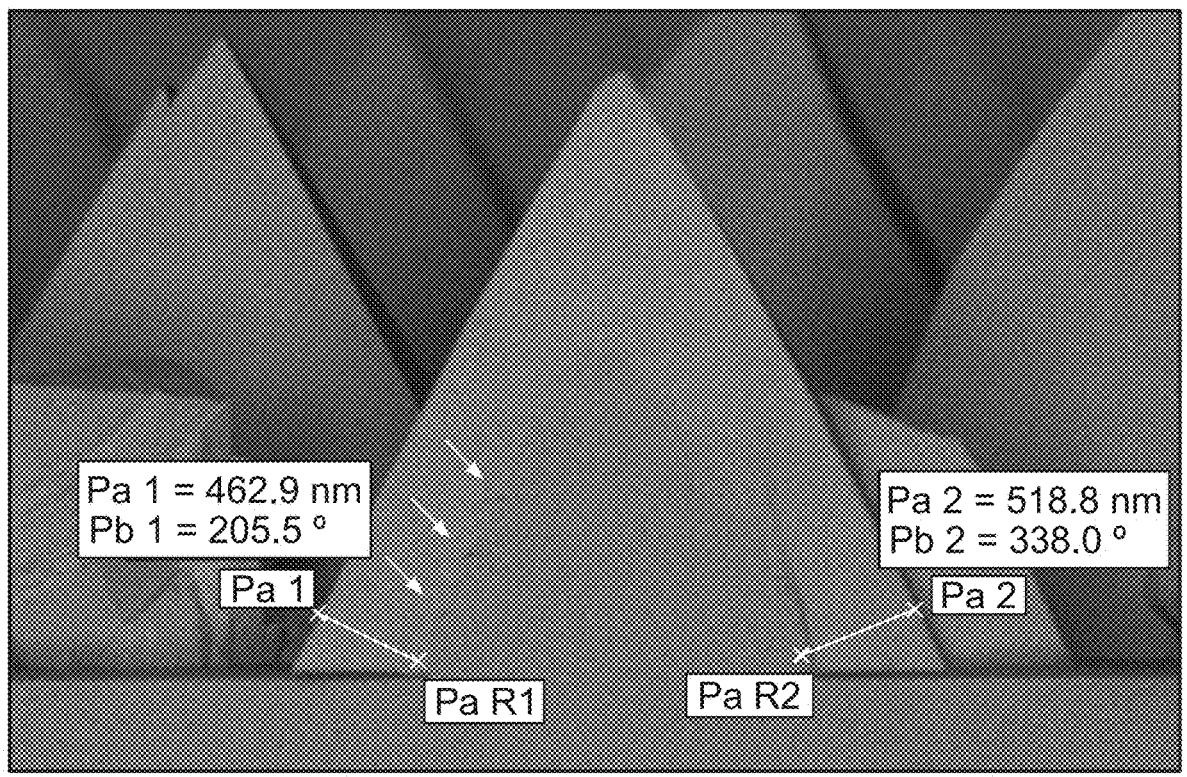
FIG. 19 shows an SEM micrograph of a cleaved cross-sectional view through an InGaN/GaN heterojunction that is parallel to (10-11) pyramid facets.

A SEM micrograph of a cleaved cross-section through the MQW sandwich structure is shown in FIG. 19. This image shows the brightness contrast between the GaN and InGaN layer(s).

TEM analysis was performed on a portion of the sandwich structure where the pyramidal GaN structure was not fully apexed. That is, the triangular facets did meet at a common apex and the pyramidal GaN structure had a planar top portion with a (0001) GaN facet.

Figure 20:
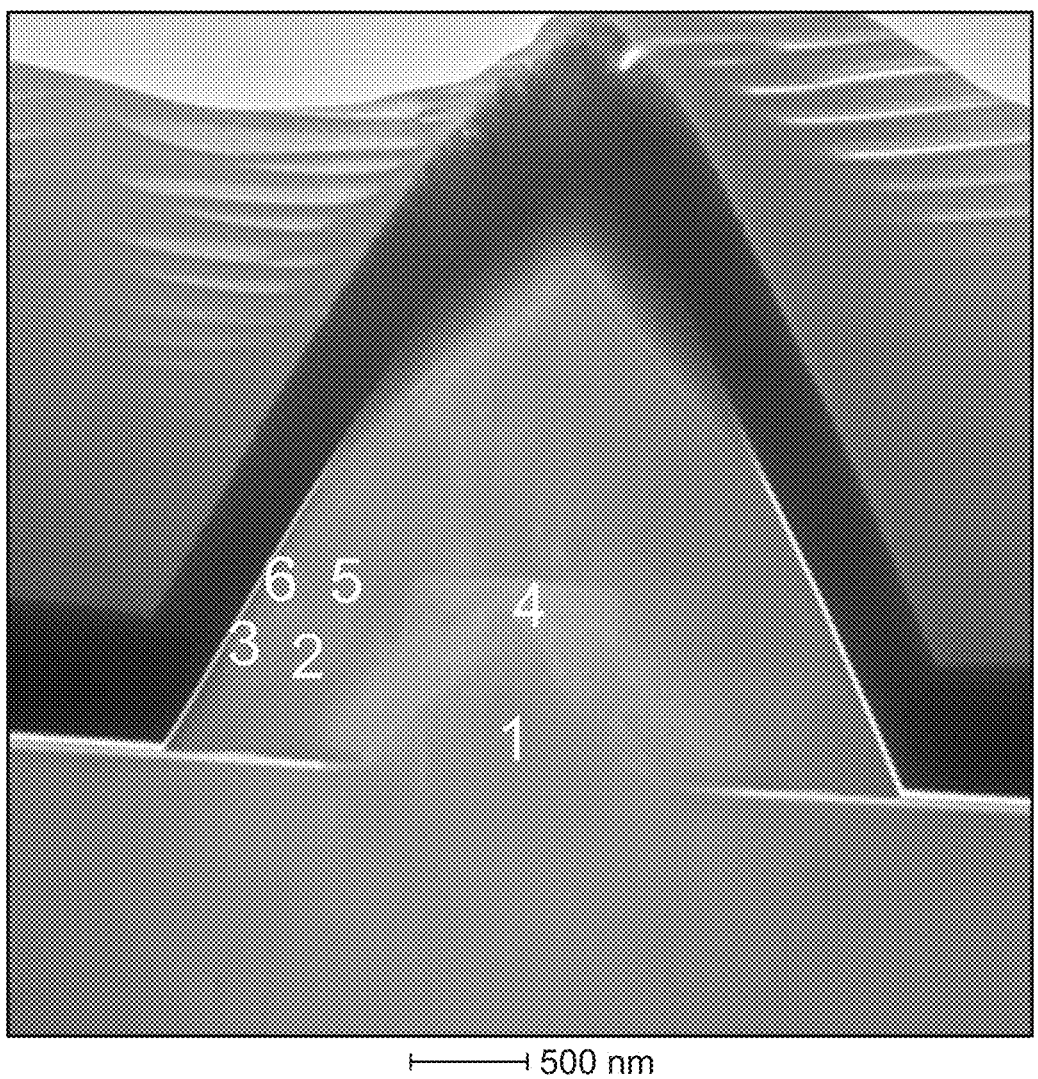
FIG. 20 shows a TEM image of a sandwich structure with identified regions 1-6 that were analyzed using electron diffraction.

Strain relaxation was also analyzed using electron diffraction, by determining the ratio of the (0001) c (out-of-plane) and a (in-plane) lattice parameters in the sample characterized by TEM. Analysis of the c/a ratio was performed at the locations indicated in FIG. 20. The spot area examined by the electron diffraction analysis is estimated to be about 150 nm. Clear differences in the c/a ratio were observed, as summarized in Table 8. Specifically, within the GaN regions (1) and (4) (FIG. 20), the c/a ratio is similar at 1.6365 and 1.6351, respectively. In GaN regions (2) and (5), near the first "marker" stack, the c/a ratio changes, to 1.6200 and 1.6262, respectively, indicating a distortion in the crystalline unit cell consistent with pseudomorphic strain, that is, a widening of the a-lattice parameter along with constriction for the c-lattice parameter, for this semipolar (10-11) orientation. Then, at regions (3) and (6), near the second "marker" stack which is grown after the thick InGaN growth, the c/a ratio changes again to 1.6426 and 1.6386, respectively. This indicates that in this region the constriction along the c-direction has been released, and the dilation of the unit cells in addition to a return to c/a ratios similar to the GaN seed region, are consistent with complete or near-complete relaxation of the InGaN. This conclusion is further supported by the magnitude of the a-lattice dilation of about 1.5%, which is consistent with an a-lattice parameter of 3.235 Å for the relaxed InGaN region, which is very close to the a-lattice parameter estimated from the XRD RSM data discussed with respect to FIGS. 18A and 18B.

There was no evidence of dislocations generated along the (10-11) InGaN growth, suggesting that relaxation occurs by slip along the SiN$_x$ mask.

TABLE 8

Lattice parameters determined using electron diffraction.

| Position | C (pix) | A (pix) | c (Å) | a (Å) | c/a |
|---|---|---|---|---|---|
| 1 | 273.3 | 516.5 | 5.3176 | 3.2495 | 1.6365 |
| 2 | 272.0 | 508.8 | 5.3437 | 3.2986 | 1.6200 |
| 3 | 271.0 | 514.0 | 5.3634 | 3.2653 | 1.6426 |
| 4 | 273.3 | 516.0 | 5.3183 | 3.2526 | 1.6351 |
| 5 | 270.8 | 508.5 | 5.3674 | 3.2306 | 1.6262 |
| 6 | 269.8 | 510.5 | 5.3873 | 3.2876 | 1.6386 |
| Error | 0.6 | 0.5 | 0.0117 | 0.0027 | |

Example 7

Fabrication of Slip Region

A (0001) GaN/sapphire template is provided for the starting surface. An in situ (MOCVD) SiNx layer was deposited at 770° C. with SiH$_4$ and NH$_3$ flows of 87 sccm (calculated as SiH$_4$ source/(SiH$_4$ source+SiH$_4$_dilute)) and 200 sccm, respectively. H$_2$ was used as the carrier gas and the reactor pressure was 75 mbar. The total gas flow into the reactor (MO+NH$_3$+ carrier gas) was 8000 sccm. A growth rate of 0.75 nm/h was obtained using these growth conditions. The growth time affects the quality of the relaxed InGaN layer. For a SiNx layer a 4-min growth time under these conditions deposits an about ¼ monolayer, which is considered to correspond to a fill-factor of about 25%, as the layer is discontinuous.

The temperature was then ramped down to 760° C., and the reactor pressure was ramped up to 400 mbar for the InGaN growth. To achieve a relaxed InGaN layer without v-pits opening and kinetic roughening, much higher (TMGa+TMIn)/NH$_3$ ratio was required compared to the common InGaN growth conditions, where excess ammonia is always supplied to ensure the film quality and enhanced indium incorporation. Thus, in this method the relaxed InGaN layer is grown under metal-rich MOCVD conditions.

To grow the relaxed InGaN layer, the NH$_3$ was kept below 250 sccm, especially during the initial 60 seconds of growth. The TMGa flow used was 50 sccm and the TMIn flow was 350 sccm to achieve a relaxed InGaN layer having an InN mole fraction of about 8% without excess indium droplets on the surface.

In other methods, the TMIn flow, ammonia flow and temperature was adjusted slightly (TMIn up to 500 sccm, ammonia flow in 150-250 sccm and temperature of greater than 745° C.) to achieve a relaxed InGaN layer having an InN mole fraction of up to 12-13%.

Example 8

InGaN Surface Morphology Grown on Different Surfaces and Under Different Growth Conditions The morphology of surfaces of thick InGaN layers grown on different surfaces and under different growth conditions are compared in FIGS. 21A-21D.

FIG. 21A shows a SEM plan-view of an about 430 nm-thick, InGaN layer having an InN mole fraction of about 10% grown directly on a planar (0001) oriented GaN/sapphire template using MOCVD under conventional (N-rich) conditions. The surface shows trench defects and large pits (up to about 300 nm in diameter) formed at threading dislocations and has a non-uniform InN mole percent.

FIG. 21B shows a SEM plan-view of an about 2.3 μm-thick InGaN layer having an InN mole fraction of about 10% grown on a planar (0001) oriented GaN/sapphire decorated with slip regions using MOCVD under conventional (N-rich) conditions. The surface is rough.

FIG. 21C shows a SEM plan view of an about 1.1 μm-thick InGaN layer having an InN mole fraction of about 10% grown directly on a planar (0001) oriented GaN/sapphire template under MR MOCVD conditions. The surface exhibits areas of relaxed and In-containing III-nitride (pseudomorphic) InGaN.

FIG. 21D shows a SEM plan-view of an about 2.25 μm-thick, InGaN layer having an InN mole fraction of about 10% grown on a planar (0001) oriented GaN/sapphire decorated with slip regions using MR MOCVD growth conditions. The surface relaxed, substantially pit-free and has a uniform InN mole fraction across the surface area.

The XRD RSM diffraction images of the InGaN surfaces grown under MR MOCVD conditions directly on a GaN/sapphire template (FIG. 22A) and on a GaN/sapphire template having a slip region (FIG. 22B).

Bright field transmission electron microscopy (TEM) images of a cross-section of a InGaN layer grown directly on a planar GaN template under MR MOCVD growth conditions directly on a GaN/sapphire template (FIG. 23A) and on a dielectric decorated GaN/sapphire template (FIG. 23B).

Example 9

MR MOCVD Growth of Relaxed InGaN on Slip Regions

A relaxed InGaN growth was carried out essentially similar to that of Example 3. In this example, the growth was carried out across the full face of a 50 mm diameter GaN/sapphire template and the relaxed InGaN layer was then characterized at (5) different locations across the wafer (FIG. 28A).

The morphology across the surface of the full 50-mm diameter epi-wafer was glass smooth.

Figure 28F:
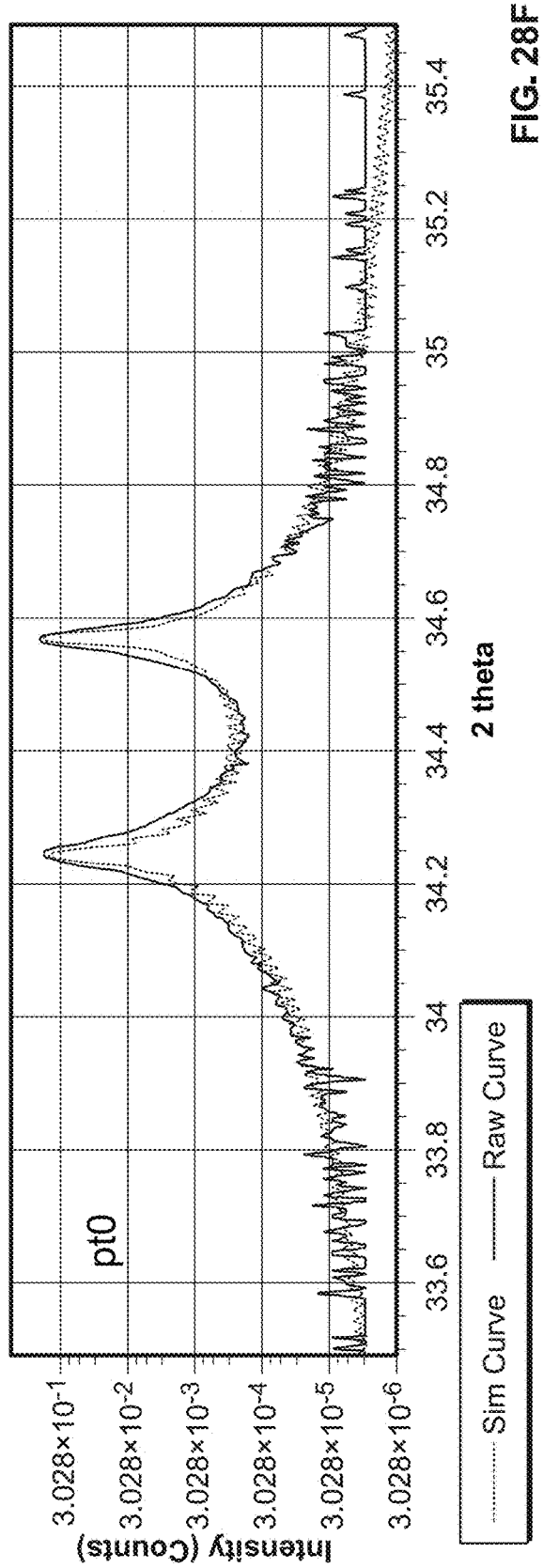
FIG. 28F-28H show ω-2θ XRD scans at the three locations (pt0, pt1, pt3) of the 50 mm-diameter wafer with a thick relaxed InGaN layer having a nominal 9% InN mole fraction and grown under MR-MOCVD conditions on a GaN layer with an intervening slip region.
Figure 28G:
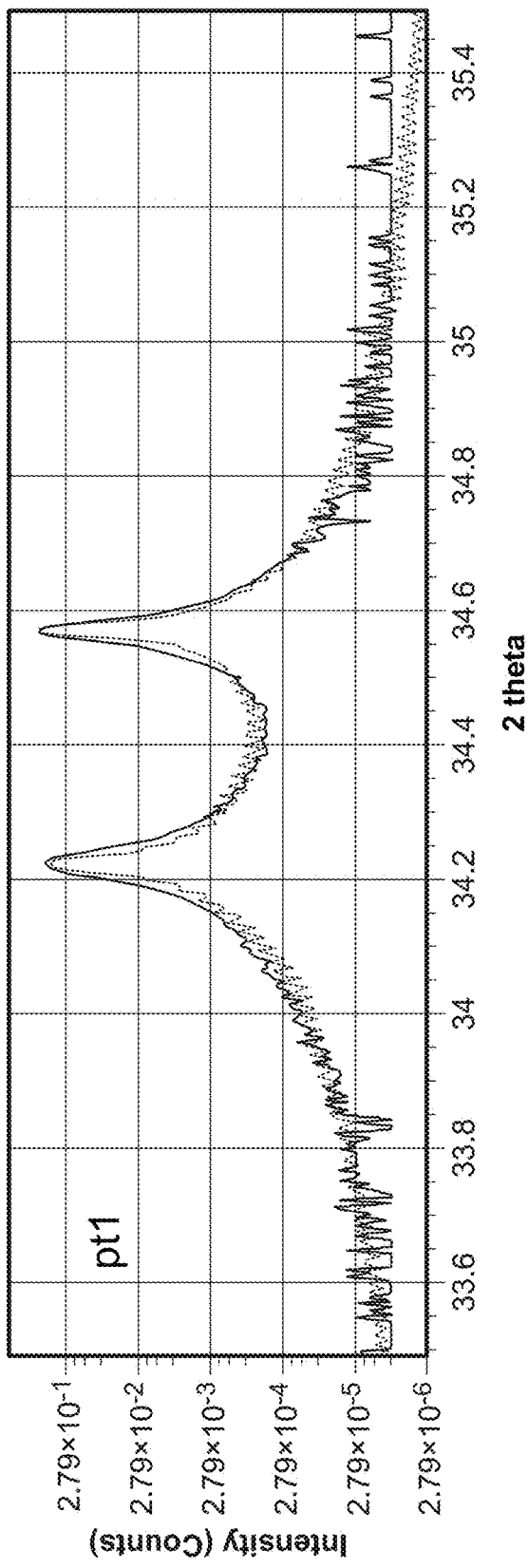
Figure 28H:
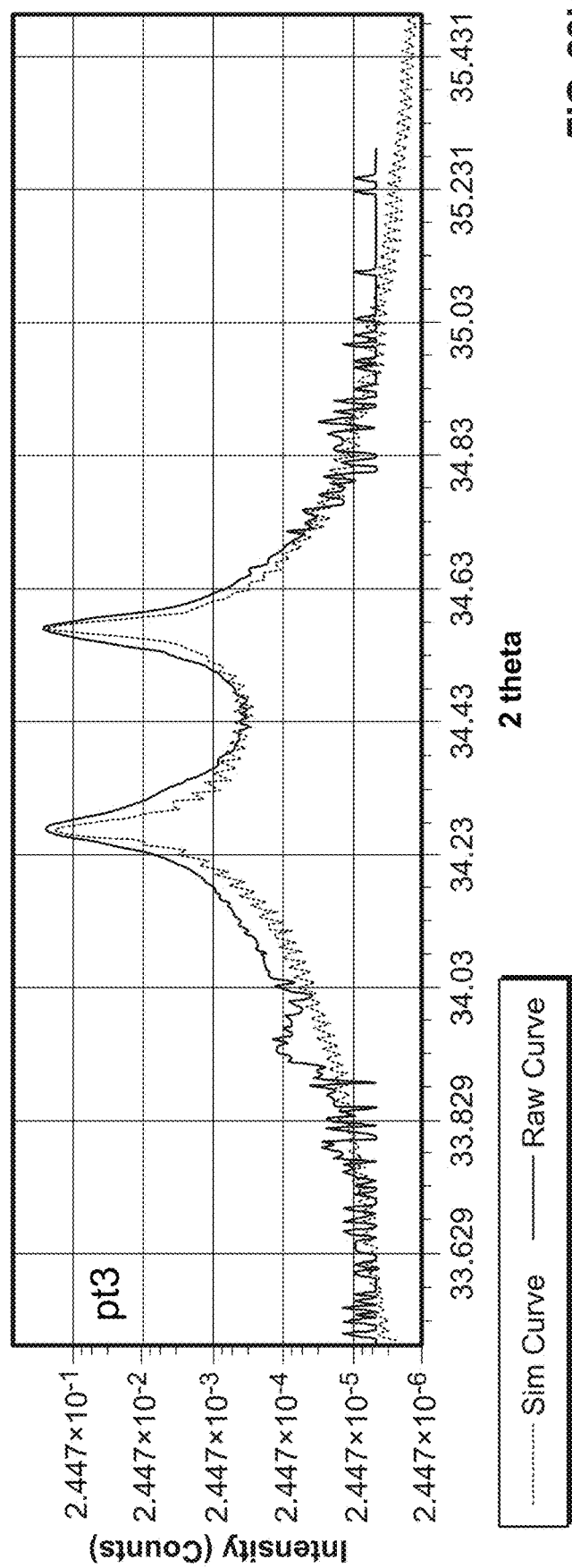

XRD RSM (FIGS. 28C-28E) at three different locations show an about 2 μm-thick, relaxed InGaN layer with an InN mole fraction of about 9%. ω-2θ XRD scans at each position are shown in FIGS. 28F-28H and clearly demonstrate that the diffraction peak associated with the crystalline relaxed InGaN layer is distinct from the diffraction peak associated with the GaN layer (solid curve is measured; dotted curve is simulated).

Energy-dispersive X-ray (EDX) spectroscopy was performed at each of the five positions and the average values of the InN mole fraction across the wafer is shown in Table 9 (FIG. 28B).

TABLE 9

| Region | InN Mole Fraction. InN Mole Fraction |
|---|---|
| pt0 | 9.3% |
| pt1 | 9.9% |
| pt2 | 9.6% |
| pt3 | 8.6% |
| pt4 | 8.6% |

The surface of the epi-wafer at each position is characterized by smooth, substantially pit-free morphology.

Finally, it should be noted that there are alternative ways of implementing the embodiments disclosed herein. Accordingly, the present embodiments are to be considered as illustrative and not restrictive, and the claims are not to be limited to the details given herein but may be modified within the scope and equivalents thereof.

What is claimed is:

1. A bulk relaxed Wurtzite In-containing III-nitride layer comprising a first interface and a first interface region, wherein the first interface region is characterized by:
   a single-phase gallium-polar (0001) orientation;
   a Wurtzite In-containing III-nitride material comprising a first InN mole fraction, wherein the first InN mole fraction is greater than 0; and
   a substantially relaxed in-plane a-lattice parameter.

2. The bulk relaxed Wurtzite In-containing III-nitride layer of claim 1, wherein the bulk relaxed Wurtzite In-containing III-nitride layer has a thickness greater than 100 nm and comprises In$_x$Al$_y$Ga$_{1-x-y}$N, where 0<x≤0.4 and 0≤y≤1.

3. The bulk relaxed Wurtzite In-containing III-nitride layer of claim 1, wherein the first interface region is characterized by:
   (a) a root-mean-square surface roughness less than 1 nm over a 1×1 μm$^2$ area, and
   (b) a pit density less than 1×10$^9$ cm$^{-2}$, as determined by atomic force microscopy or electron microscopy.

4. The bulk relaxed Wurtzite In-containing III-nitride layer of claim 1, wherein a (002) symmetric XRD linewidth is less than 300 arcsec and the asymmetric (211) linewidth is less than 1500 arcsec.

5. The bulk relaxed Wurtzite In-containing III-nitride layer of claim 1, wherein the first interface region is characterized by a substantially pit-free surface morphology.

6. The bulk relaxed Wurtzite In-containing III-nitride layer of claim 1, wherein relaxation occurs via misfit dislocation formation near the interface and dislocation termination within the layer, enabling strain relaxation.

7. The bulk relaxed Wurtzite In-containing III-nitride layer of claim 1, wherein the substantially relaxed in-plane a-lattice parameter is within ±0.5% that of a fully relaxed in-plane a-lattice parameter of the Wurtzite In-containing III-nitride material.

8. The bulk relaxed Wurtzite In-containing III-nitride layer of claim 1, wherein the substantially relaxed in-plane a-lattice parameter is within ±0.02 Å of a fully relaxed in-plane a-lattice parameter of the Wurtzite In-containing III-nitride material.

9. The bulk relaxed Wurtzite In-containing III-nitride layer of claim 1, wherein the first interface region does not comprise cracks over a lateral span of at least 1 cm.

10. A wafer comprising the bulk relaxed Wurtzite In-containing III-nitride layer of claim 1.

11. The wafer of claim 9, wherein the wafer comprises a substrate and the bulk relaxed Wurtzite In-containing III-nitride layer overlies the substrate.

12. The wafer of claim 11, wherein the substrate comprises silicon, silicon-on-insulator (SOI), or a bonded engineered substrate incorporating a III-nitride layer.

13. The wafer of claim 11, wherein the substrate has a diameter of at least 150 mm.

14. A semiconductor structure comprising the bulk relaxed Wurtzite In-containing III-nitride layer of claim 1.

15. The semiconductor structure of claim 14, comprising an engineered substrate, wherein the bulk relaxed Wurtzite In-containing III-nitride layer overlies the engineered substrate.

16. The semiconductor structure of claim 14, comprising a III-nitride layer, wherein the bulk relaxed Wurtzite In-containing III-nitride layer overlies the III-nitride layer.

17. The semiconductor structure of claim 16, wherein the III-nitride layer comprises GaN, AlN, $In_xGa_{1-x}N$, and $In_yAl_yGa_{1-x-y}N$, $In_xGa_{1-x}N$ wherein $0<x\leq1$ and $0\leq y\leq1$.

18. The semiconductor structure of claim 16, wherein the III-nitride layer is patterned.

19. The semiconductor structure of claim 18, wherein the patterned III-nitride layer comprises a plurality of pyramidal seed structures.

20. The semiconductor structure of claim 16, wherein the III-nitride layer comprises a slip region.

21. The semiconductor structure of claim 14, comprising:
a GaN layer;
the bulk relaxed Wurtzite In-containing III-nitride layer overlying a GaN layer, wherein the bulk relaxed Wurtzite In-containing III-nitride layer comprises $In_{x1}Al_{y1}Ga_{1-x1-y1}N$; and
a second bulk relaxed Wurtzite In-containing III-nitride layer overlying the bulk relaxed Wurtzite In-containing III-nitride layer, wherein the second bulk relaxed Wurtzite In-containing III-nitride layer comprises $In_{x2}Al_{y2}Ga_{1-x2-y2}N$;
wherein $0 \leq y_1, y_2 \leq 1$, $x_2 > x_1$, and each bulk relaxed Wurtzite In-containing III-nitride layer independently has a thickness greater than 50 nm and is substantially relaxed.

22. A semiconductor device comprising the bulk relaxed Wurtzite In-containing III-nitride layer of claim 1.

23. The semiconductor device of claim 22, wherein the semiconductor device comprises an active region.

24. The semiconductor device of claim 22, wherein the semiconductor device comprises:
a first doped semiconductor layer characterized by a first conductivity type overlying the bulk relaxed Wurtzite In-containing III-nitride layer;
an active region overlying the first doped semiconductor layer, wherein the active region is configured to emit electromagnetic radiation;
a second doped semiconductor layer characterized by a second conductivity type overlying the active region;
a first electrode electrically contacting the first doped semiconductor layer, and
a second electrode electrically contacting the second doped semiconductor layer.

25. The semiconductor device of claim 22, wherein the semiconductor device comprises an optoelectronic device.

26. The semiconductor device of claim 25, wherein the optoelectronic device is selected from a light emitting diode, micro-light emitting diode, a laser diode, a vertical cavity surface emitting laser, a solar cell, and a projection display.

27. The semiconductor device of claim 25, wherein the optoelectronic device is configured to emit electromagnetic radiation in a wavelength range from 530 nm to 650 nm.

28. The semiconductor device of claim 25, wherein the optoelectronic device comprises on or more InGaN quantum wells, wherein the InGaN quantum wells are configured to emit electromagnetic radiation with a dominant wavelength between 525 nm and 550 nm.

29. The semiconductor device of claim 25, wherein the optoelectronic device comprises one or more InGaN quantum wells, wherein the InGaN quantum wells are configured to emit electromagnetic radiation with a dominant wavelength between 600 nm and 640 nm.

\* \* \* \* \*